US012639559B2

(12) United States Patent
Tran

(10) Patent No.: US 12,639,559 B2
(45) Date of Patent: May 26, 2026

(54) CALIBRATION OF ELECTRICAL PARAMETERS IN A DEEP LEARNING ARTIFICIAL NEURAL NETWORK

(71) Applicant: Silicon Storage Technology, Inc., San Jose, CA (US)

(72) Inventor: Hieu Van Tran, San Jose, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 1068 days.

(21) Appl. No.: 17/724,415

(22) Filed: Apr. 19, 2022

(65) Prior Publication Data

US 2023/0306246 A1 Sep. 28, 2023

Related U.S. Application Data

(60) Provisional application No. 63/307,983, filed on Feb. 8, 2022.

(51) Int. Cl.
G06N 3/063 (2023.01)
G06N 3/065 (2023.01)
(Continued)

(52) U.S. Cl.
CPC ............. G06N 3/063 (2013.01); G06N 3/065 (2023.01); *G06N 3/0442* (2023.01);
(Continued)

(58) Field of Classification Search
CPC .... G06N 3/0442; G06N 3/0464; G06N 3/048; G06N 3/063; G06N 3/065; G06N 3/09;
(Continued)

(56) References Cited

U.S. PATENT DOCUMENTS

| | | | |
|---|---|---|---|
| 5,029,130 A | | 7/1991 | Yeh |
| 6,091,632 A | * | 7/2000 | Yoshimi ................. H10B 69/00 |
| | | | 365/185.11 |

(Continued)

FOREIGN PATENT DOCUMENTS

| | | |
|---|---|---|
| JP | 2008159185 A | 7/2008 |
| JP | 2021536600 A | 12/2021 |

(Continued)

OTHER PUBLICATIONS

Taiwanese Office Action mailed on Feb. 20, 2025 corresponding to Taiwanese Patent Application No. 112103391. (Google English Translations and the Taiwanese Office Action are attached.).

(Continued)

*Primary Examiner* — Ly D Pham
(74) *Attorney, Agent, or Firm* — Vedder Price P.C.

(57) ABSTRACT

Numerous examples are disclosed for performing calibration of various electrical parameters in a deep learning artificial neural network. In one example, a method comprises adjusting a bias voltage applied to one or more non-volatile memory cells in an artificial neural network, performing a performance target check on the one or more non-volatile memory cells in the artificial neural network, and repeating the adjusting and performing until the performance target check indicates an electrical parameter is within a predetermined range.

5 Claims, 73 Drawing Sheets

(51) Int. Cl.

| | |
|---|---|
| *G06N 3/0442* | (2023.01) |
| *G06N 3/0464* | (2023.01) |
| *G06N 3/048* | (2023.01) |
| *G06N 3/09* | (2023.01) |
| *G11C 11/54* | (2006.01) |
| *G11C 16/04* | (2006.01) |
| *G11C 29/02* | (2006.01) |

(52) U.S. Cl.

CPC ........... *G06N 3/0464* (2023.01); *G06N 3/048* (2023.01); *G06N 3/09* (2023.01); *G11C 11/54* (2013.01); *G11C 16/0425* (2013.01); *G11C 29/028* (2013.01)

(58) Field of Classification Search

CPC .... G11C 11/54; G11C 16/0425; G11C 29/028

USPC ...................................................... 365/185.18

See application file for complete search history.

(56) References Cited

U.S. PATENT DOCUMENTS

| | | | |
|---|---|---|---|
| 6,292,398 B1* | 9/2001 | Pasotti | G11C 16/3459 365/185.24 |
| 6,747,310 B2 | 6/2004 | Fan | |
| 10,748,630 B2 | 8/2020 | Tran et al. | |
| 2014/0006689 A1* | 1/2014 | Hashimoto | G06F 21/79 711/103 |
| 2015/0270009 A1* | 9/2015 | Lee | G11C 16/3459 365/185.22 |
| 2017/0337466 A1 | 11/2017 | Bayat et al. | |
| 2020/0150923 A1 | 5/2020 | Muralimanohar | |
| 2020/0258942 A1 | 8/2020 | Leobandung | |
| 2021/0175893 A1 | 6/2021 | Danial | |
| 2023/0153585 A1* | 5/2023 | Mirhassani | G06N 3/049 706/22 |

FOREIGN PATENT DOCUMENTS

| | | |
|---|---|---|
| TW | 202040578 A | 11/2020 |
| TW | 202133163 A | 9/2021 |
| WO | 20080151661 A1 | 6/2008 |
| WO | 2020040893 A1 | 2/2020 |

OTHER PUBLICATIONS

Taiwanese Office Action mailed on Feb. 11, 2025 corresponding to Taiwanese Patent Application No. 112103390. (Google English Translations and the Taiwanese Office Action are attached.).

Taiwanese Office Action mailed on Mar. 11, 2024 corresponding to the related Taiwanese Patent Application No. 112103390.

Taiwanese Office Action mailed on Mar. 11, 2024 corresponding to the related Taiwanese Patent Application No. 112103391.

PCT Invitation to Pay Additional Fees mailed on Oct. 27, 2022 corresponding to the related PCT Patent Application No. US2022/026363.

PCT Search Report and Written Opinion mailed on Dec. 19, 2022 corresponding to the related PCT Patent Application No. US2022/026363.

Taiwanese Office Action mailed on Aug. 5, 2024 corresponding to Taiwanese Patent Application No. 112103390. (Google English Translations and the Taiwanese Office Action are attached.).

Machine translation of Office Action from Japanese Patent Office, filed under Japan Application No. 2024-537377, 4 pages.

* cited by examiner

Memory Cell
210

Memory Cell
310

Memory Cell
410

Memory Cell
510

LSTM
1400

Figure 35:
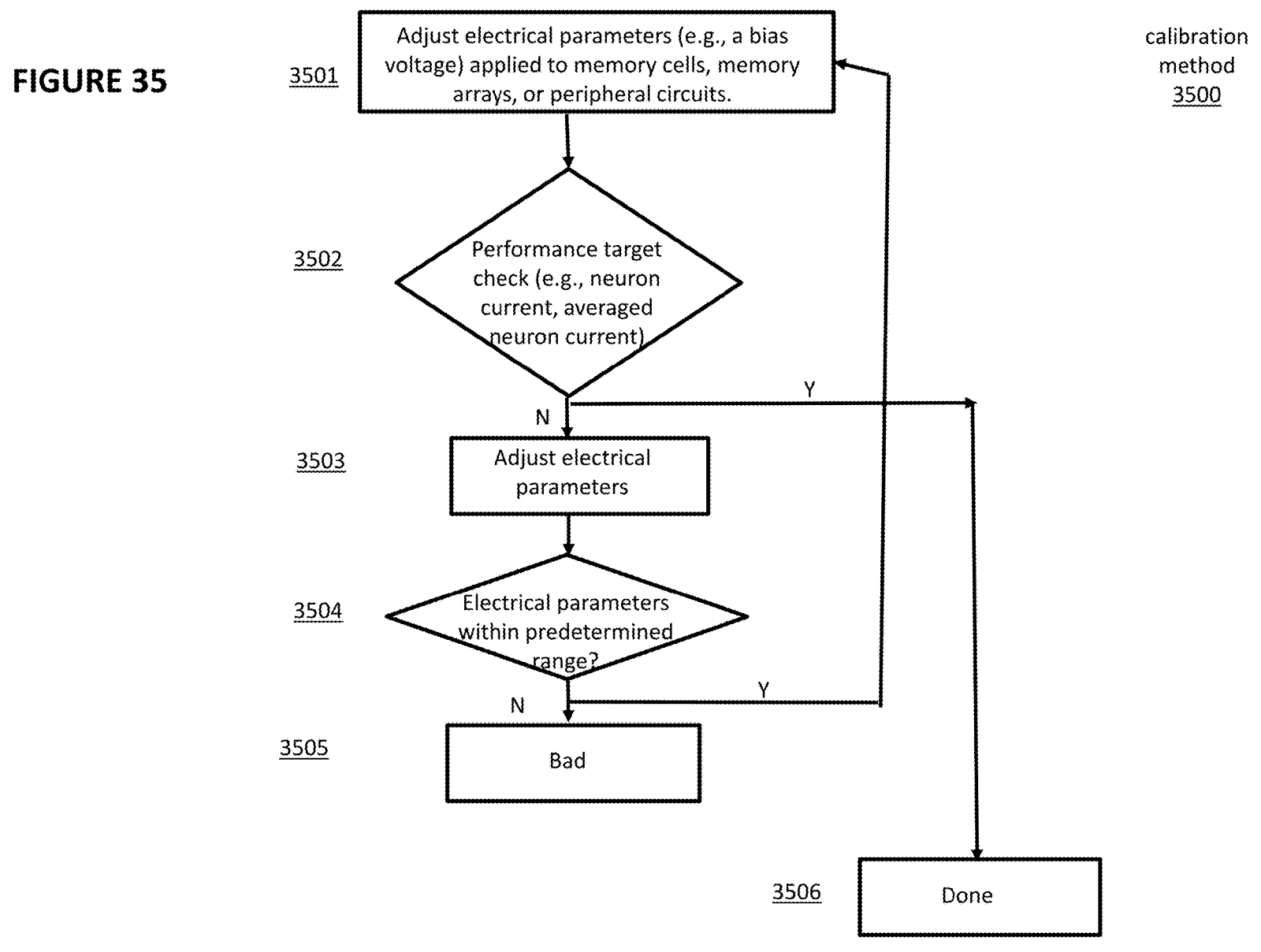

FIGURE 35 calibration
method
3500

3501 — Adjust electrical parameters (e.g., a bias voltage) applied to memory cells, memory arrays, or peripheral circuits.

3502 — Performance target check (e.g., neuron current, averaged neuron current)

3503 — Adjust electrical parameters

3504 — Electrical parameters within predetermined range?

3505 — Bad

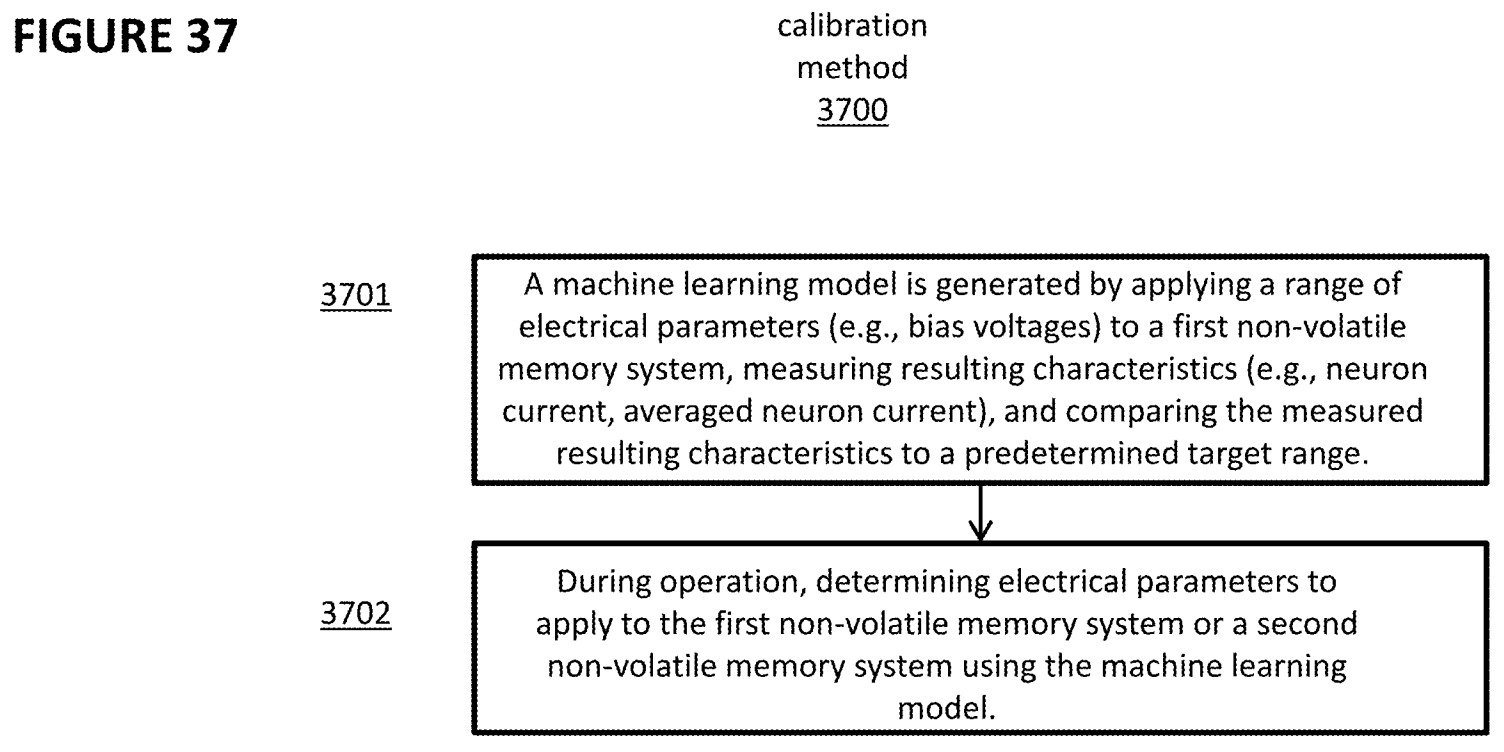

3506 — Done calibration
method
3700

3701

A machine learning model is generated by applying a range of electrical parameters (e.g., bias voltages) to a first non-volatile memory system, measuring resulting characteristics (e.g., neuron current, averaged neuron current), and comparing the measured resulting characteristics to a predetermined target range.

3702

During operation, determining electrical parameters to apply to the first non-volatile memory system or a second non-volatile memory system using the machine learning model.

FIGURE 37

Icellx

VCG (Volts)

Differential Current-to-Voltage Converter
4001

VO−

VO+

4003

4004

4005

VCM

4006

Icell

Iref

IBIAS

FIGURE 42

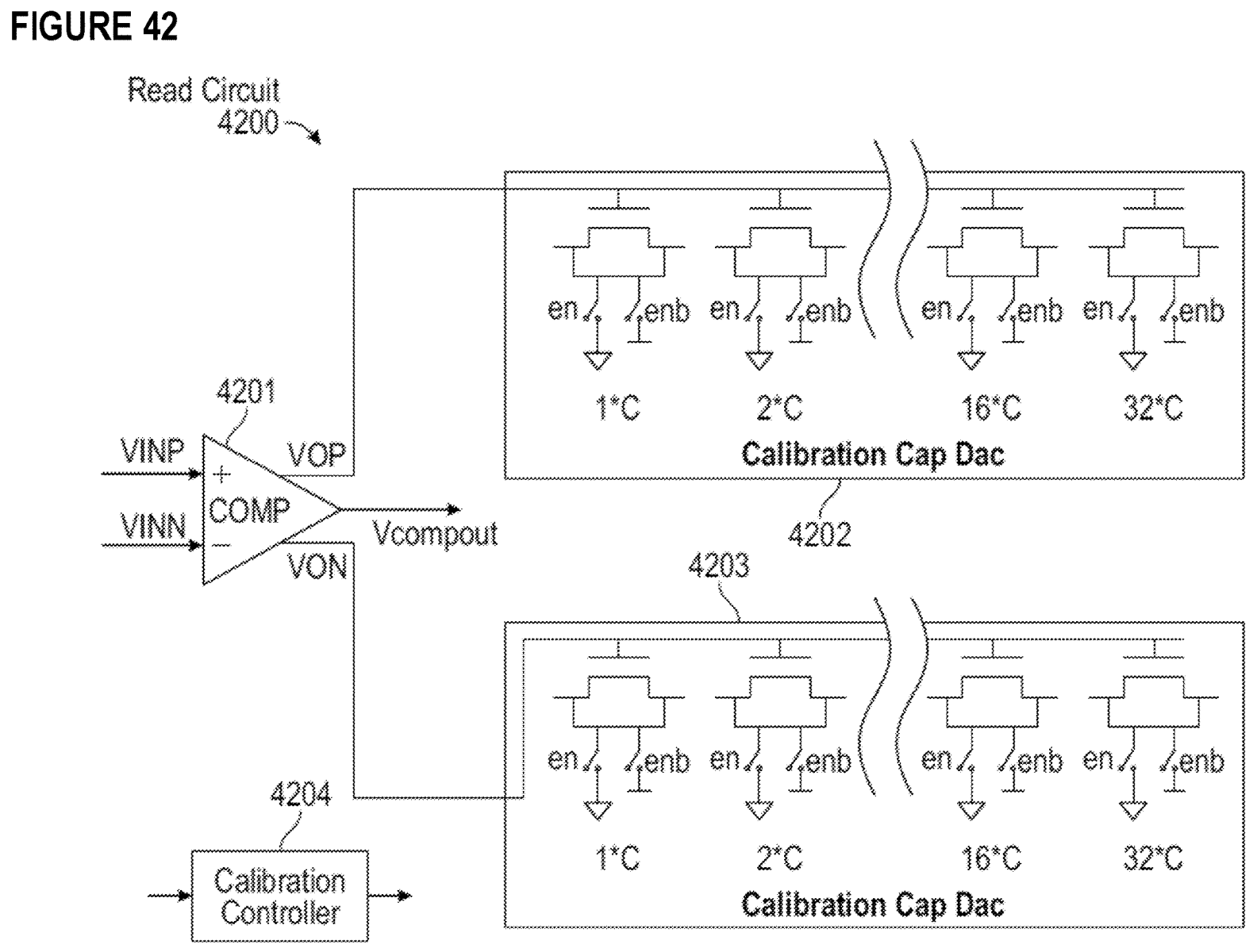

Read Circuit
4200

Calibration Cap Dac

1*C   2*C   16*C   32*C

4202

Calibration Cap Dac

1*C   2*C   16*C   32*C

4203

VOP

Vcompout

COMP

4201

VON

VINP

VINN

4204

Calibration
Controller

FIGURE 43

Input Block
4300

Output Block
5000

Ineu →

ITV
5001

→

ADC
5002

Input-Output Values 4900 for
Din an Input Block

Vin

L0    L63    L127    L191    L255

Adjustable Global DAC 5220 waveforms
5500

GDAC
Output

First
Sampled
Value

Second
Sampled
Value

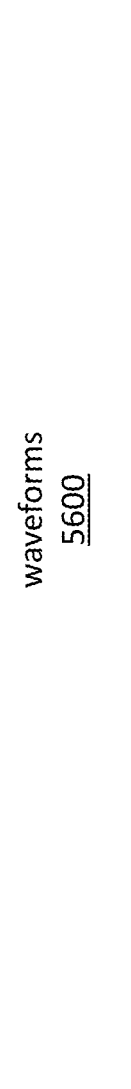
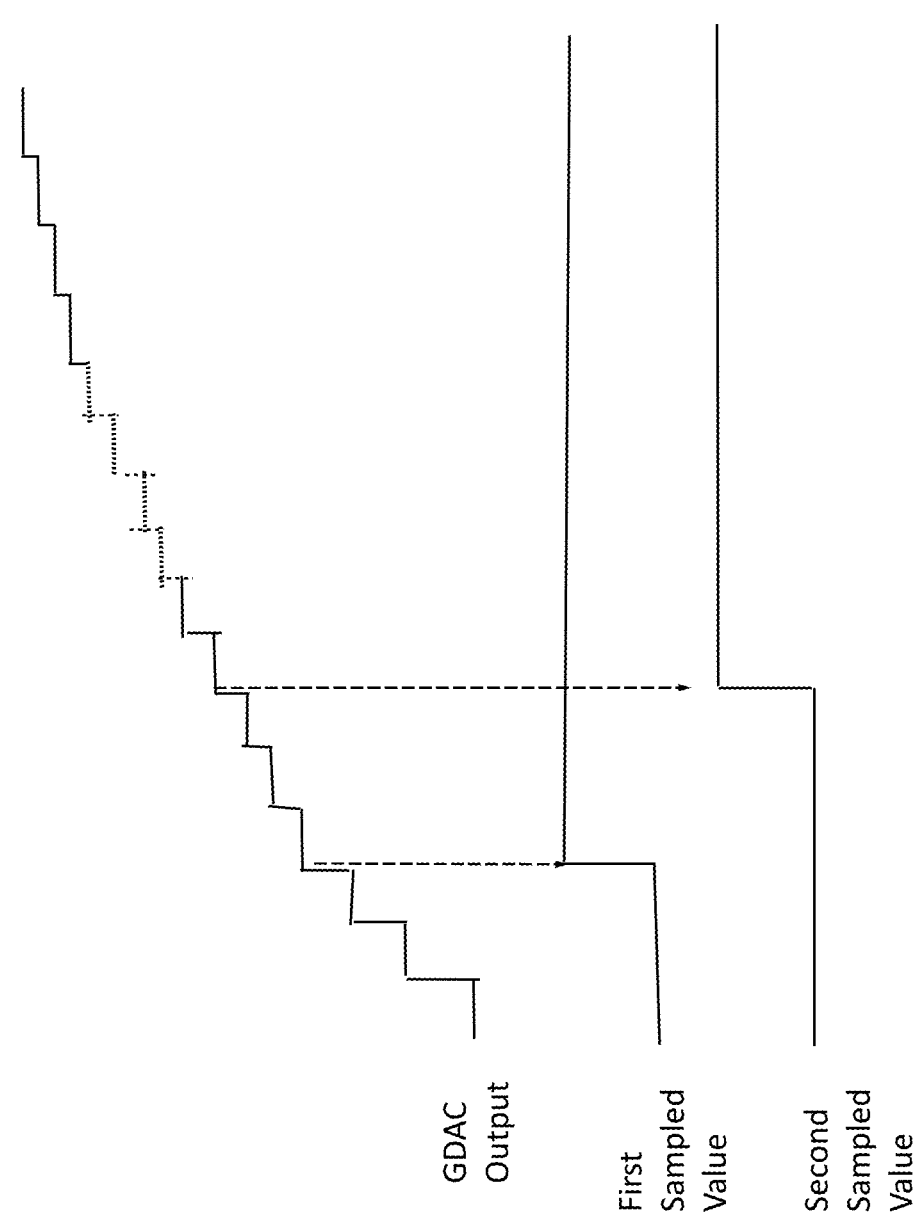
FIGURE 56

Row Digital-to-Analog Outputs
5700

Vout

L255

L0

Row Digital-to-Analog Output
5800

VOUT

L192-L255

L128-L191

L64-L127

L0-L63

V4

V3

V2

V1

Bias Control Circuit
6352

Calibration
Circuit
6250 current-to-voltage converter 7200 array 7201 resistor 7202 bias control circuit 7203 array calibrator 7100 array 7101

Output current source 7102 bias control circuit 7103 calibration method
7400 calibration method
7300 calibration method
7600

7601 start 7602 calibration

7603 Measured Time = Target Time or deviates by an acceptable margin?

N

Y calibration method
7500

7501 start 7502 calibration

7503 Measured Temperature = Target Temperature or deviates by an acceptable margin?

N

Y

7504 Measured Array Characteristic = Target or deviates by an acceptable margin?

N

Y calibration method
7800 start
7801 adjust global reference levels
VREFL, VREFH, and/or VREFM in
global digital-to-analog converter
7802 calibrate local digital-
to-analog converters
7803

Done
7804 calibration method
7700 start
7701 adjust global reference
levels VREFL, VREFH,
and/or VREFM
7702

Done
7703

GDAC input level to output Level selection method
7900

GDAC input level to output Level selection method
8000

GDAC input level to output Level selection method
8100

CALIBRATION OF ELECTRICAL PARAMETERS IN A DEEP LEARNING ARTIFICIAL NEURAL NETWORK

PRIORITY CLAIM

This application claims priority to U.S. Provisional Patent Application No. 63/307,983, filed on Feb. 8, 2022, and titled "Calibration of Electrical Parameters Using Heuristics and Machine Learning in a Deep Learning Artificial Neural Network," which is incorporated by reference herein.

FIELD OF THE INVENTION

Numerous examples are disclosed for performing calibration of various electrical parameters in a deep learning artificial neural network.

BACKGROUND OF THE INVENTION

Artificial neural networks mimic biological neural networks (the central nervous systems of animals, in particular the brain) and are used to estimate or approximate functions that can depend on a large number of inputs and are generally unknown. Artificial neural networks generally include layers of interconnected "neurons" which exchange messages between each other.

FIG. 1 illustrates an artificial neural network, where the circles represent the inputs or layers of neurons. The connections (called synapses) are represented by arrows and have numeric weights that can be tuned based on experience. This makes neural networks adaptive to inputs and capable of learning. Typically, neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical neural networks rely on a very large number of synapses, enabling high connectivity between neurons, i.e., a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses.

Applicant previously disclosed an artificial (analog) neural network that utilizes one or more non-volatile memory arrays as the synapses in U.S. Patent Application Publication 2017/0337466A1, which is incorporated by reference. The non-volatile memory arrays operate as an analog neural memory and comprise non-volatile memory cells arranged in rows and columns. The neural network includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells store a weight value corresponding to a number of electrons on the floating gate. The plurality of memory cells multiply the first plurality of inputs by the stored weight values to generate the first plurality of outputs.

Non-Volatile Memory Cells

Non-volatile memories are well known. For example, U.S. Pat. No. 5,029,130 ("the '130 patent"), which is incorporated herein by reference, discloses an array of split gate non-volatile memory cells, which are a type of flash memory cells. Such a memory cell 210 is shown in FIG. 2. Each memory cell 210 includes source region 14 and drain region 16 formed in semiconductor substrate 12, with channel region 18 there between. Floating gate 20 is formed over and insulated from (and controls the conductivity of) a first portion of the channel region 18, and over a portion of the source region 14. Word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim (FN) tunneling.

Memory cell 210 is programmed by source side injection (SSI) with hot electrons (where electrons are placed on the floating gate) by placing a positive voltage on the word line terminal 22, and a positive voltage on the source region 14. Electron current will flow from the drain region 16 towards the source region 14. The electrons will accelerate and become heated when they reach the gap between the word line terminal 22 and the floating gate 20. Some of the heated electrons will be injected through the gate oxide onto the floating gate 20 due to the attractive electrostatic force from the floating gate 20.

Memory cell 210 is read by placing positive read voltages on the drain region 16 and word line terminal 22 (which turns on the portion of the channel region 18 under the word line terminal). If the floating gate 20 is positively charged (i.e., erased of electrons), then the portion of the channel region 18 under the floating gate 20 is turned on as well, and current will flow across the channel region 18, which is sensed as the erased or "1" state. If the floating gate 20 is negatively charged (i.e., programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage and current ranges that can be applied to the terminals of memory cell 210 for performing read, erase, and program operations:

TABLE NO 1

| | | | |
|---|---|---|---|
| Operation of Flash Memory Cell 210 of FIG. 2 | | | |
| | WL | BL | SL |
| Read | 2-3 V | 0.6-2 V | 0 V |
| Erase | ~11-13 V | 0 V | 0 V |
| Program | 1-2 V | 10.5-3 µA | 9-10 V |

Other split gate memory cell configurations, which are other types of flash memory cells, are known. For example, FIG. 3 depicts a four-gate memory cell 310 comprising source region 14, drain region 16, floating gate 20 over a first portion of channel region 18, a select gate 22 (typically coupled to a word line, WL) over a second portion of the channel region 18, a control gate 28 over the floating gate 20, and an erase gate 30 over the source region 14. This configuration is described in U.S. Pat. No. 6,747,310, which is incorporated herein by reference for all purposes. Here, all gates are non-floating gates except floating gate 20, meaning that they are electrically connected or connectable to a voltage source. Programming is performed by heated electrons from the channel region 18 injecting themselves onto the floating gate 20. Erasing is performed by electrons tunneling from the floating gate 20 to the erase gate 30.

Table No. 2 depicts typical voltage and current ranges that can be applied to the terminals of memory cell 310 for performing read, erase, and program operations:

TABLE NO 2

| | | | | | |
|---|---|---|---|---|---|
| Operation of Flash Memory Cell 310 of FIG. 3 | | | | | |
| | WL/SG | BL | CG | EG | SL |
| Read | 1.0-2 V | 0.6-2 V | 0-2.6 V | 0-2.6 V | 0 V |
| Erase | −0.5 V/0 V | 0 V | 0 V/−8 V | 8-12 V | 0 V |
| Program | 1 V | 0.1-1 µA | 8-11 V | 4.5-9 V | 4.5-5 V |

FIG. 4 depicts a three-gate memory cell 410, which is another type of flash memory cell. Memory cell 410 is identical to the memory cell 310 of FIG. 3 except that memory cell 410 does not have a separate control gate. The erase operation (whereby erasing occurs through use of the erase gate) and read operation are similar to that of the FIG. 3 except there is no control gate bias applied. The programming operation also is done without the control gate bias, and as a result, a higher voltage is applied on the source line during a program operation to compensate for a lack of control gate bias.

Table No. 3 depicts typical voltage and current ranges that can be applied to the terminals of memory cell 410 for performing read, erase, and program operations:

TABLE NO 3

| | | | | |
|---|---|---|---|---|
| Operation of Flash Memory Cell 410 of FIG. 4 | | | | |
| | WL/SG | BL | EG | SL |
| Read | 0.7-2.2 V | 0.6-2 V | 0-2.6 V | 0 V |
| Erase | −0.5 V/0 V | 0 V | 11.5 V | 0 V |
| Program | 1 V | 0.2-3 µA | 4.5 V | 7-9 V |

FIG. 5 depicts stacked gate memory cell 510, which is another type of flash memory cell. Memory cell 510 is similar to memory cell 210 of FIG. 2, except that floating gate 20 extends over the entire channel region 18, and control gate 22 (which here will be coupled to a word line)

extends over floating gate 20, separated by an insulating layer (not shown). The erase is done by FN tunneling of electrons from FG to substrate, programming is by channel hot electron (CHE) injection at region between the channel 18 and the drain region 16, by the electrons flowing from the source region 14 towards to drain region 16 and read operation which is similar to that for memory cell 210 with a higher control gate voltage.

Table No. 4 depicts typical voltage ranges that can be applied to the terminals of memory cell 510 and substrate 12 for performing read, erase, and program operations:

TABLE NO 4

| | | | | |
|---|---|---|---|---|
| Operation of Flash Memory Cell 510 of FIG. 5 | | | | |
| | CG | BL | SL | Substrate |
| Read | 2-5 V | 0.6-2 V | 0 V | 0 V |
| Erase | −8 to −10 V/0 V | FLT | FLT | 8-10 V/15-20 V |
| Program | 8-12 V | 3-5 V | 0 V | 0 V |

The methods and means described herein may apply to other non-volatile memory technologies such as FINFET split gate flash or stack gate flash memory, NAND flash, SONOS (silicon-oxide-nitride-oxide-silicon, charge trap in nitride), MONOS (metal-oxide-nitride-oxide-silicon, metal charge trap in nitride), ReRAM (resistive ram), PCM (phase change memory), MRAM (magnetic ram), FeRAM (ferro-electric ram), CT (charge trap) memory, CN (carbon-tube) memory, OTP (bi-level or multi-level one time programmable), and CeRAM (correlated electron ram), without limitation.

In order to utilize the memory arrays comprising one of the types of non-volatile memory cells described above in an artificial neural network, two modifications are made. First, the lines are configured so that each memory cell can be individually programmed, erased, and read without adversely affecting the memory state of other memory cells in the array, as further explained below. Second, continuous (analog) programming of the memory cells is provided.

Specifically, the memory state (i.e., charge on the floating gate) of each memory cell in the array can be continuously changed from a fully erased state to a fully programmed state, and vice-versa, independently and with minimal disturbance of other memory cells. This means the cell storage is effectively analog or at the very least can store one of many discrete values (such as 16 or 64 different values), which allows for very precise and individual tuning of all the memory cells in the memory array, and which makes the memory array ideal for storing and making fine tuning adjustments to the synapsis weights of the neural network. Neural Networks Employing Non-Volatile Memory Cell Arrays FIG. 6 conceptually illustrates a non-limiting example of a neural network utilizing a non-volatile memory array of the present examples. This example uses the non-volatile memory array neural network for a facial recognition application, but any other appropriate application could be implemented using a non-volatile memory array based neural network.

S0 is the input layer, which for this example is a 32×32 pixel RGB image with 5 bit precision (i.e. three 32×32 pixel arrays, one for each color R, G and B, each pixel being 5 bit precision). The synapses CB1 going from input layer S0 to layer C1 apply different sets of weights in some instances and shared weights in other instances and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, where these 9 input values are multiplied by the appropriate weights and, after summing the outputs of that multiplication, a single output value is determined and provided by a first synapse of CB1 for generating a pixel of one of the feature maps of layer C1. The 3×3 filter is then shifted one pixel to the right within input layer S0 (i.e., adding the column of three pixels on the right, and dropping the column of three pixels on the left), whereby the 9 pixel values in this newly positioned filter are provided to the synapses CB1, where they are multiplied by the same weights and a second single output value is determined by the associated synapse. This process is continued until the 3×3 filter scans across the entire 32×32 pixel image of input layer S0, for all three colors and for all bits (precision values). The process is then repeated using different sets of weights to generate a different feature map of layer C1, until all the features maps of layer C1 have been calculated.

In layer C1, in the present example, there are 16 feature maps, with 30×30 pixels each. Each pixel is a new feature pixel extracted from multiplying the inputs and kernel, and therefore each feature map is a two dimensional array, and thus in this example layer C1 constitutes 16 layers of two dimensional arrays (keeping in mind that the layers and arrays referenced herein are logical relationships, not necessarily physical relationships—i.e., the arrays are not necessarily oriented in physical two dimensional arrays). Each of the 16 feature maps in layer C1 is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from layer C1 to layer S1, which pools values from consecutive, non-overlapping 2×2 regions in each feature map. The purpose of the pooling function P1 is to average out the nearby location (or a max function can also be used), to reduce the dependence of the edge location for example and to reduce the data size before going to the next stage. At layer S1, there are 16 15×15 feature maps (i.e., sixteen different arrays of 15×15 pixels each). The synapses CB2 going from layer S1 to layer C2 scan maps in layer S1 with 4×4 filters, with a filter shift of 1 pixel. At layer C2, there are 22 12×12 feature maps. An activation function P2 (pooling) is applied before going from layer C2 to layer S2, which pools values from consecutive non-overlapping 2×2 regions in each feature map. At layer S2, there are 22 6×6 feature maps. An activation function (pooling) is applied at the synapses CB3 going from layer S2 to layer C3, where every neuron in layer C3 connects to every map in layer S2 via a respective synapse of CB3. At layer C3, there are 64 neurons. The synapses CB4 going from layer C3 to the output layer S3 fully connects C3 to S3, i.e. every neuron in layer C3 is connected to every neuron in layer S3. The output at S3 includes 10 neurons, where the highest output neuron determines the class. This output could, for example, be indicative of an identification or classification of the contents of the original image.

Each layer of synapses is implemented using an array, or a portion of an array, of non-volatile memory cells.

Figure 7:
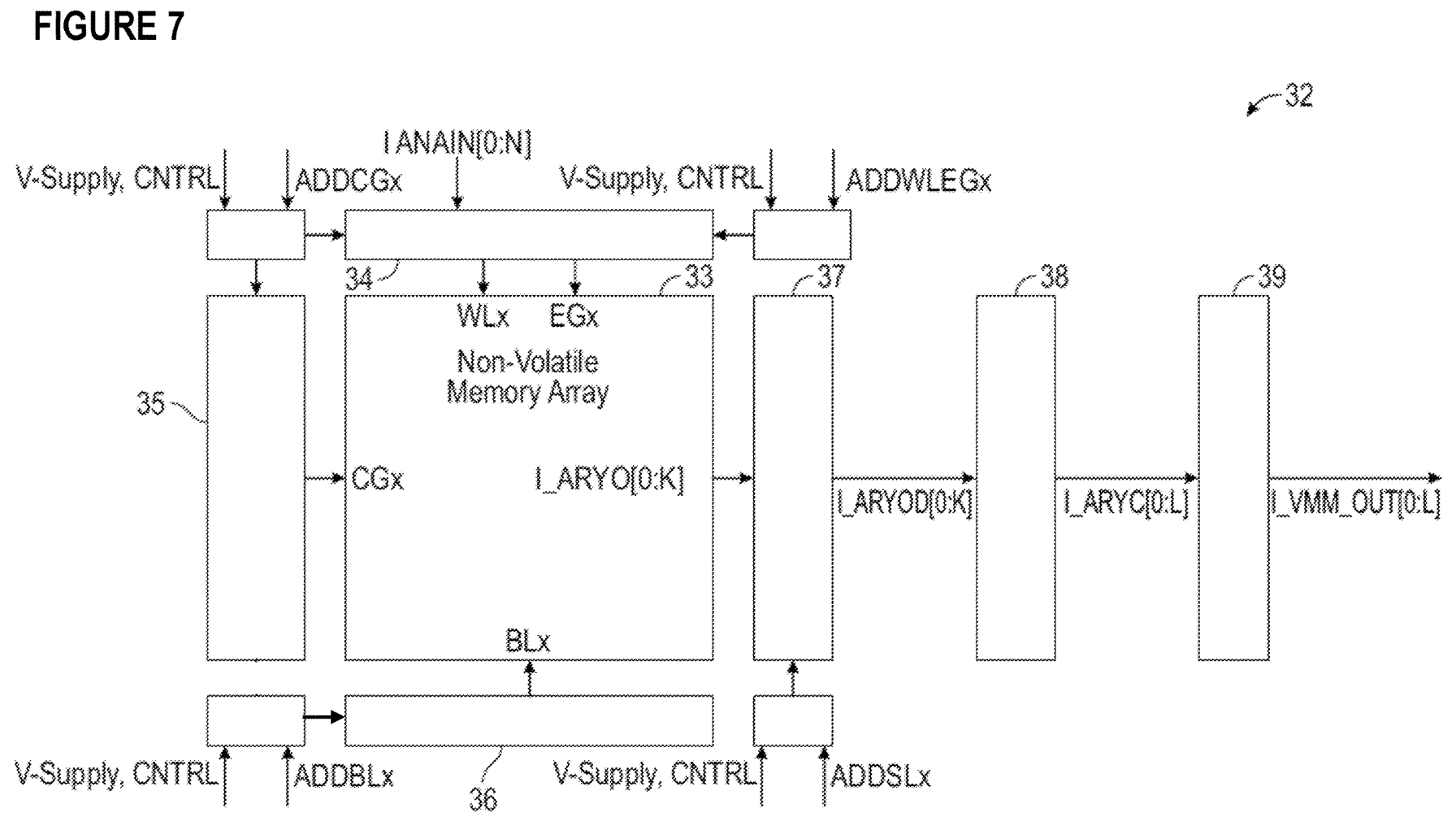

FIG. 7 is a block diagram of an array that can be used for that purpose. Vector-by-matrix multiplication (VMM) array 32 includes non-volatile memory cells and is utilized as the synapses (such as CB1, CB2, CB3, and CB4 in FIG. 6) between one layer and the next layer. Specifically, VMM array 32 includes an array of non-volatile memory cells 33, erase gate and word line gate decoder 34, control gate decoder 35, bit line decoder 36 and source line decoder 37, which decode the respective inputs for the non-volatile memory cell array 33. Input to VMM array 32 can be from the erase gate and wordline gate decoder 34 or from the control gate decoder 35. Source line decoder 37 in this example also decodes the output of the non-volatile memory cell array 33. Alternatively, bit line decoder 36 can decode the output of the non-volatile memory cell array 33.

Non-volatile memory cell array 33 serves two purposes. First, it stores the weights that will be used by the VMM array 32. Second, the non-volatile memory cell array 33 effectively multiplies the inputs by the weights stored in the non-volatile memory cell array 33 and adds them up per output line (source line or bit line) to produce the output, which will be the input to the next layer or input to the final layer. By performing the multiplication and addition function, the non-volatile memory cell array 33 negates the need for separate multiplication and addition logic circuits and is also power efficient due to its in-situ memory computation.

The output of non-volatile memory cell array 33 is supplied to a differential summer (such as a summing op-amp or a summing current mirror) 38, which sums up the outputs of the non-volatile memory cell array 33 to create a single value for that convolution. The differential summer 38 is arranged to perform summation of positive weight and negative weight.

The summed-up output values of differential summer 38 are then supplied to an activation function block 39, which rectifies the output. The activation function block 39 may provide sigmoid, tanh, or ReLU functions. The rectified output values of activation function block 39 become an element of a feature map as the next layer (e.g. C1 in FIG. 6), and are then applied to the next synapse to produce the next feature map layer or final layer. Therefore, in this example, non-volatile memory cell array 33 constitutes a plurality of synapses (which receive their inputs from the prior layer of neurons or from an input layer such as an image database), and summing op-amp 38 and activation function block 39 constitute a plurality of neurons.

The input to VMM array 32 in FIG. 7 (WLx, EGx, CGx, and optionally BLx and SLx) can be analog level, binary level, or digital bits (in which case a DAC is provided to convert digital bits to appropriate input analog level) and the output can be analog level, binary level, or digital bits (in which case an output ADC is provided to convert output analog level into digital bits).

FIG. 8 is a block diagram depicting the usage of numerous layers of VMM arrays 32, here labeled as VMM arrays 32a, 32b, 32c, 32d, and 32e. As shown in FIG. 8, the input, denoted Inputx, is converted from digital to analog by a digital-to-analog converter 31 and provided to input VMM array 32a. The converted analog inputs could be voltage or current. The input D/A conversion for the first layer could be done by using a function or a LUT (look up table) that maps the inputs Inputx to appropriate analog levels for the matrix multiplier of input VMM array 32a. The input conversion could also be done by an analog to analog (A/A) converter to convert an external analog input to a mapped analog input to the input VMM array 32a.

The output generated by input VMM array 32a is provided as an input to the next VMM array (hidden level 1) 32b, which in turn generates an output that is provided as an input to the next VMM array (hidden level 2) 32c, and so on. The various layers of VMM array 32 function as different layers of synapses and neurons of a convolutional neural network (CNN). Each VMM array 32a, 32b, 32c, 32d, and 32e can be a stand-alone, physical non-volatile memory array, or multiple VMM arrays could utilize different portions of the same physical non-volatile memory array, or multiple VMM arrays could utilize overlapping portions of the same physical non-volatile memory array. The example shown in FIG. 8 contains five layers (32a,32b,32c,32d,32e): one input layer (32a), two hidden layers (32b,32c), and two fully connected layers (32d,32e). One of ordinary skill in the art will appreciate that this is merely an example and that a system instead could comprise more than two hidden layers and more than two fully connected layers.

Vector-by-Matrix Multiplication (VMM) Arrays

FIG. 9 depicts neuron VMM array 900, which is particularly suited for memory cells 310 as shown in FIG. 3 and is utilized as the synapses and parts of neurons between an input layer and the next layer. VMM array 900 comprises memory array 901 of non-volatile memory cells and reference array 902 (at the top of the array) of non-volatile reference memory cells. Alternatively, another reference array can be placed at the bottom.

In VMM array 900, control gate lines, such as control gate line 903, run in a vertical direction (hence reference array 902 in the row direction is orthogonal to control gate line 903), and erase gate lines, such as erase gate line 904, run in a horizontal direction. Here, the inputs to VMM array 900 are provided on the control gate lines (CG0, CG1, CG2, CG3), and the output of VMM array 900 emerges on the source lines (SL0, SL1). In one example, only even rows are used, and in another example, only odd rows are used. The current placed on each source line (SL0, SL1, respectively) performs a summing function of all the currents from the memory cells connected to that particular source line.

As described herein for neural networks, the non-volatile memory cells of VMM array 900, i.e., the memory cells 310 of VMM array 900, are optionally configured to operate in a sub-threshold region.

The non-volatile reference memory cells and the non-volatile memory cells described herein are biased in weak inversion (sub threshold region):

$$Ids=Io*e^{(Vg-Vth)/nVt}=w*Io*e^{(Vg)/nVt},$$

where $w=e^{(-Vth)/nVt}$ where Ids is the drain to source current; Vg is gate voltage on the memory cell; Vth is threshold voltage of the memory cell; Vt is thermal voltage=k*T/q with k being the Boltzmann constant, T the temperature in Kelvin, and q the electronic charge; n is a slope factor=1+(Cdep/Cox) with Cdep=capacitance of the depletion layer, and Cox capacitance of the gate oxide layer; Io is the memory cell current at gate voltage equal to threshold voltage, Io is proportional to (Wt/L)*u*Cox*(n−1)*Vt² where u is carrier mobility and Wt and L are width and length, respectively, of the memory cell.

For an I-to-V log converter using a memory cell (such as a reference memory cell or a peripheral memory cell) or a transistor to convert input current into an input voltage:

$$Vg=n*Vt*log\ [Ids/wp*Io]$$

where, wp is w of a reference or peripheral memory cell.

For a memory array used as a vector matrix multiplier VMM array with the current input, the output current is:

$$Iout=wa*Io*e^{(Vg)/nVt},\ namely$$

$$Iout=(wa/wp)*Iin=W*Iin$$

$$W=e^{(Vthp-Vtha)/nVt}$$

Here, wa=w of each memory cell in the memory array. Vthp is effective threshold voltage of the peripheral memory cell and Vtha is effective threshold voltage of the main (data) memory cell. Note that the threshold voltage of a transistor is a function of substrate body bias voltage and the substrate body bias voltage, denoted Vsb, can be modulated to compensate for various conditions, on such temperature. The threshold voltage Vth can be expressed as:

$$Vth=Vth0+gamma(SQRT|Vsb-2*\varphi F|)-SQRT|2*\varphi F|)$$

where Vth0 is threshold voltage with zero substrate bias, φF is a surface potential, and gamma is a body effect parameter.

A wordline or control gate can be used as the input for the memory cell for the input voltage.

Alternatively, the flash memory cells of VMM arrays described herein can be configured to operate in the linear region:

$$Ids=beta*(Vgs-Vth)*Vds;beta=u*Cox*Wt/L$$

$$W=\alpha(Vgs-Vth)$$

meaning weight W in the linear region is proportional to (Vgs−Vth)

A wordline or control gate or bitline or sourceline can be used as the input for the memory cell operated in the linear region. The bitline or sourceline can be used as the output for the memory cell.

For an I-to-V linear converter, a memory cell (such as a reference memory cell or a peripheral memory cell) or a transistor operating in the linear region can be used to linearly convert an input/output current into an input/output voltage.

Alternatively, the memory cells of VMM arrays described herein can be configured to operate in the saturation region:

$$Ids=\frac{1}{2}*beta*(Vgs-Vth)^2;beta=u*Cox*Wt/L$$

$$W\alpha(Vgs-Vth)^2,\ meaning\ weight\ W\ is\ proportional\ to\ (Vgs-Vth)^2$$

A wordline, control gate, or erase gate can be used as the input for the memory cell operated in the saturation region. The bitline or sourceline can be used as the output for the output neuron.

Alternatively, the memory cells of VMM arrays described herein can be used in all regions or a combination thereof (sub threshold, linear, or saturation) for each layer or multi layers of a neural network.

Other examples for VMM array 32 of FIG. 7 are described in U.S. Pat. No. 10,748,630, which is incorporated by reference herein. As described in that application. a sourceline or a bitline can be used as the neuron output (current summation output).

FIG. 10 depicts neuron VMM array 1000, which is particularly suited for memory cells 210 as shown in FIG. 2 and is utilized as the synapses between an input layer and the next layer. VMM array 1000 comprises a memory array 1003 of non-volatile memory cells, reference array 1001 of first non-volatile reference memory cells, and reference array 1002 of second non-volatile reference memory cells. Reference arrays 1001 and 1002, arranged in the column direction of the array, serve to convert current inputs flowing into terminals BLR0, BLR1, BLR2, and BLR3 into voltage inputs WL0, WL1, WL2, and WL3. In effect, the first and second non-volatile reference memory cells are diode-connected through multiplexors 1014 (only partially depicted) with current inputs flowing into them. The reference cells are tuned (e.g., programmed) to target reference levels. The target reference levels are provided by a reference mini-array matrix (not shown).

Memory array 1003 serves two purposes. First, it stores the weights that will be used by the VMM array 1000 on respective memory cells thereof. Second, memory array 1003 effectively multiplies the inputs (i.e. current inputs provided in terminals BLR0, BLR1, BLR2, and BLR3, which reference arrays 1001 and 1002 convert into the input voltages to supply to wordlines WL0, WL1, WL2, and WL3) by the weights stored in the memory array 1003 and then adds all the results (memory cell currents) to produce the output on the respective bit lines (BL0-BLN), which will be the input to the next layer or input to the final layer. By performing the multiplication and addition function, memory array 1003 negates the need for separate multiplication and addition logic circuits and is also power efficient. Here, the voltage inputs are provided on the word lines WL0, WL1, WL2, and WL3, and the output emerges on the respective bit lines BL0-BLN during a read (inference) operation. The current placed on each of the bit lines BL0-BLN performs a summing function of the currents from all non-volatile memory cells connected to that particular bitline.

Table No. 5 depicts operating voltages and currents for VMM array 1000. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE 5

| Operation of VMM Array 1000 of FIG. 10: | | | | | |
|---|---|---|---|---|---|
| | WL | WL-unsel | BL | BL-unsel | SL | SL-unsel |
| Read | 1-3.5 V | -0.5 V/ 0 V | 0.6-2 V (Ineuron) | 0.6 V-2 V/0 V | 0 V | 0 V |
| Erase | ~5-13 V | 0 V | 0 V | 0 V | 0 V | 0 V |
| Program | 1-2 V | -0.5 V/ 0 V | 0.1-3 uA | Vinh ~2.5 V | 4-10 V | 0-1 V/ FLT |

FIG. 11 depicts neuron VMM array 1100, which is particularly suited for memory cells 210 as shown in FIG. 2 and is utilized as the synapses and parts of neurons between an input layer and the next layer. VMM array 1100 comprises a memory array 1103 of non-volatile memory cells, reference array 1101 of first non-volatile reference memory cells, and reference array 1102 of second non-volatile reference memory cells. Reference arrays 1101 and 1102 run in row direction of the VMM array 1100. VMM array is similar to VMM 1000 except that in VMM array 1100, the word lines run in the vertical direction. Here, the inputs are provided on the word lines (WLA0, WLB0, WLA1, WLB2, WLA2, WLB2, WLA3, WLB3), and the output emerges on the source line (SL0, SL1) during a read operation. The current placed on each source line performs a summing function of all the currents from the memory cells connected to that particular source line.

Table No. 6 depicts operating voltages and currents for VMM array 1100. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE 6

| Operation of VMM Array 1100 of FIG. 11 | | | | | |
|---|---|---|---|---|---|
| | WL | WL-unsel | BL | BL-unsel | SL | SL-unsel |
| Read | 1-3.5 V | -0.5 V/ 0 V | 0.6-2 V | 0.6 V-2 V/0 V | ~0.3-1 V (Ineuron) | 0 V |
| Erase | ~5-13 V | 0 V | 0 V | 0 V | 0 V | SL-inhibit (~4-8 V) |
| Program | 1-2 V | -0.5 V/ 0 V | 0.1-3 uA | Vinh ~2.5 V | 4-10 V | 0-1 V/ FLT |

FIG. 12 depicts neuron VMM array 1200, which is particularly suited for memory cells 310 as shown in FIG. 3 and is utilized as the synapses and parts of neurons between an input layer and the next layer. VMM array 1200 comprises a memory array 1203 of non-volatile memory cells, reference array 1201 of first non-volatile reference memory cells, and reference array 1202 of second non-volatile reference memory cells. Reference arrays 1201 and 1202 serve to convert current inputs flowing into terminals BLR0, BLR1, BLR2, and BLR3 into voltage inputs CG0, CG1, CG2, and CG3. In effect, the first and second non-volatile reference memory cells are diode-connected through multiplexors 1212 (only partially shown) with current inputs flowing into them through BLR0, BLR1, BLR2, and BLR3. Multiplexors 1212 each include a respective multiplexor 1205 and a cascoding transistor 1204 to ensure a constant voltage on the bitline (such as BLR0) of each of the first and second non-volatile reference memory cells during a read operation. The reference cells are tuned to target reference levels.

Memory array 1203 serves two purposes. First, it stores the weights that will be used by the VMM array 1200. Second, memory array 1203 effectively multiplies the inputs (current inputs provided to terminals BLR0, BLR1, BLR2, and BLR3, for which reference arrays 1201 and 1202 convert these current inputs into the input voltages to supply to the control gates (CG0, CG1, CG2, and CG3) by the weights stored in the memory array and then add all the results (cell currents) to produce the output, which appears on BL0-BLN, and will be the input to the next layer or input to the final layer. By performing the multiplication and addition function, the memory array negates the need for separate multiplication and addition logic circuits and is also power efficient. Here, the inputs are provided on the control gate lines (CG0, CG1, CG2, and CG3), and the output emerges on the bit lines (BL0-BLN) during a read operation. The current placed on each bitline performs a summing function of all the currents from the memory cells connected to that particular bitline.

VMM array 1200 implements uni-directional tuning for non-volatile memory cells in memory array 1203. That is, each non-volatile memory cell is erased and then partially programmed until the desired charge on the floating gate is reached. If too much charge is placed on the floating gate (such that the wrong value is stored in the cell), the cell is erased and the sequence of partial programming operations starts over. As shown, two rows sharing the same erase gate (such as EG0 or EG1) are erased together (which is known as a page erase), and thereafter, each cell is partially programmed until the desired charge on the floating gate is reached.

Table No. 7 depicts operating voltages and currents for VMM array 1200. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

and is utilized as the synapses and parts of neurons between an input layer and the next layer. In VMM array 2200, the inputs $INPUT_0, \ldots, INPUT_N$ are received on bit lines

TABLE 7

| | | | | | | CG-unsel same sector | | | | | |
|---|---|---|---|---|---|---|---|---|---|---|---|
| | WL | WL-unsel | BL | BL-unsel | CG | | CG-unsel | EG | EG-unsel | SL | SL-unsel |
| Read | 1.0-2 V | −0.5 V/0 V | 0.6-2 V (Ineuron) | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 0-2.6 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

Operation of VMM Array 1200 of FIG. 12

FIG. 13 depicts neuron VMM array 1300, which is particularly suited for memory cells 310 as shown in FIG. 3, and is utilized as the synapses and parts of neurons between an input layer and the next layer. VMM array 1300 comprises a memory array 1303 of non-volatile memory cells, reference array 1301 or first non-volatile reference memory cells, and reference array 1302 of second non-volatile reference memory cells. EG lines EGR0, EG0, EG1 and EGR1 are run vertically while CG lines CG0, CG1, CG2 and CG3 and SL lines WL0, WL1, WL2 and WL3 are run horizontally. VMM array 1300 is similar to VMM array 1400, except that VMM array 1300 implements bi-directional tuning, where each individual cell can be completely erased, partially programmed, and partially erased as needed to reach the desired amount of charge on the floating gate due to the use of separate EG lines. As shown, reference arrays 1301 and 1302 convert input current in the terminal BLR0, BLR1, BLR2, and BLR3 into control gate voltages CG0, CG1, CG2, and CG3 (through the action of diode-connected reference cells through multiplexors 1314) to be applied to the memory cells in the row direction. The current output (neuron) is in the bit lines BL0-BLN, where each bit line sums all currents from the non-volatile memory cells connected to that particular bitline.

Table No. 8 depicts operating voltages and currents for VMM array 1300. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

$BL_0, \ldots BL_N$, respectively, and the outputs $OUTPUT_1$, $OUTPUT_2$, $OUTPUT_3$, and $OUTPUT_4$ are generated on source lines SL0, $SL_1$, $SL_2$, and $SL_3$, respectively.

Figure 23:
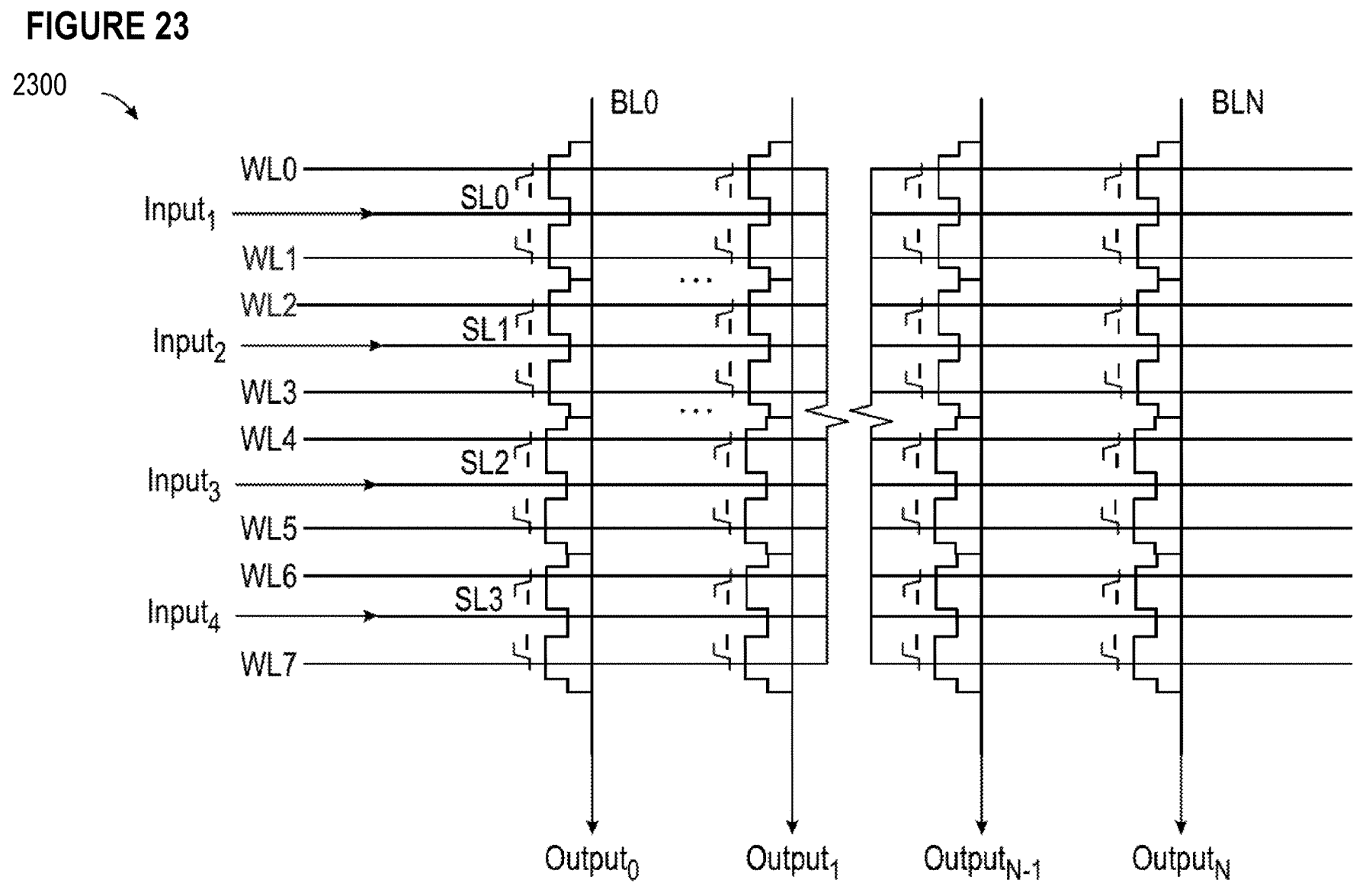

FIG. 23 depicts neuron VMM array 2300, which is particularly suited for memory cells 210 as shown in FIG. 2 and is utilized as the synapses and parts of neurons between an input layer and the next layer. In this example, the inputs $INPUT_0$, $INPUT_1$, $INPUT_2$, and $INPUT_3$ are received on source lines SL0, $SL_1$, $SL_2$, and $SL_3$, respectively, and the outputs $OUTPUT_0, \ldots OUTPUT_N$ are generated on bit lines $BL_0, \ldots, BLN$.

FIG. 24 depicts neuron VMM array 2400, which is particularly suited for memory cells 210 as shown in FIG. 2, and is utilized as the synapses and parts of neurons between an input layer and the next layer. In this example, the inputs $INPUT_0, \ldots, INPUT_M$ are received on word lines WL0, $\ldots$, $WL_M$, respectively, and the outputs $OUTPUT_0, \ldots OUTPUT_N$ are generated on bit lines $BL_0, \ldots, BLN$.

FIG. 25 depicts neuron VMM array 2500, which is particularly suited for memory cells 310 as shown in FIG. 3, and is utilized as the synapses and parts of neurons between an input layer and the next layer. In this example, the inputs $INPUT_0, \ldots, INPUT_M$ are received on word lines $WL_0$, $\ldots$, $WL_M$, respectively, and the outputs $OUTPUT_0, \ldots OUTPUT_N$ are generated on bit lines $BL_0, \ldots, BL_N$.

FIG. 26 depicts neuron VMM array 2600, which is particularly suited for memory cells 410 as shown in FIG. 4, and is utilized as the synapses and parts of neurons between an input layer and the next layer. In this example, the inputs $INPUT_0, \ldots, INPUT_n$ are received on vertical control gate lines $CG_0, \ldots, CG_N$, respectively, and the outputs $OUTPUT_1$ and $OUTPUT_2$ are generated on source lines $SL_0$ and $SL_1$.

FIG. 27 depicts neuron VMM array 2700, which is particularly suited for memory cells 410 as shown in FIG. 4,

TABLE 8

| | | | | | | CG-unsel same sector | | | | | |
|---|---|---|---|---|---|---|---|---|---|---|---|
| | WL | WL-unsel | BL | BL-unsel | CG | | CG-unsel | EG | EG-unsel | SL | SL-unsel |
| Read | 1.0-2 V | −0.5 V/ 0 V | 0.6-2 V (Ineuron) | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 4-9 V | 0-2.6 V | 5-12 V | 0-2.6 V | 0 V | 0 V |
| Program | 0.7-1 V | −0.5 V/ 0 V | 0.1-1 uA | Vinh (1-2 V) | 4-11 V | 0-2.6 V | 0-2.6 V | 4.5-5 V | 0-2.6 V | 4.5-5 V | 0-1 V |

Operation of VMM Array 1300 of FIG. 13

FIG. 22 depicts neuron VMM array 2200, which is particularly suited for memory cells 210 as shown in FIG. 2 and is utilized as the synapses and parts of neurons between an input layer and the next layer. In this example, the inputs $INPUT_0, \ldots, INPUT_N$ are received on the gates of bit line control gates 2701-1, 2701-2, . . . , 2701-(N-1), and 2701-N, respectively, which are coupled to bit lines $BL_0, \ldots, BL_N$, respectively. Example outputs $OUTPUT_1$ and $OUTPUT_2$ are generated on source lines $SL_0$ and $SL_1$.

FIG. 28 depicts neuron VMM array 2800, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0, \ldots, INPUT_M$ are received on word lines $WL_0, \ldots, WL_M$, and the outputs $OUTPUT_0, \ldots, OUTPUT_N$ are generated on bit lines $BL_0, \ldots BL_N$, respectively.

FIG. 29 depicts neuron VMM array 2900, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0, \ldots, INPUT_M$ are received on control gate lines $CG_0, \ldots, CG_M$. Outputs $OUTPUT_0, \ldots, OUTPUT_N$ are generated on vertical source lines $SL_0, \ldots, SLN$, respectively, where each source line $SL_i$ is coupled to the source lines of all memory cells in column i.

FIG. 30 depicts neuron VMM array 3000, which is particularly suited for memory cells 310 as shown in FIG. 3, memory cells 510 as shown in FIG. 5, and memory cells 710 as shown in FIG. 7, and is utilized as the synapses and parts of neurons between an input layer and the next layer. In this example, the inputs $INPUT_0, \ldots, INPUT_M$ are received on control gate lines $CG_0, \ldots, CG_M$. Outputs $OUTPUT_0, \ldots, OUTPUT_N$ are generated on vertical bit lines $BL_0, \ldots, BL_N$, respectively, where each bit line $BL_i$ is coupled to the bit lines of all memory cells in column i.

Long Short-Term Memory

The prior art includes a concept known as long short-term memory (LSTM). LSTM units often are used in neural networks. LSTM allows a neural network to remember information over predetermined arbitrary time intervals and to use that information in subsequent operations. A conventional LSTM unit comprises a cell, an input gate, an output gate, and a forget gate. The three gates regulate the flow of information into and out of the cell and the time interval that the information is remembered in the LSTM. VMMs are particularly useful in LSTM units.

FIG. 14 depicts an example LSTM 1400. LSTM 1400 in this example comprises cells 1401, 1402, 1403, and 1404. Cell 1401 receives input vector $x_0$ and generates output vector $h_0$ and cell state vector $c_0$. Cell 1402 receives input vector $x_1$, the output vector (hidden state) $h_0$ from cell 1401, and cell state $c_0$ from cell 1401 and generates output vector $h_1$ and cell state vector $c_1$. Cell 1403 receives input vector $x_2$, the output vector (hidden state) $h_1$ from cell 1402, and cell state $c_1$ from cell 1402 and generates output vector $h_2$ and cell state vector $c_2$. Cell 1404 receives input vector $x_3$, the output vector (hidden state) $h_2$ from cell 1403, and cell state $c_2$ from cell 1403 and generates output vector $h_3$. Additional cells can be used, and an LSTM with four cells is merely an example.

FIG. 15 depicts an example implementation of an LSTM cell 1500, which can be used for cells 1401, 1402, 1403, and 1404 in FIG. 14. LSTM cell 1500 receives input vector x(t), cell state vector c(t-1) from a preceding cell, and output vector h(t-1) from a preceding cell, and generates cell state vector c(t) and output vector h(t).

LSTM cell 1500 comprises sigmoid function devices 1501, 1502, and 1503, each of which applies a number between 0 and 1 to control how much of each component in the input vector is allowed through to the output vector. LSTM cell 1500 also comprises tanh devices 1504 and 1505 to apply a hyperbolic tangent function to an input vector, multiplier devices 1506, 1507, and 1508 to multiply two vectors together, and addition device 1509 to add two vectors together. Output vector h(t) can be provided to the next LSTM cell in the system, or it can be accessed for other purposes.

FIG. 16 depicts an LSTM cell 1600, which is an example of an implementation of LSTM cell 1500. For the reader's convenience, the same numbering from LSTM cell 1500 is used in LSTM cell 1600. Sigmoid function devices 1501, 1502, and 1503 and tanh device 1504 each comprise multiple VMM arrays 1601 and activation function blocks 1602. Thus, it can be seen that VMM arrays are particular useful in LSTM cells used in certain neural network systems. The multiplier devices 1506, 1507, and 1508 and the addition device 1509 are implemented in a digital manner or in an analog manner. The activation function blocks 1602 can be implemented in a digital manner or in an analog manner.

An alternative to LSTM cell 1600 (and another example of an implementation of LSTM cell 1500) is shown in FIG. 17. In FIG. 17, sigmoid function devices 1501, 1502, and 1503 and tanh device 1504 share the same physical hardware (VMM arrays 1701 and activation function block 1702) in a time-multiplexed fashion. LSTM cell 1700 also comprises multiplier device 1703 to multiply two vectors together, addition device 1708 to add two vectors together, tanh device 1505 (which comprises activation function block 1702), register 1707 to store the value i(t) when i(t) is output from sigmoid function block 1702, register 1704 to store the value f(t)*c(t-1) when that value is output from multiplier device 1703 through multiplexor 1710, register 1705 to store the value i(t)*u(t) when that value is output from multiplier device 1703 through multiplexor 1710, and register 1706 to store the value o(t)*c~(t) when that value is output from multiplier device 1703 through multiplexor 1710, and multiplexor 1709.

Whereas LSTM cell 1600 contains multiple sets of VMM arrays 1601 and respective activation function blocks 1602, LSTM cell 1700 contains only one set of VMM arrays 1701 and activation function block 1702, which are used to represent multiple layers in the example of LSTM cell 1700. LSTM cell 1700 will require less space than LSTM 1600, as LSTM cell 1700 will require ¼ as much space for VMMs and activation function blocks compared to LSTM cell 1600.

It can be further appreciated that LSTM units will typically comprise multiple VMM arrays, each of which requires functionality provided by certain circuit blocks outside of the VMM arrays, such as a summer and activation function block and high voltage generation blocks. Providing separate circuit blocks for each VMM array would require a significant amount of space within the semiconductor device and would be somewhat inefficient. The examples described below therefore reduce the circuitry required outside of the VMM arrays themselves.

Gated Recurrent Units

An analog VMM implementation can be utilized for a GRU (gated recurrent unit) system. GRUs are a gating mechanism in recurrent neural networks. GRUs are similar to LSTMs, except that GRU cells generally contain fewer components than an LSTM cell.

FIG. 18 depicts an example GRU 1800. GRU 1800 in this example comprises cells 1801, 1802, 1803, and 1804. Cell 1801 receives input vector $x_0$ and generates output vector $h_0$. Cell 1802 receives input vector $x_1$, the output vector $h_0$ from cell 1801 and generates output vector $h_1$. Cell 1803 receives input vector $x_2$ and the output vector (hidden state) $h_1$ from cell 1802 and generates output vector $h_2$. Cell 1804 receives input vector $x_3$ and the output vector (hidden state) $h_2$ from cell 1803 and generates output vector $h_3$. Additional cells can be used, and an GRU with four cells is merely an example.

FIG. 19 depicts an example implementation of a GRU cell 1900, which can be used for cells 1801, 1802, 1803, and 1804 of FIG. 18. GRU cell 1900 receives input vector x(t) and output vector h(t−1) from a preceding GRU cell and generates output vector h(t). GRU cell 1900 comprises sigmoid function devices 1901 and 1902, each of which applies a number between 0 and 1 to components from output vector h(t−1) and input vector x(t). GRU cell 1900 also comprises a tanh device 1903 to apply a hyperbolic tangent function to an input vector, a plurality of multiplier devices 1904, 1905, and 1906 to multiply two vectors together, an addition device 1907 to add two vectors together, and a complementary device 1908 to subtract an input from 1 to generate an output.

FIG. 20 depicts a GRU cell 2000, which is an example of an implementation of GRU cell 1900. For the reader's convenience, the same numbering from GRU cell 1900 is used in GRU cell 2000. As can be seen in FIG. 20, sigmoid function devices 1901 and 1902, and tanh device 1903 each comprise multiple VMM arrays 2001 and activation function blocks 2002. Thus, it can be seen that VMM arrays are of particular use in GRU cells used in certain neural network systems. The multiplier devices 1904, 1905, 1906, the addition device 1907, and the complementary device 1908 are implemented in a digital manner or in an analog manner. The activation function blocks 2002 can be implemented in a digital manner or in an analog manner.

An alternative to GRU cell 2000 (and another example of an implementation of GRU cell 1900) is shown in FIG. 21. In FIG. 21, GRU cell 2100 utilizes VMM arrays 2101 and activation function block 2102, which when configured as a sigmoid function applies a number between 0 and 1 to control how much of each component in the input vector is allowed through to the output vector. In FIG. 21, sigmoid function devices 1901 and 1902 and tanh device 1903 share the same physical hardware (VMM arrays 2101 and activation function block 2102) in a time-multiplexed fashion GRU cell 2100 also comprises multiplier device 2103 to multiply two vectors together, addition device 2105 to add two vectors together, complementary device 2109 to subtract an input from 1 to generate an output, multiplexor 2104, register 2106 to hold the value h(t−1)*r(t) when that value is output from multiplier device 2103 through multiplexor 2104, register 2107 to hold the value h(t−1)*z(t) when that value is output from multiplier device 2103 through multiplexor 2104, and register 2108 to hold the value hˆ(t)*(1−z(t)) when that value is output from multiplier device 2103 through multiplexor 2104.

Whereas GRU cell 2000 contains multiple sets of VMM arrays 2001 and activation function blocks 2002, GRU cell 2100 contains only one set of VMM arrays 2101 and activation function block 2102, which are used to represent multiple layers in the example of GRU cell 2100. GRU cell 2100 will require less space than GRU cell 2000, as GRU cell 2100 will require ⅓ as much space for VMMs and activation function blocks compared to GRU cell 2000.

It can be further appreciated that CRU systems will typically comprise multiple VMM arrays, each of which requires functionality provided by certain circuit blocks outside of the VMM arrays, such as a summer and activation function block and high voltage generation blocks. Providing separate circuit blocks for each VMM array would require a significant amount of space within the semiconductor device and would be somewhat inefficient. The examples described below therefore reduce the circuitry required outside of the VMM arrays themselves.

The input to the VMM arrays can be an analog level, a binary level, a pulse, a time modulated pulse, or digital bits (in this case a DAC is needed to convert digital bits to appropriate input analog level) and the output can be an analog level, a binary level, a timing pulse, pulses, or digital bits (in this case an output ADC is needed to convert output analog level into digital bits).

In general, for each memory cell in a VMM array, each weight W can be implemented by a single memory cell or by a differential cell or by two blend memory cells (average of 2 cells). In the differential cell case, two memory cells are needed to implement a weight W as a differential weight (W=W+−W−). In the two blend memory cells, two memory cells are needed to implement a weight W as an average of two cells.

FIG. 31 depicts VMM system 3100. In some examples, the weights, W, stored in a VMM array are stored as differential pairs, W+ (positive weight) and W− (negative weight), where W=(W+)−(W−). In VMM system 3100, half of the bit lines are designated as W+ lines, that is, bit lines connecting to memory cells that will store positive weights W+, and the other half of the bit lines are designated as W− lines, that is, bit lines connecting to memory cells implementing negative weights W−. The W− lines are interspersed among the W+ lines in an alternating fashion. The subtraction operation is performed by a summation circuit that receives current from a W+ line and a W− line, such as summation circuits 3101 and 3102. The output of a W+ line and the output of a W− line are combined together to give effectively W=W+−W− for each pair of (W+, W−) cells for all pairs of (W+, W−) lines. While the above has been described in relation to W− lines interspersed among the W+ lines in an alternating fashion, in other examples W+ lines and W− lines can be arbitrarily located anywhere in the array.

FIG. 32 depicts another example. In VMM system 3210, positive weights W+ are implemented in first array 3211 and negative weights W− are implemented in a second array 3212, second array 3212 separate from the first array, and the resulting weights are appropriately combined together by summation circuits 3213.

FIG. 33 depicts VMM system 3300. the weights, W, stored in a VMM array are stored as differential pairs, W+(positive weight) and W− (negative weight), where W=(W+)−(W−). VMM system 3300 comprises array 3301 and array 3302. Half of the bit lines in each of array 3301 and 3302 are designated as W+ lines, that is, bit lines connecting to memory cells that will store positive weights W+, and the other half of the bit lines in each of array 3301 and 3302 are designated as W− lines, that is, bit lines connecting to memory cells implementing negative weights W−. The W− lines are interspersed among the W+ lines in an alternating fashion. The subtraction operation is performed by a summation circuit that receives current from a W+ line and a W− line, such as summation circuits 3303, 3304, 3305, and 3306. The output of a W+ line and the output of a W− line from each array 3301, 3302 are respectively combined together to give effectively W=W+−W− for each pair of (W+, W−) cells for all pairs of (W+, W−) lines. In addition, the W values from each array 3301 and 3302 can be further combined through summation circuits 3307 and 3308, such that each W value is the result of a W value from array 3301 minus a W value from array 3302, meaning that the end result from summation circuits 3307 and 3308 is a differential value of two differential values.

Each non-volatile memory cells used in the analog neural memory system is to be erased and programmed to hold a very specific and precise amount of charge, i.e., the number of electrons, in the floating gate. For example, each floating gate should hold one of N different values, where N is the number of different weights that can be indicated by each cell. Examples of N include 16, 32, 64, 128, and 256.

Similarly, a read operation must be able to accurately discern between N different levels.

It can be appreciated that accuracy is extremely important in program and read operations in VMM systems. However, intrinsic variation among memory cells can detract from the accuracy of a system. For example, characteristics such as the maximum cell current that a cell can conduct (Icell max), the number of bits that are being stored in a cell, the I-V slope (analog continuous input) of a cell (which indicates that current drawn by the cell for each particular voltage on a terminal of the cell), temperature behavior, and whether a cell is located in an odd row or an even row can affect the neural network performance. Extrinsic variation in how cells are utilized also can detract from accuracy. For example, characteristics such as circuit mismatch and variation among external components and the cells, and current drop based on the cell's location within the array affects accuracy.

What is needed are calibration techniques that can be performed in real-time in VMM systems to compensate for intrinsic and extrinsic variations among cells during operation.

SUMMARY OF THE INVENTION

Numerous examples are disclosed for performing calibration of various electrical parameters in a deep learning artificial neural network. Calibration of such electrical parameters can compensate for variations among transistors, memory cells, or other devices or for changes in operating temperature. Electrical parameters can be calibrated for the entire deep learning artificial neural network, for each layer in the deep learning artificial neural network, or for a portion of a layer in the deep learning artificial neural network.

BRIEF DESCRIPTION OF THE DRAWINGS

FIG. 7 is a block diagram illustrating a vector-by-matrix multiplication system.

FIG. 23 depicts another example of a vector-by-matrix multiplication system.

FIG. 35 depicts an example calibration method.

FIG. 37 depicts another example calibration method.

FIG. 42 depicts an example read circuit.

FIG. 43 depicts an example input block.

FIG. 46 depicts an example input block.

FIG. 49 depicts an example input-output for an input block.

FIG. 50 depicts an example output block.

FIG. 56 depicts example waveforms for a digital-to-analog converter.

DETAILED DESCRIPTION OF THE INVENTION

The artificial neural networks of the present examples utilize a combination of CMOS technology and non-volatile memory arrays.

VMM System Overview

Figure 1:
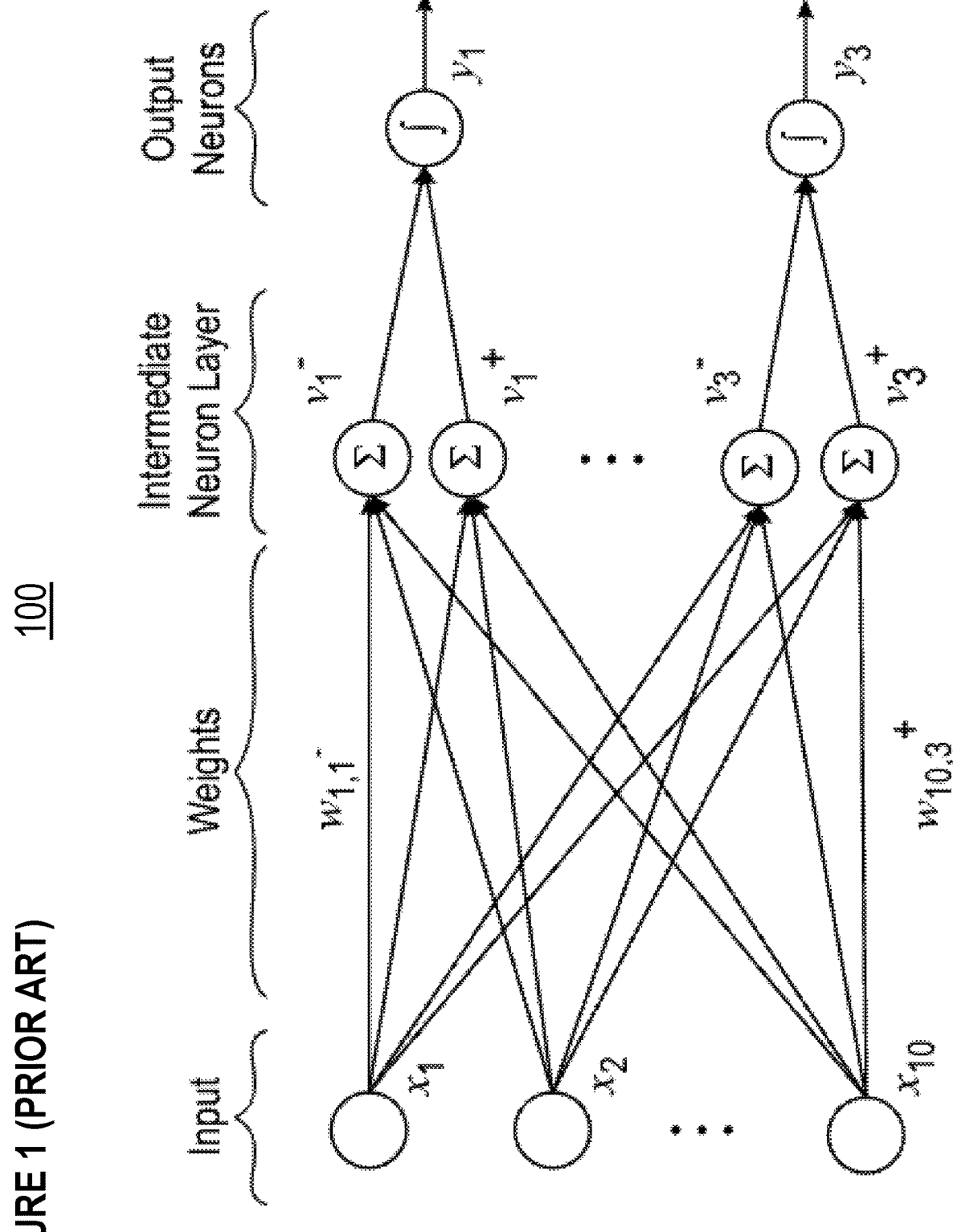
FIG. 1 is a diagram that illustrates an artificial neural network.
Figure 2:
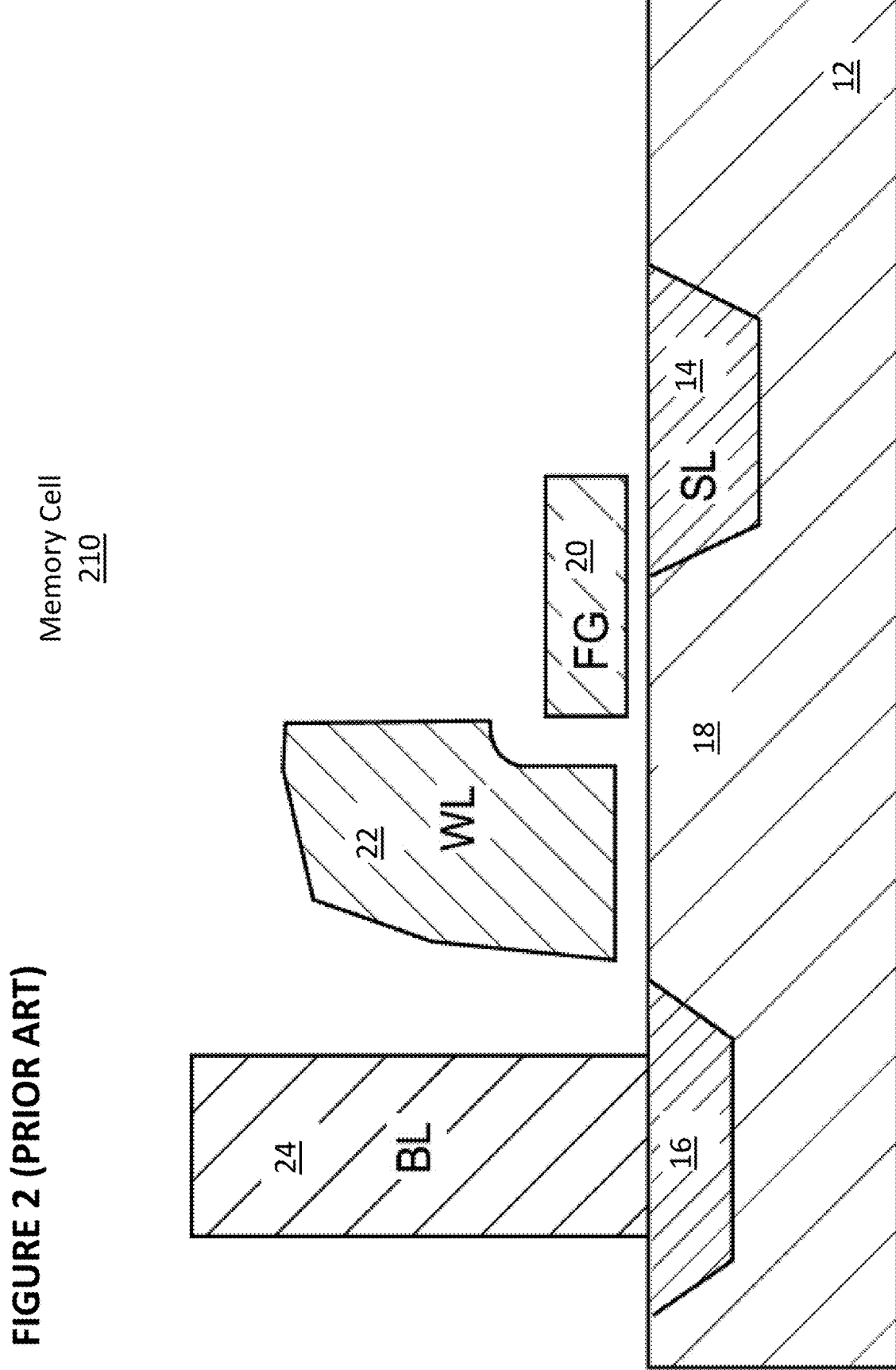
FIG. 2 depicts a prior art split gate flash memory cell.
Figure 3:
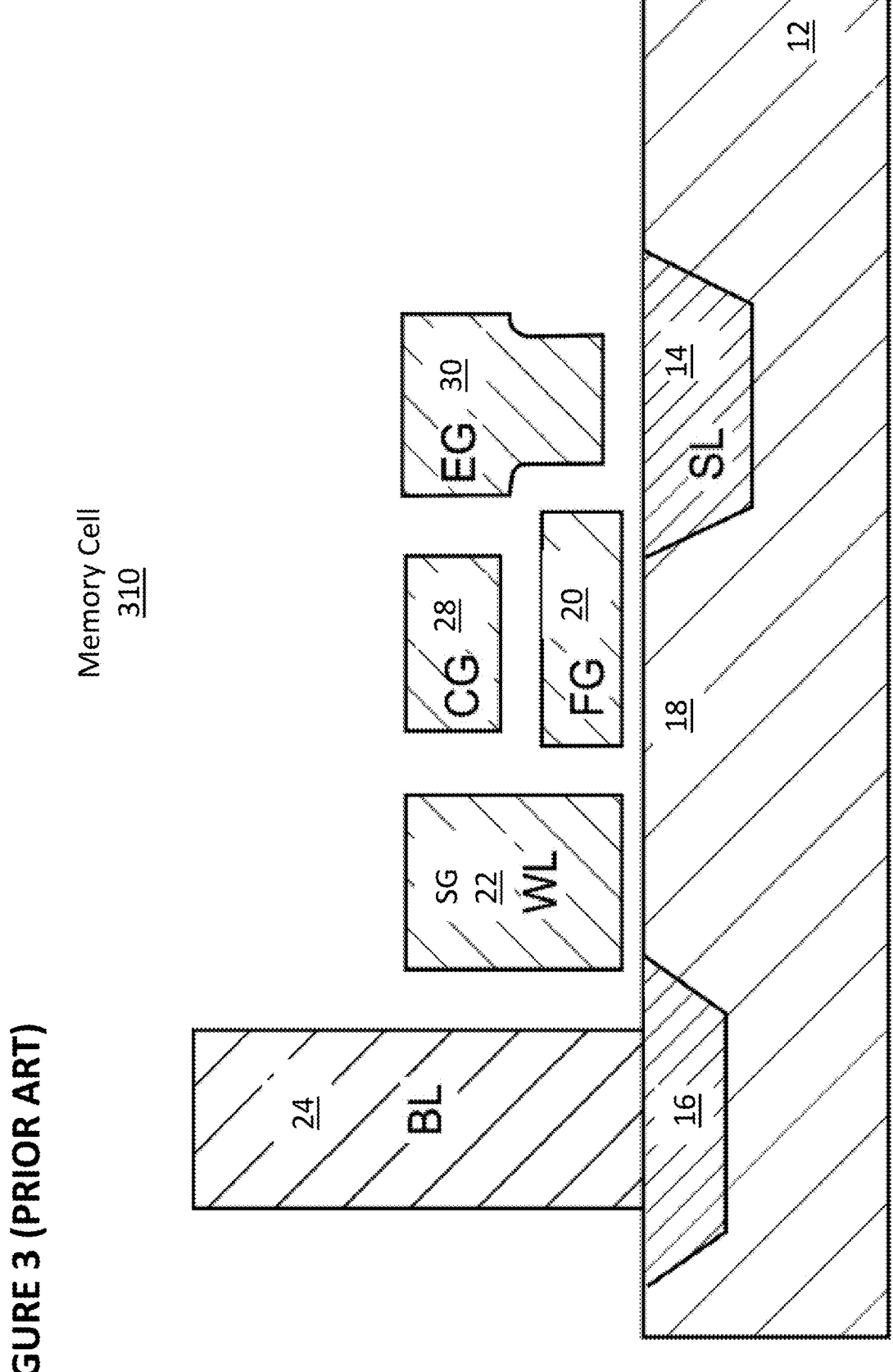
FIG. 3 depicts another prior art split gate flash memory cell.
Figure 4:
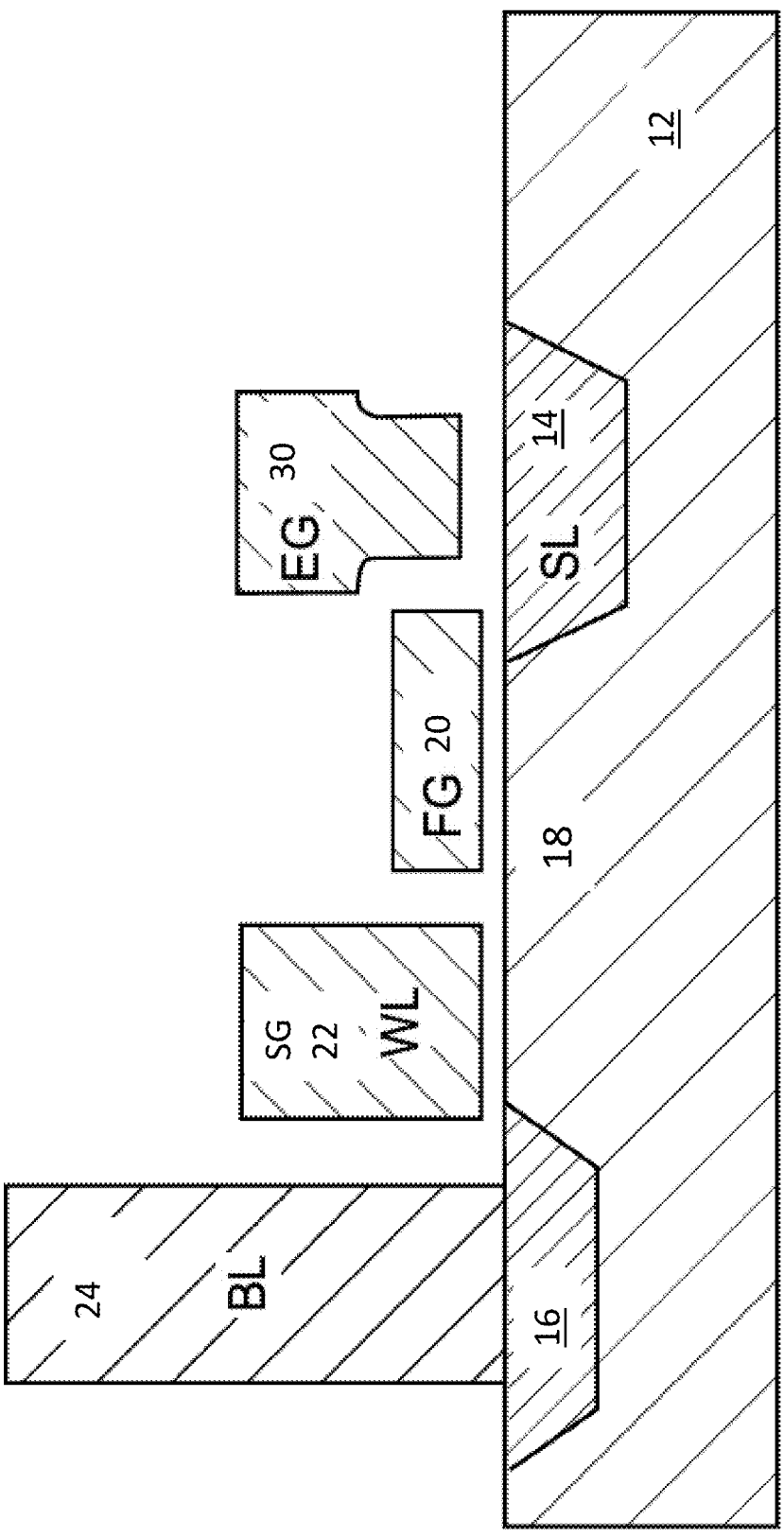
FIG. 4 depicts another prior art split gate flash memory cell.
Figure 5:
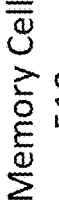
FIG. 5 depicts another prior art split gate flash memory cell.
Figure 6:
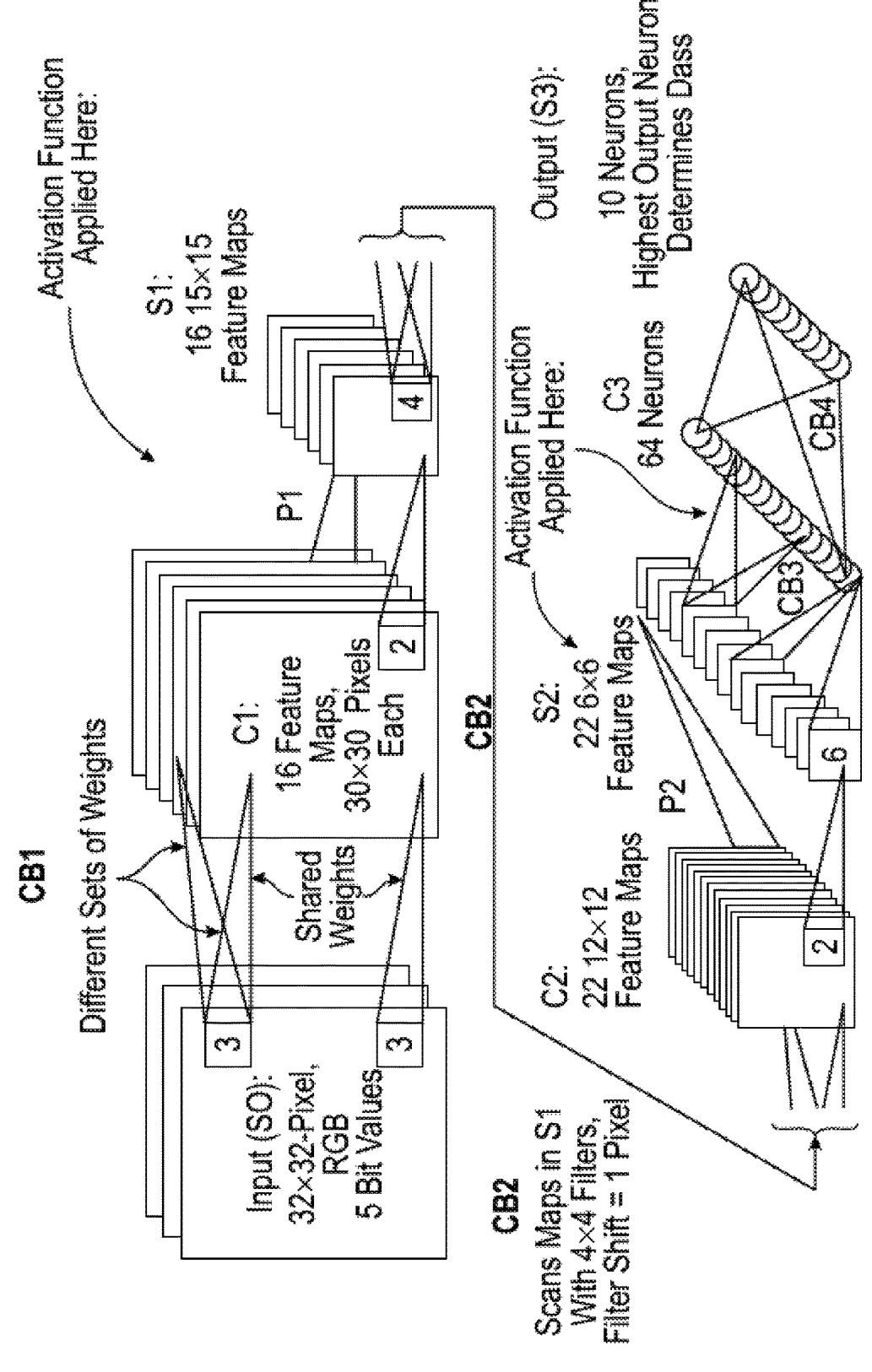
FIG. 6 is a diagram illustrating the different levels of an example artificial neural network utilizing one or more non-volatile memory arrays.
Figure 8:
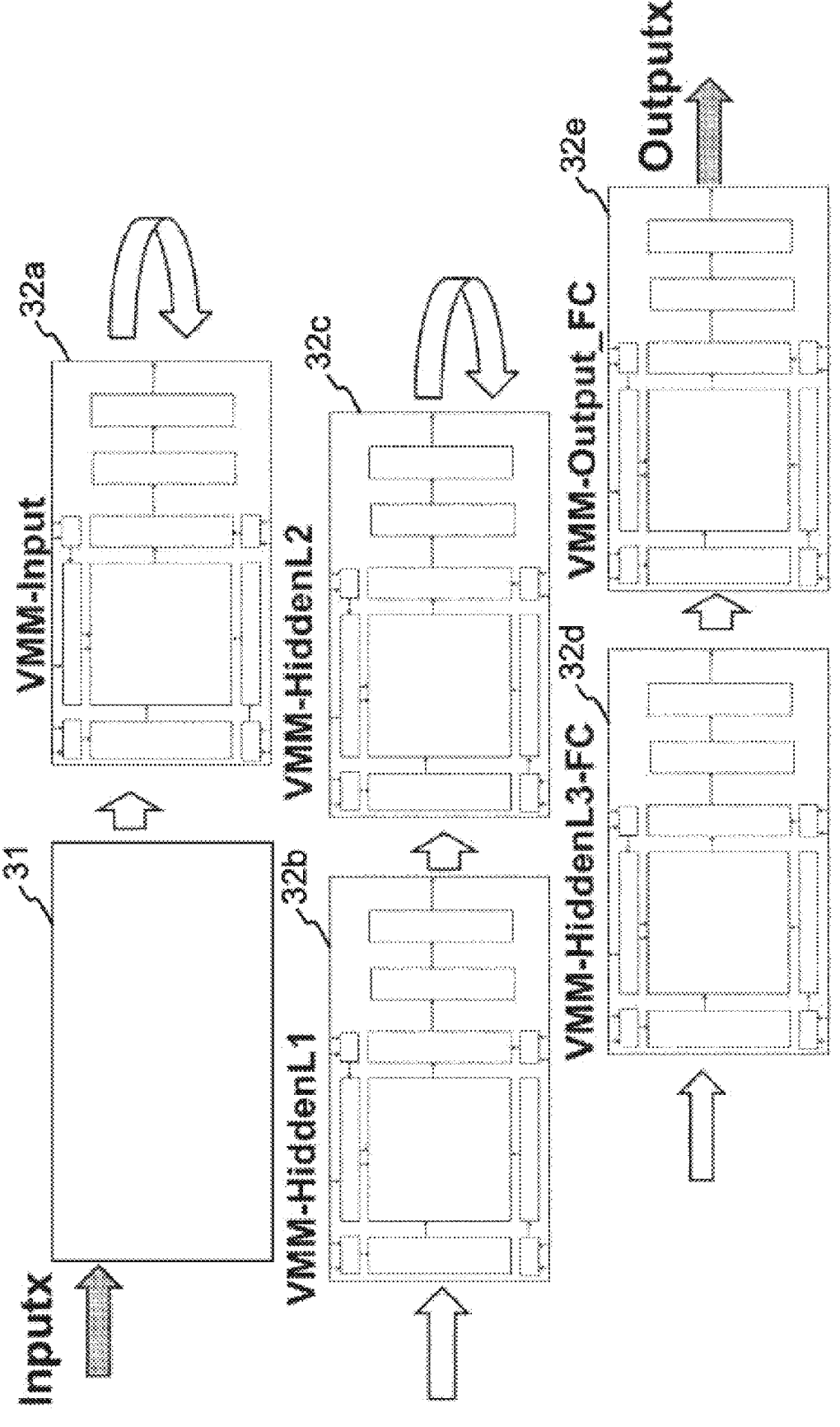
FIG. 8 is a block diagram illustrates an example artificial neural network utilizing one or more vector-by-matrix multiplication systems.
Figure 9:
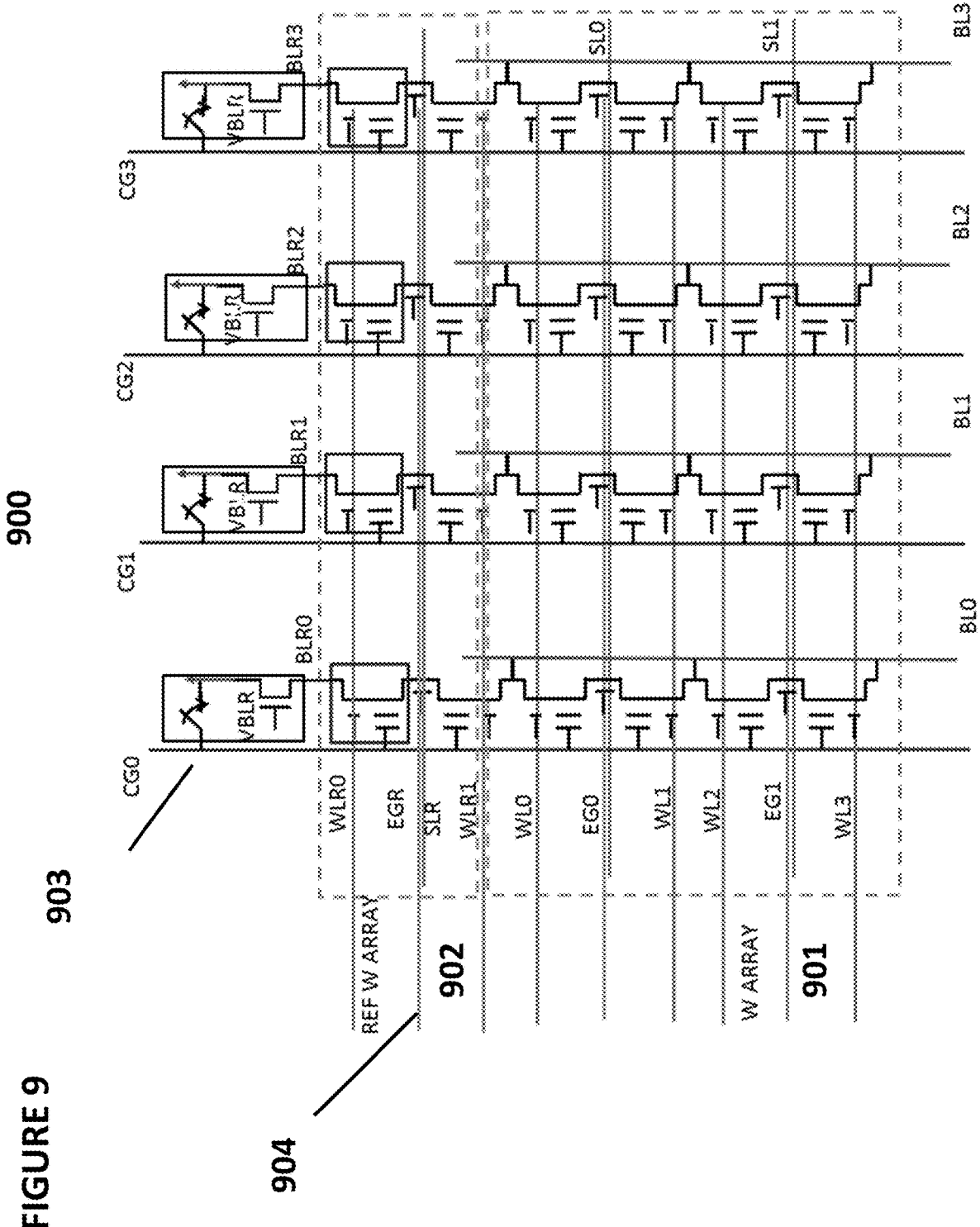
FIG. 9 depicts another example of a vector-by-matrix multiplication system.
Figure 10:
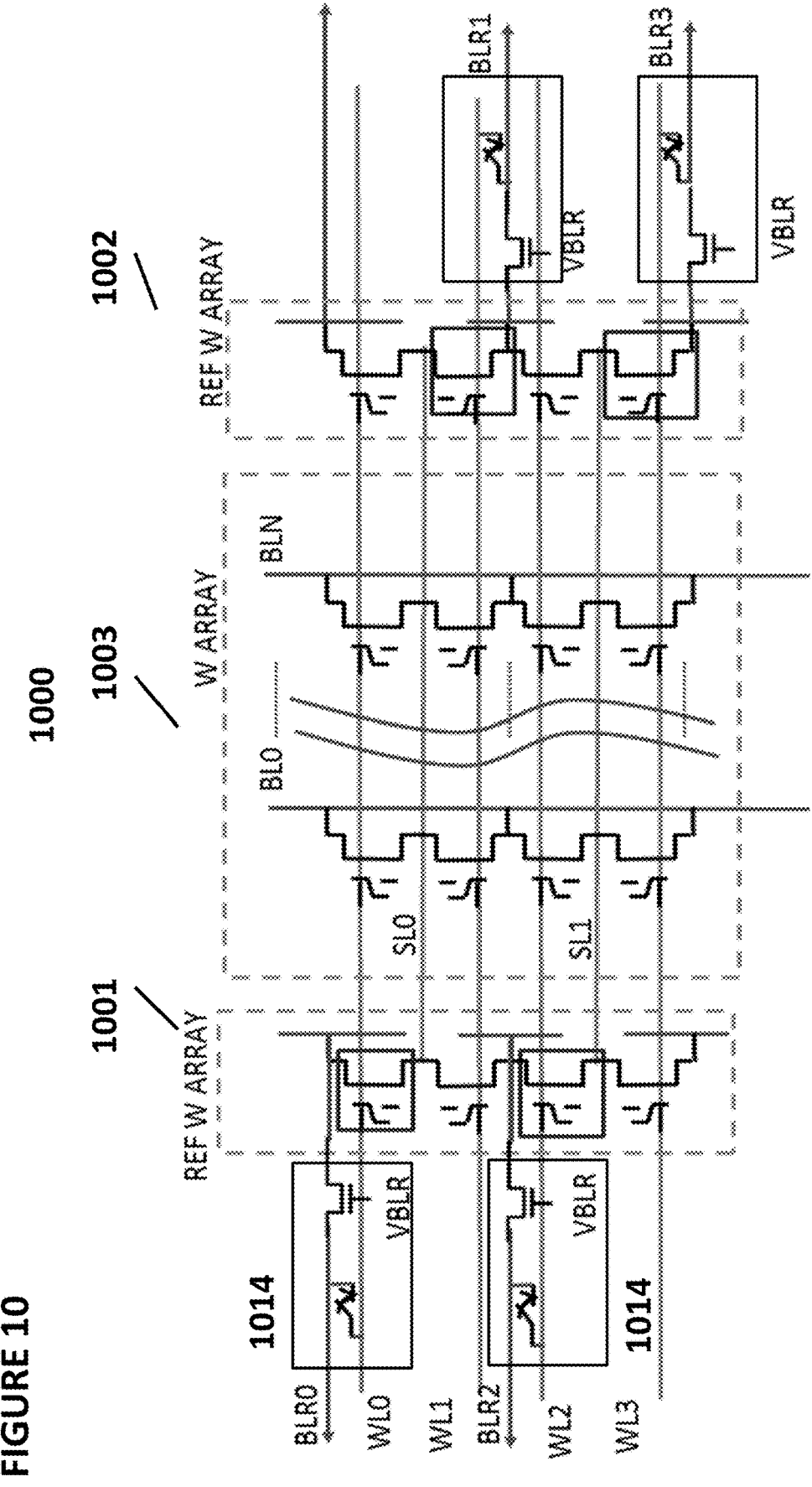
FIG. 10 depicts another example of a vector-by-matrix multiplication system.
Figure 11:
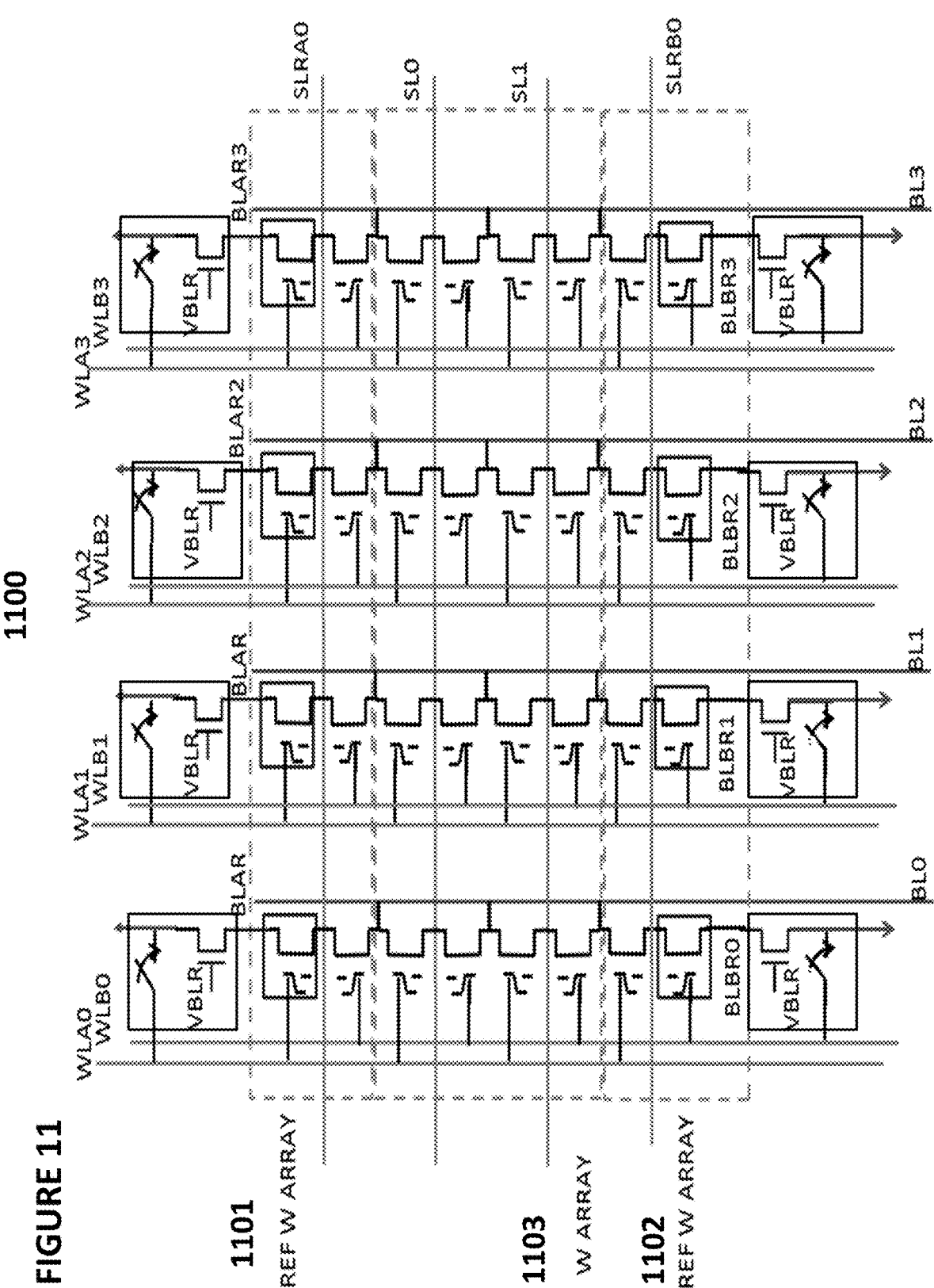
FIG. 11 depicts another example of a vector-by-matrix multiplication system.
Figure 12:
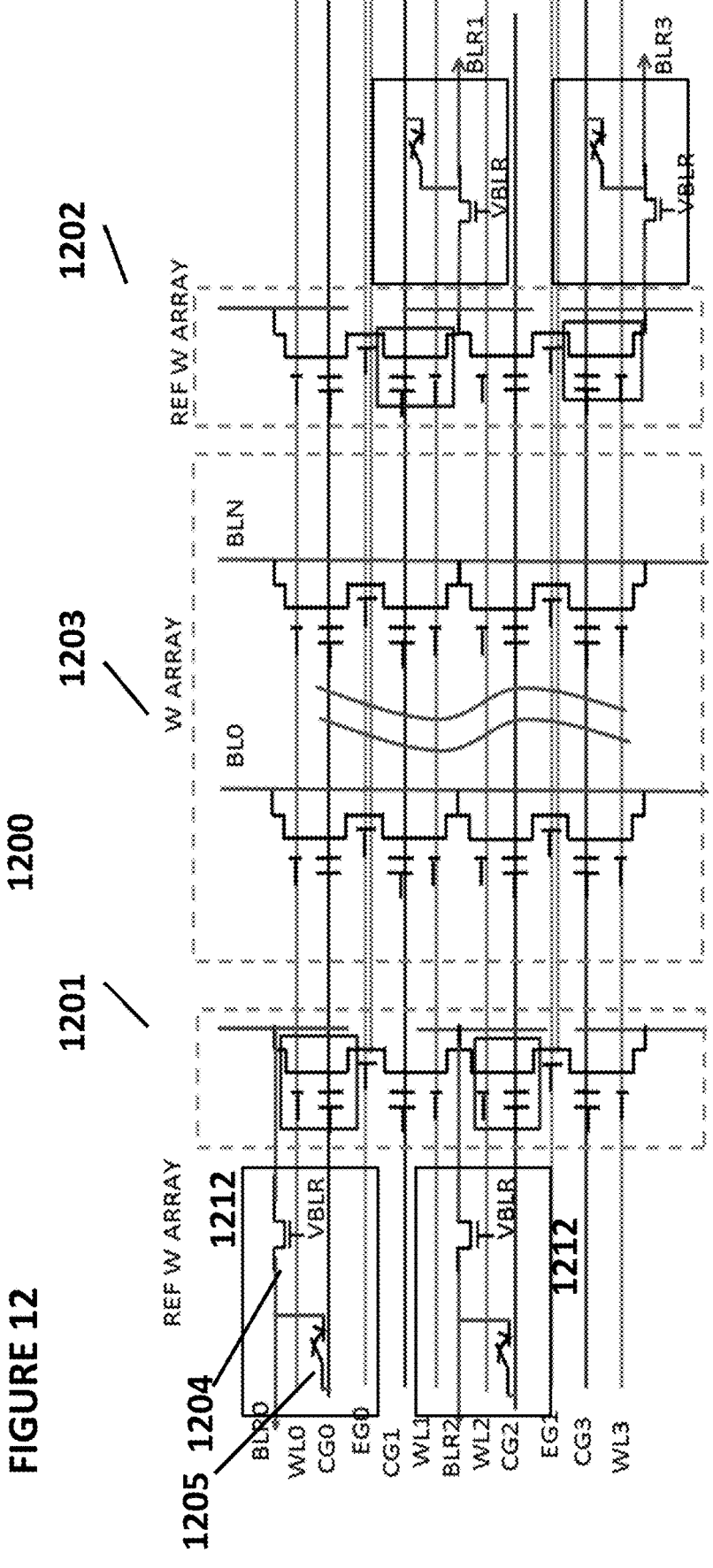
FIG. 12 depicts another example of a vector-by-matrix multiplication system.
Figure 13:
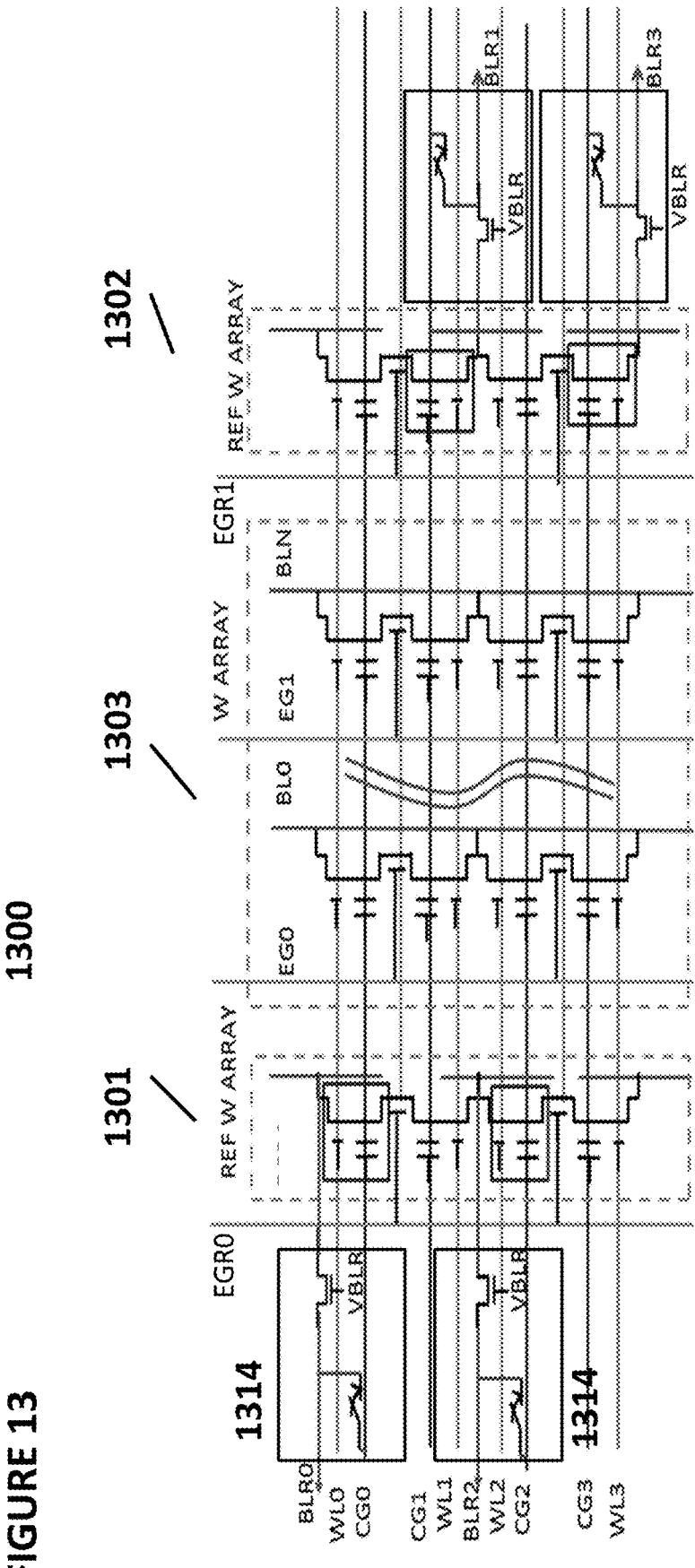
FIG. 13 depicts another example of a vector-by-matrix multiplication system.
Figure 14:
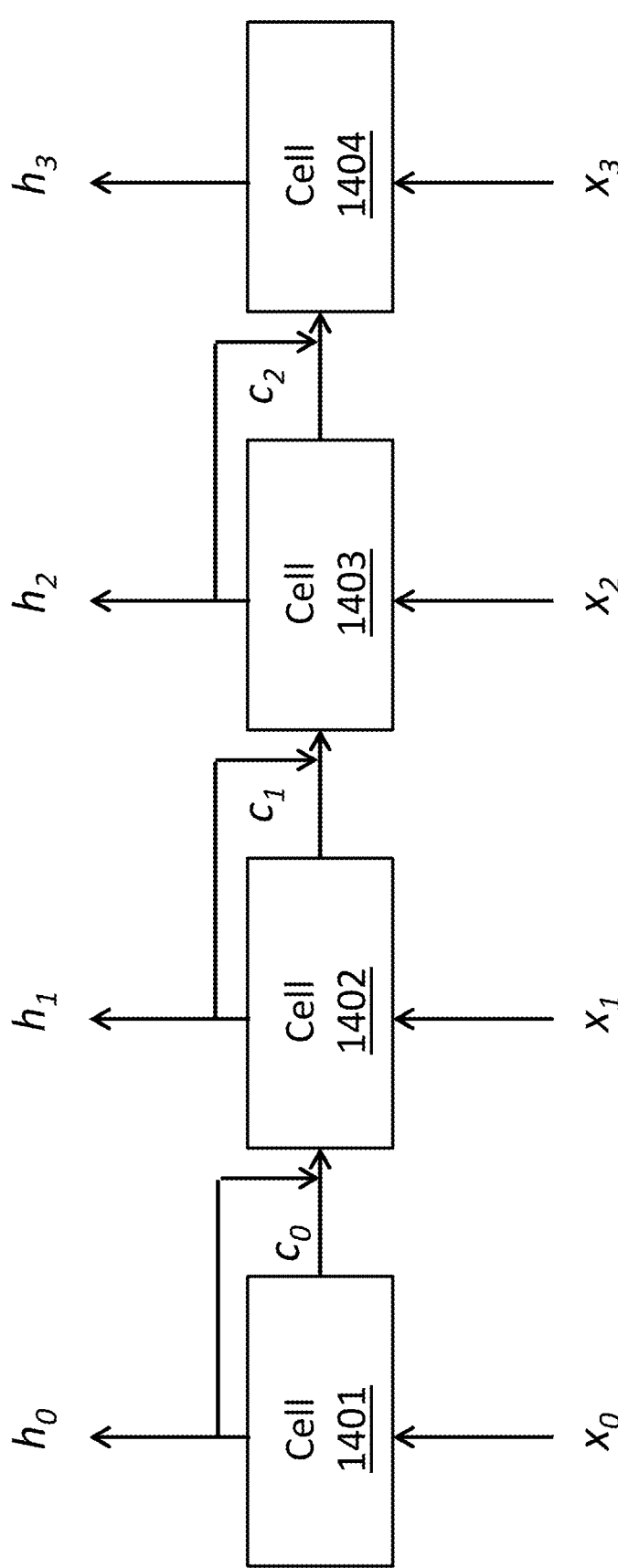
FIG. 14 depicts a prior art long short-term memory system.
Figure 15:
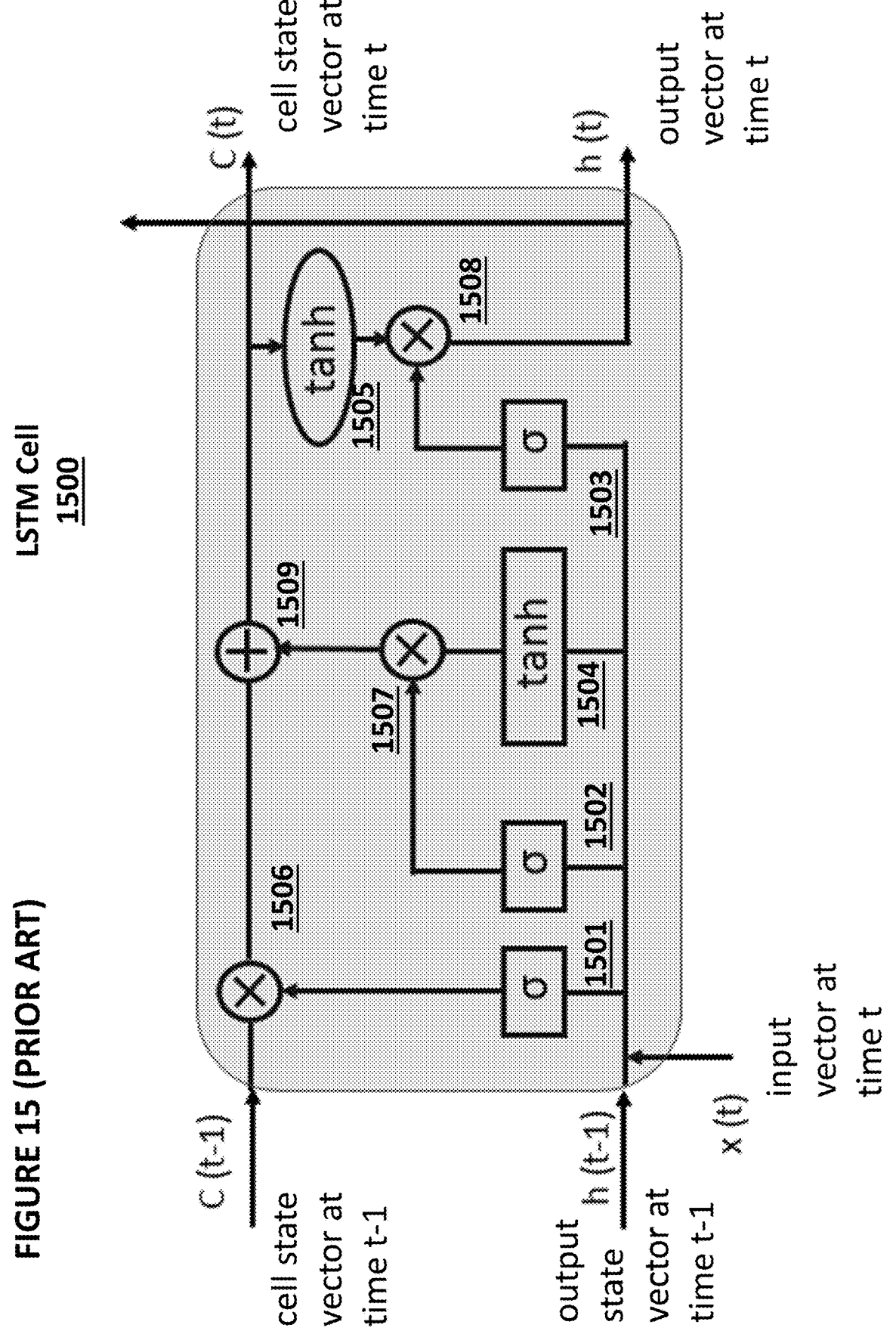
FIG. 15 depicts an example cell for use in a long short-term memory system.
Figure 16:
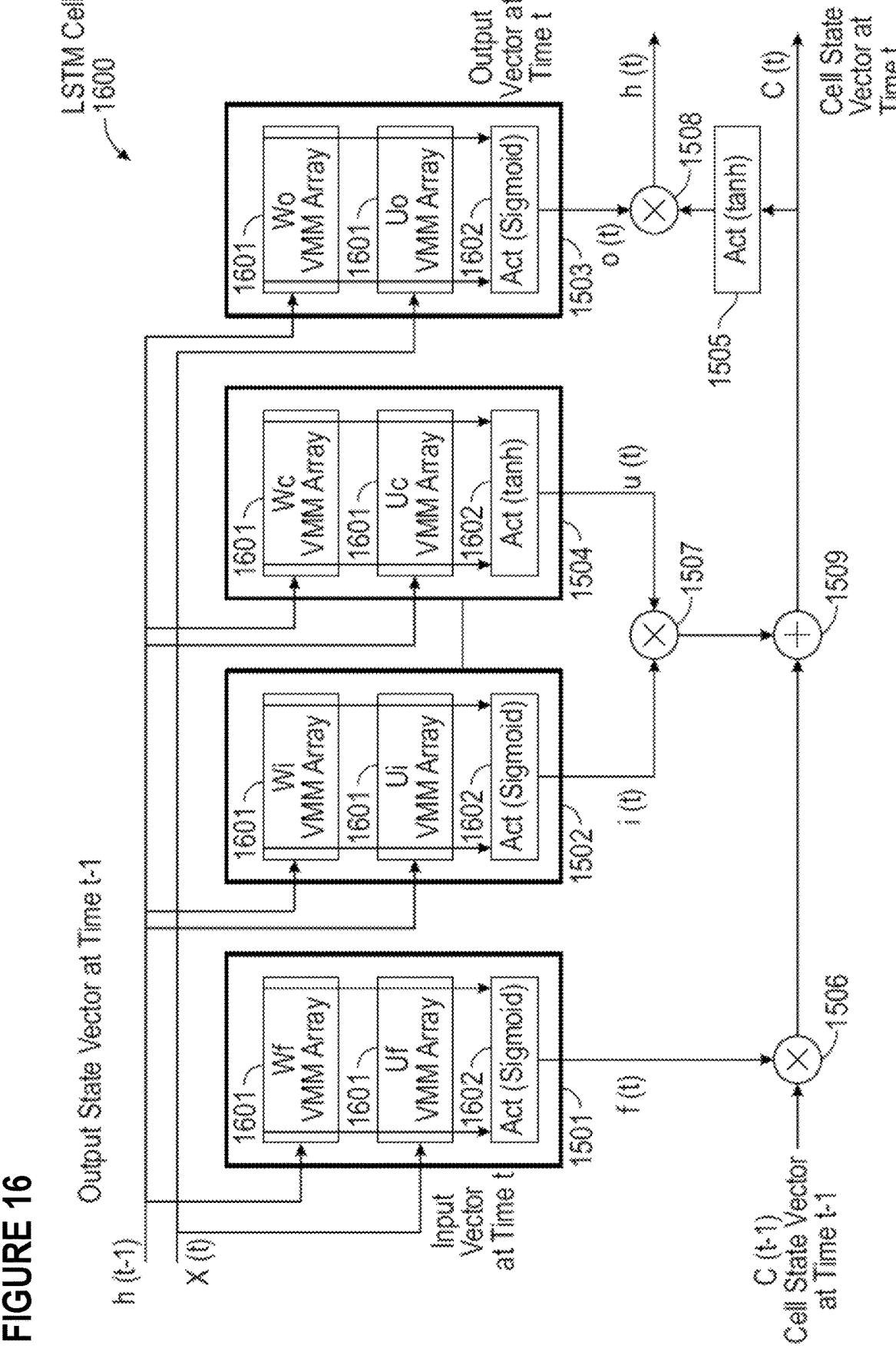
FIG. 16 depicts an example implementation of the cell of FIG. 15.
Figure 17:
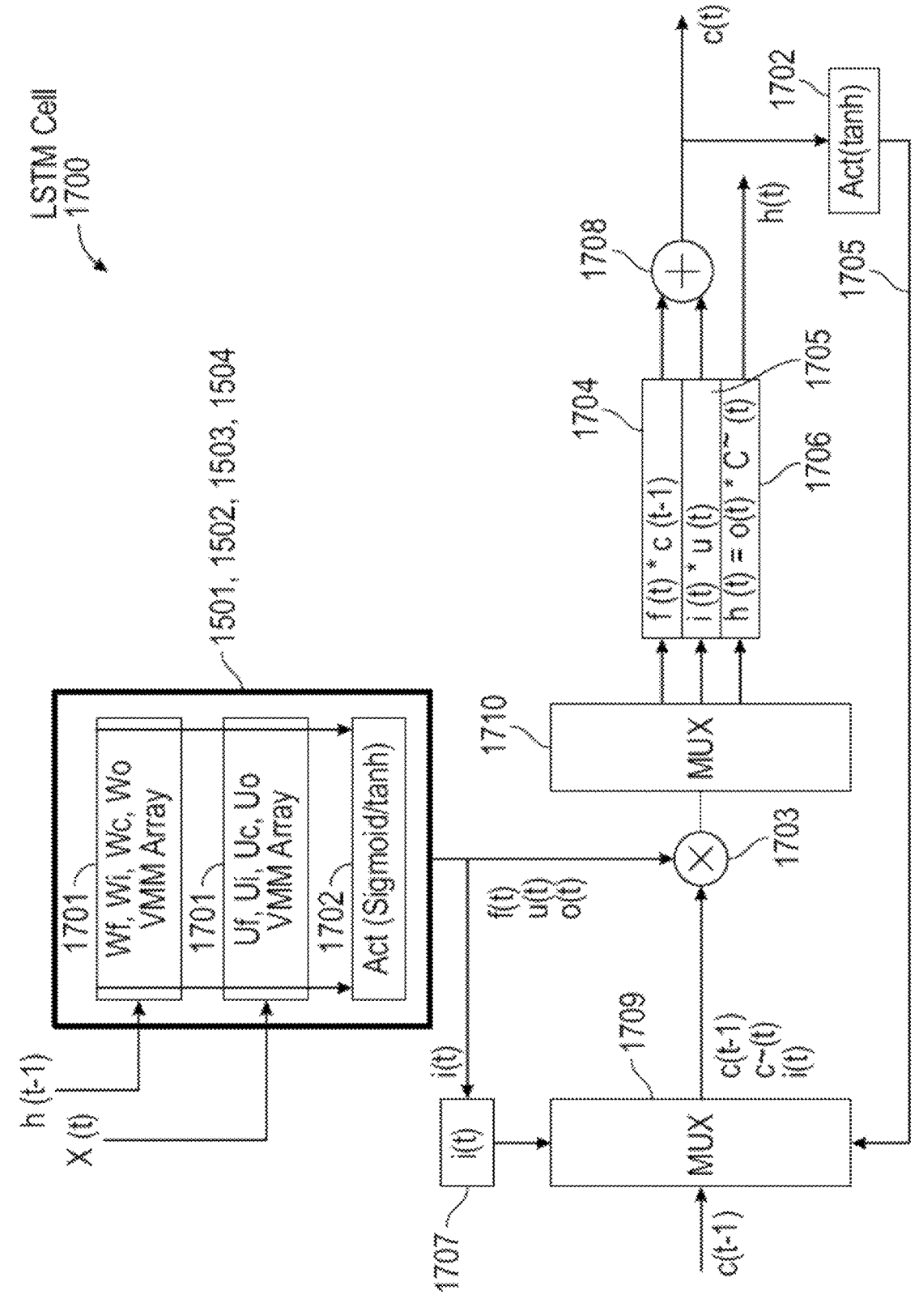
FIG. 17 depicts another example implementation of the cell of FIG. 15.
Figure 18:
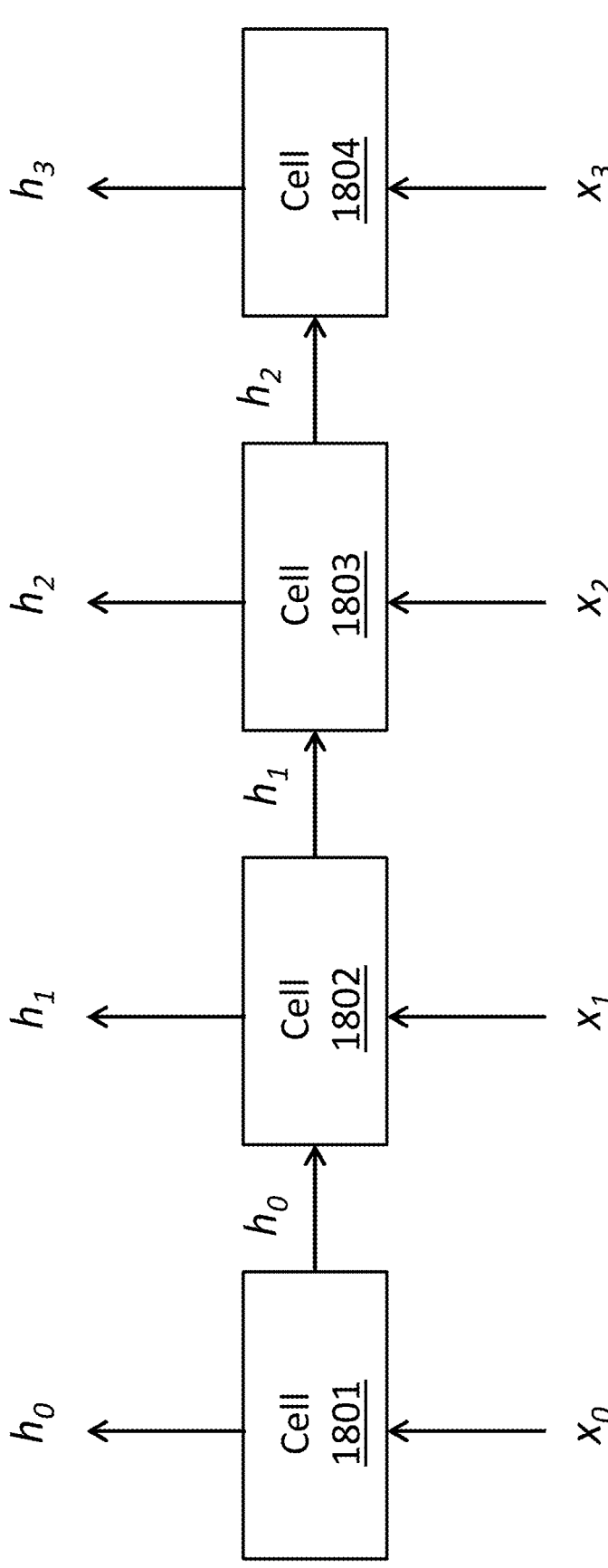
FIG. 18 depicts a prior art gated recurrent unit system.
Figure 19:
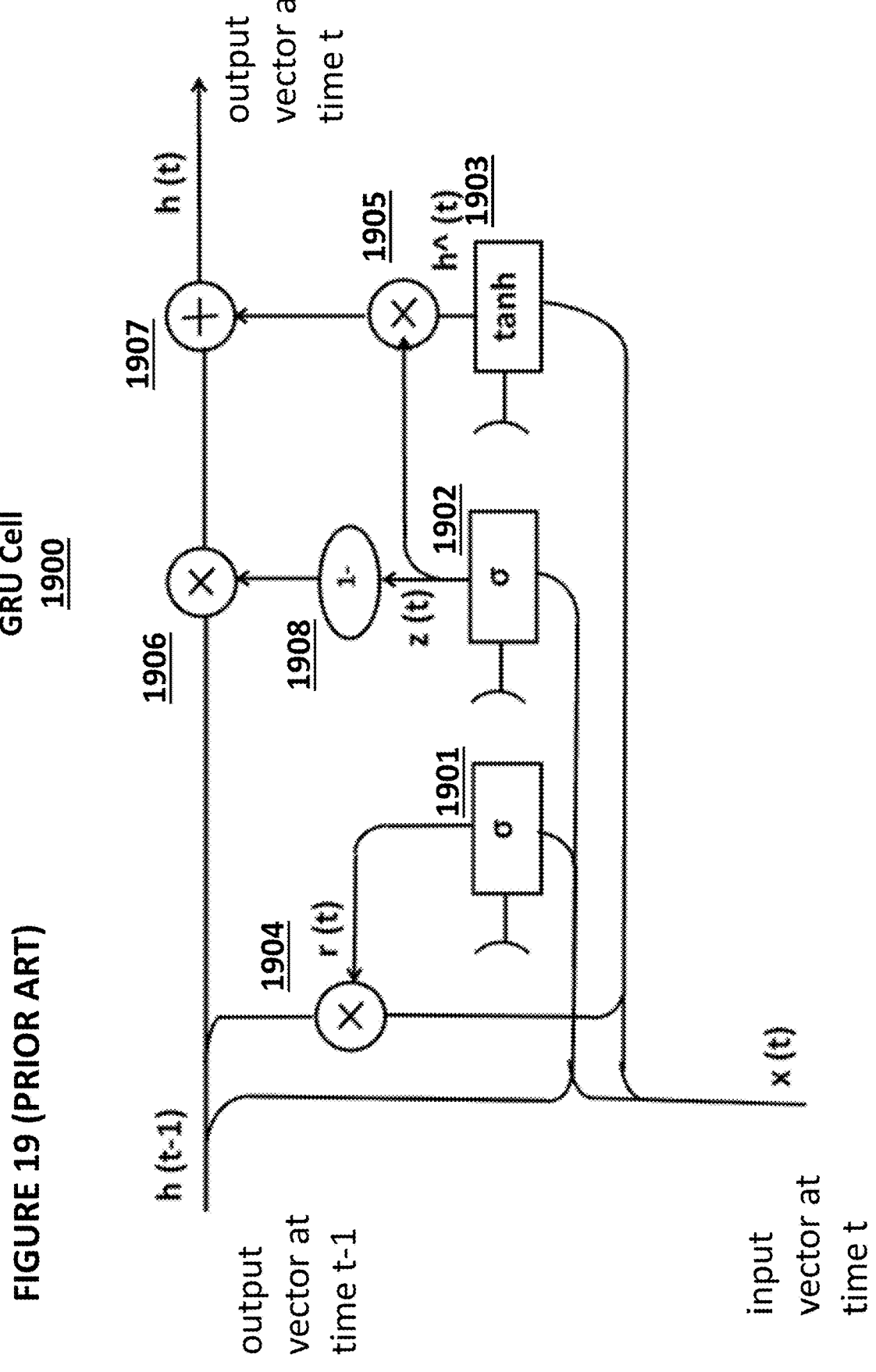
FIG. 19 depicts an example cell for use in a gated recurrent unit system.
Figure 20:
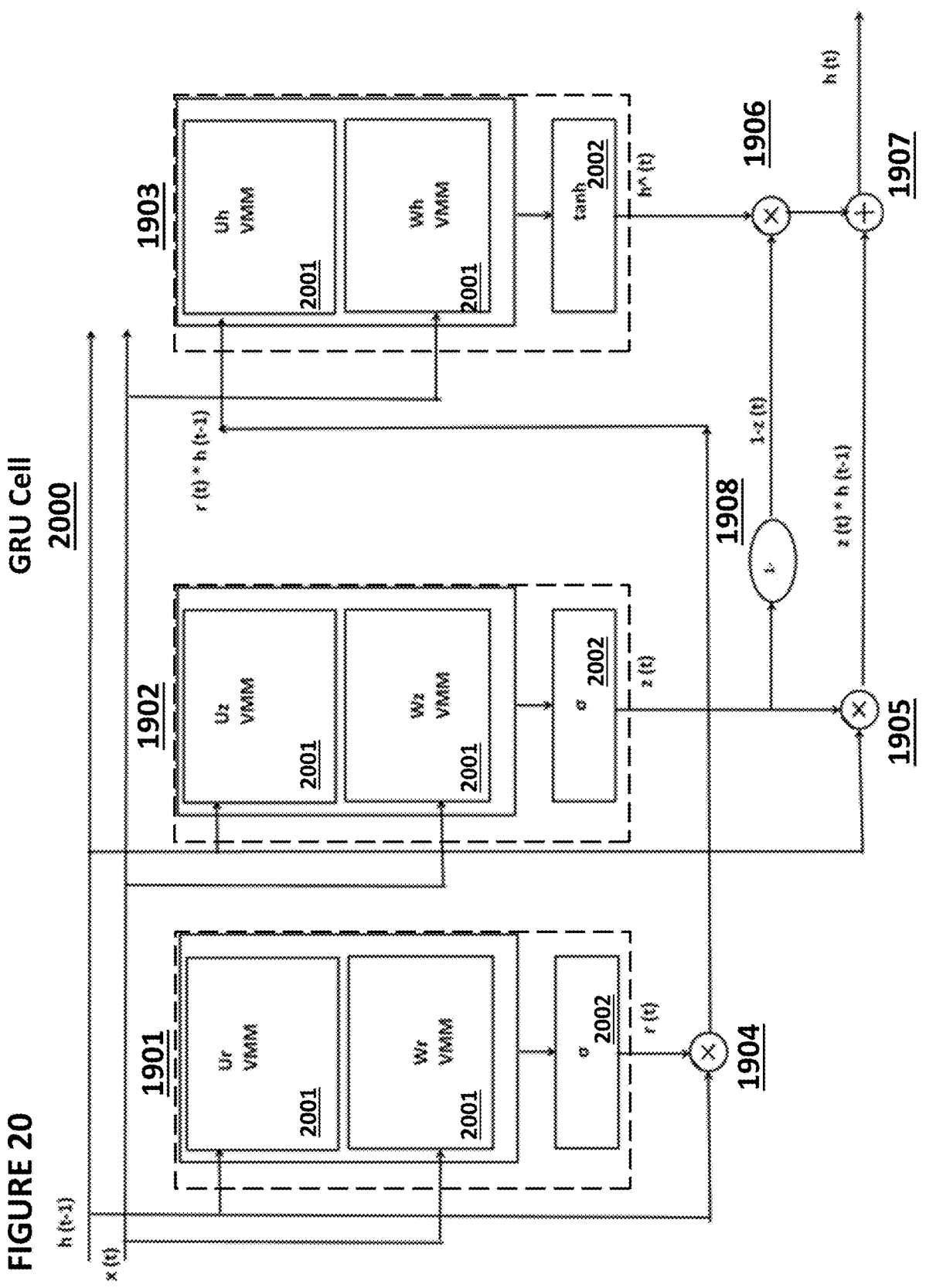
FIG. 20 depicts an example implementation of the cell of FIG. 19.
Figure 21:
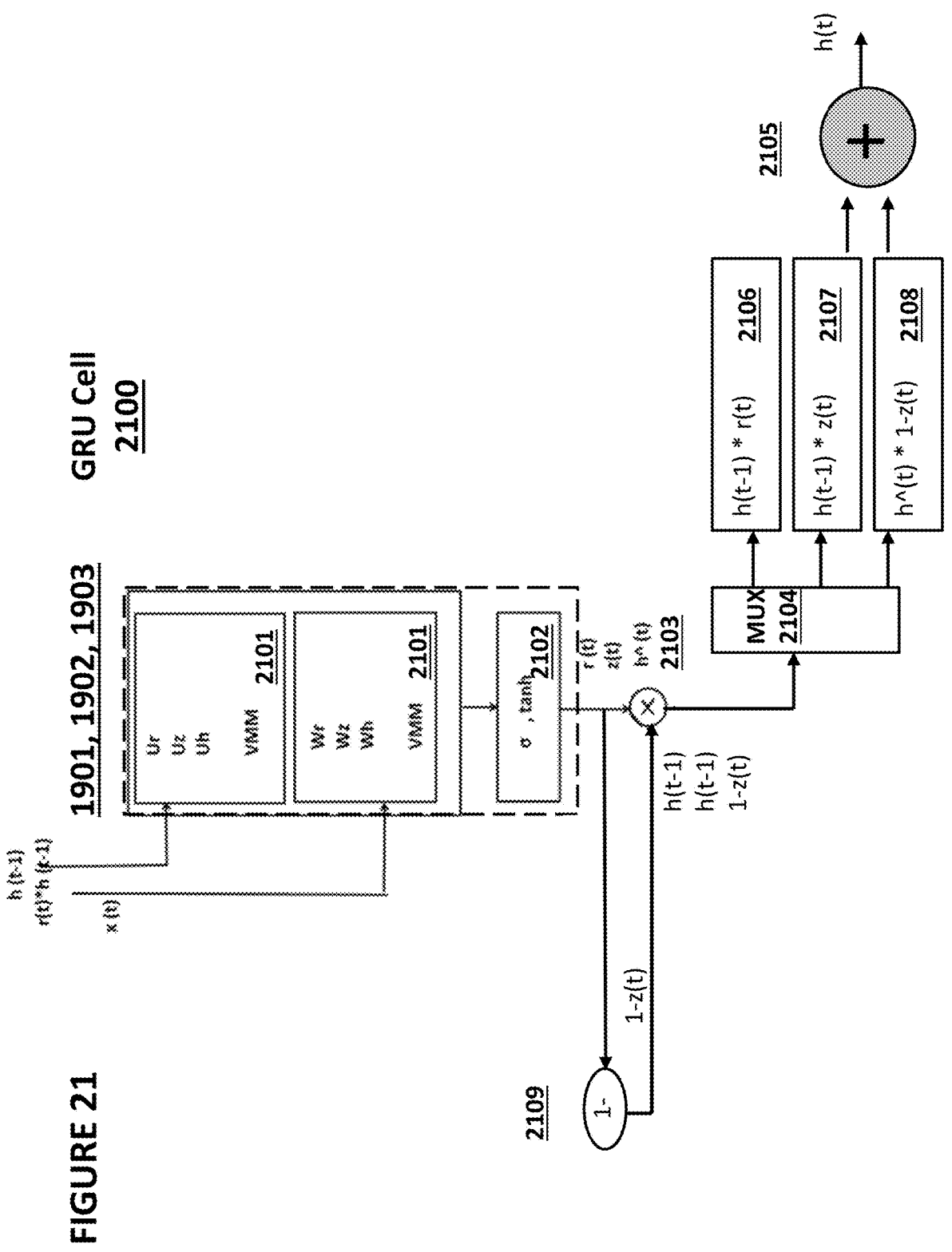
FIG. 21 depicts another example implementation of the cell of FIG. 19.
Figure 22:
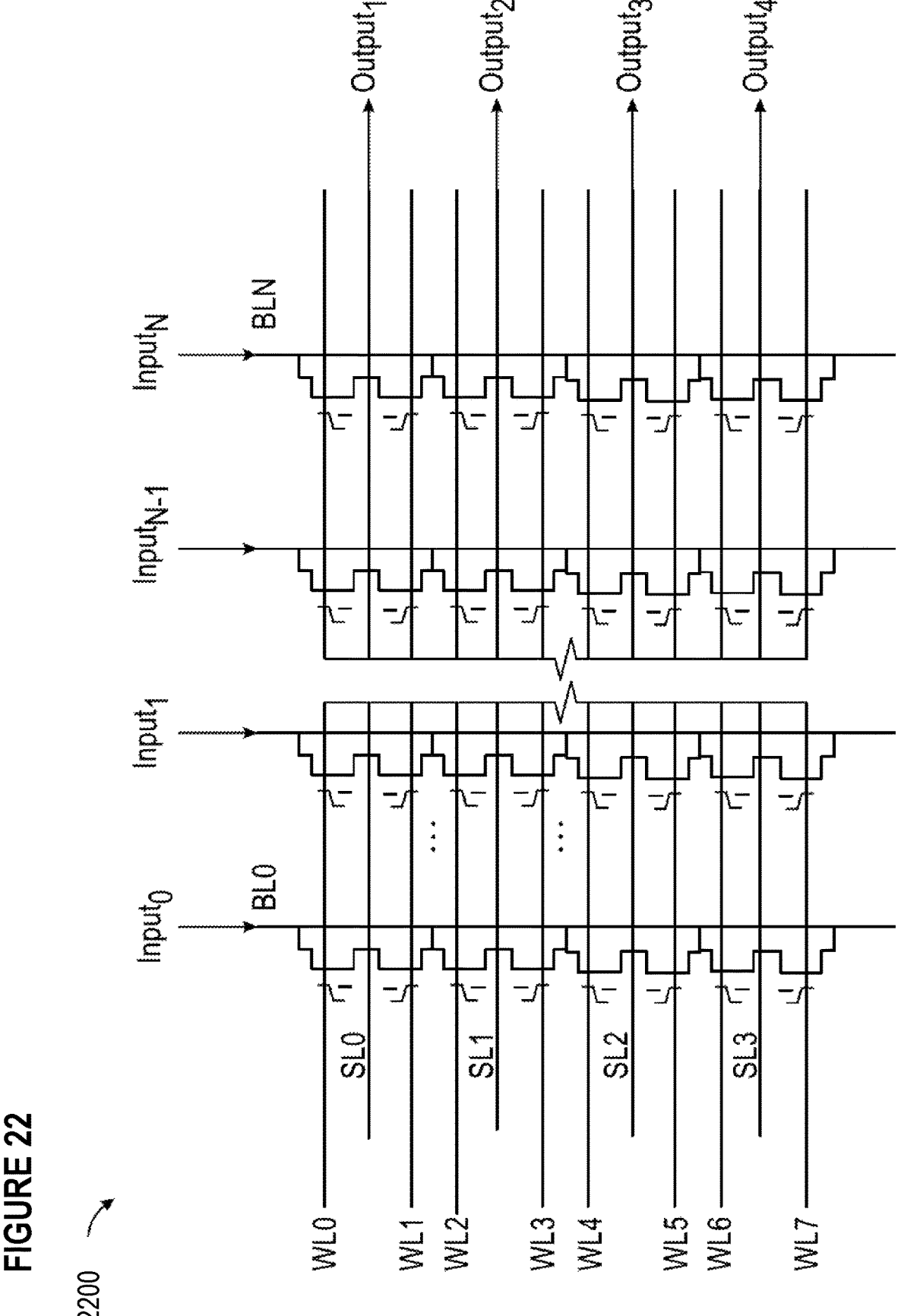
FIG. 22 depicts another example of a vector-by-matrix multiplication system.
Figure 24:
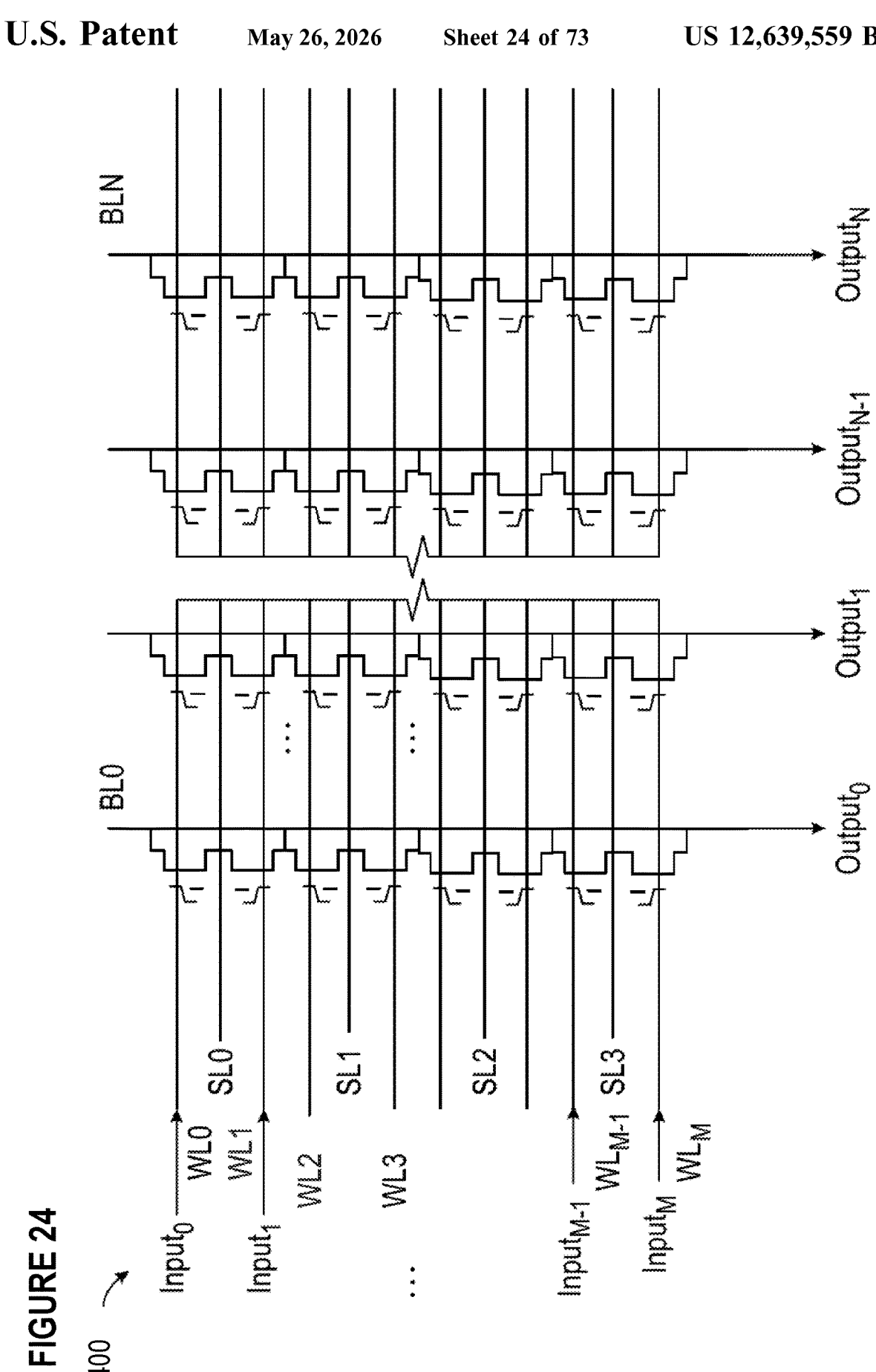
FIG. 24 depicts another example of a vector-by-matrix multiplication system.
Figure 25:
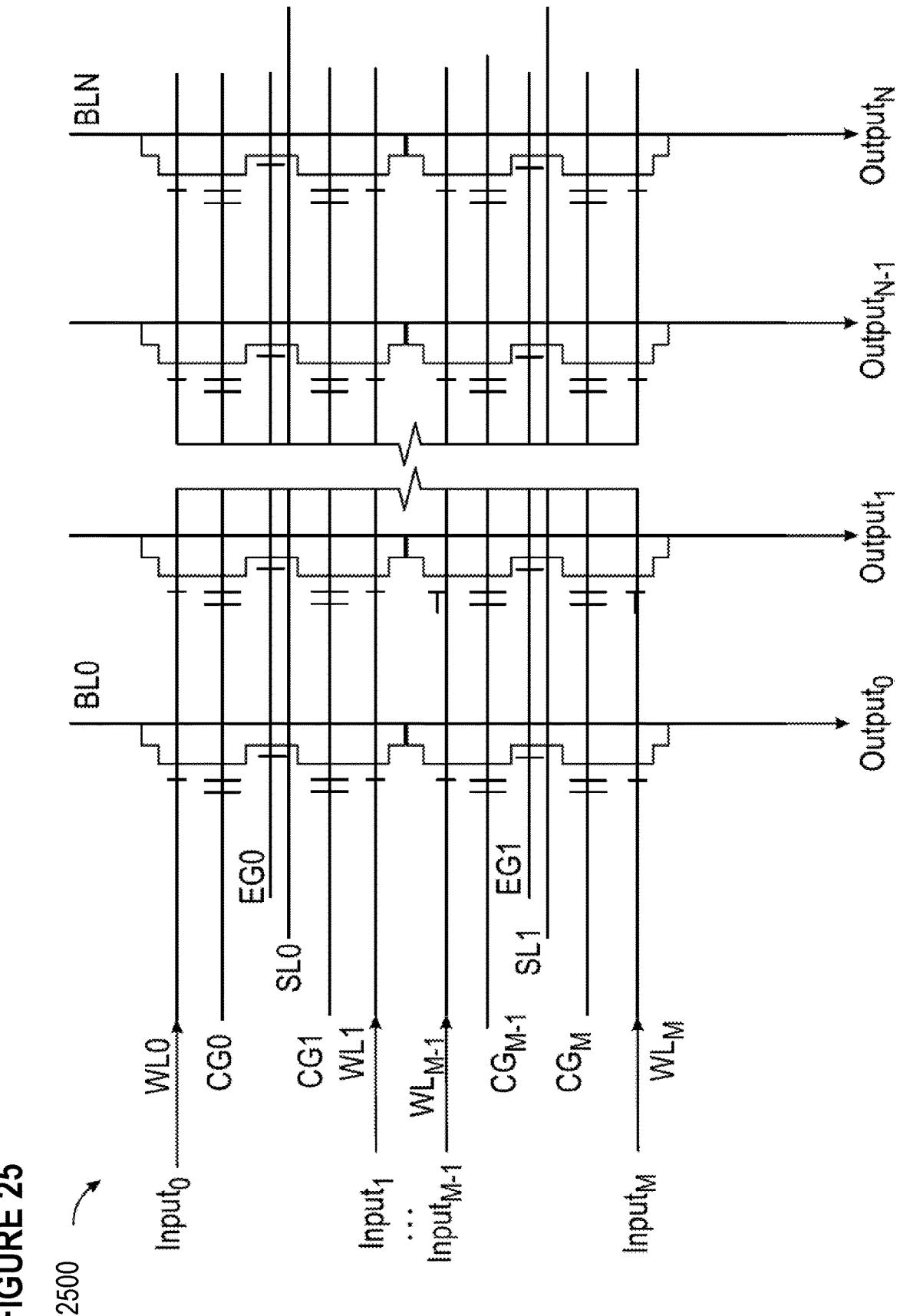
FIG. 25 depicts another example of a vector-by-matrix multiplication system.
Figure 26:
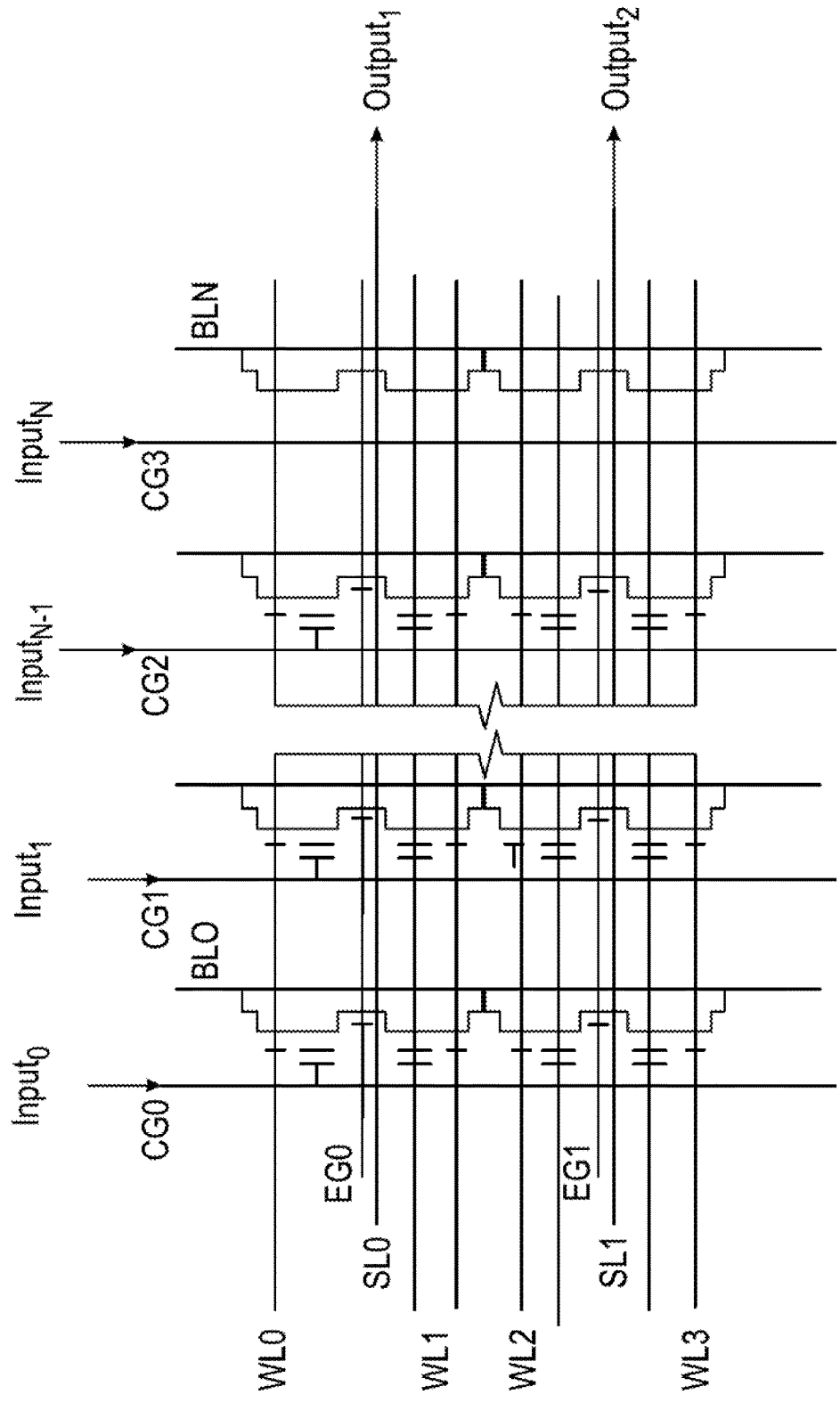
FIG. 26 depicts another example of a vector-by-matrix multiplication system.
Figure 27:
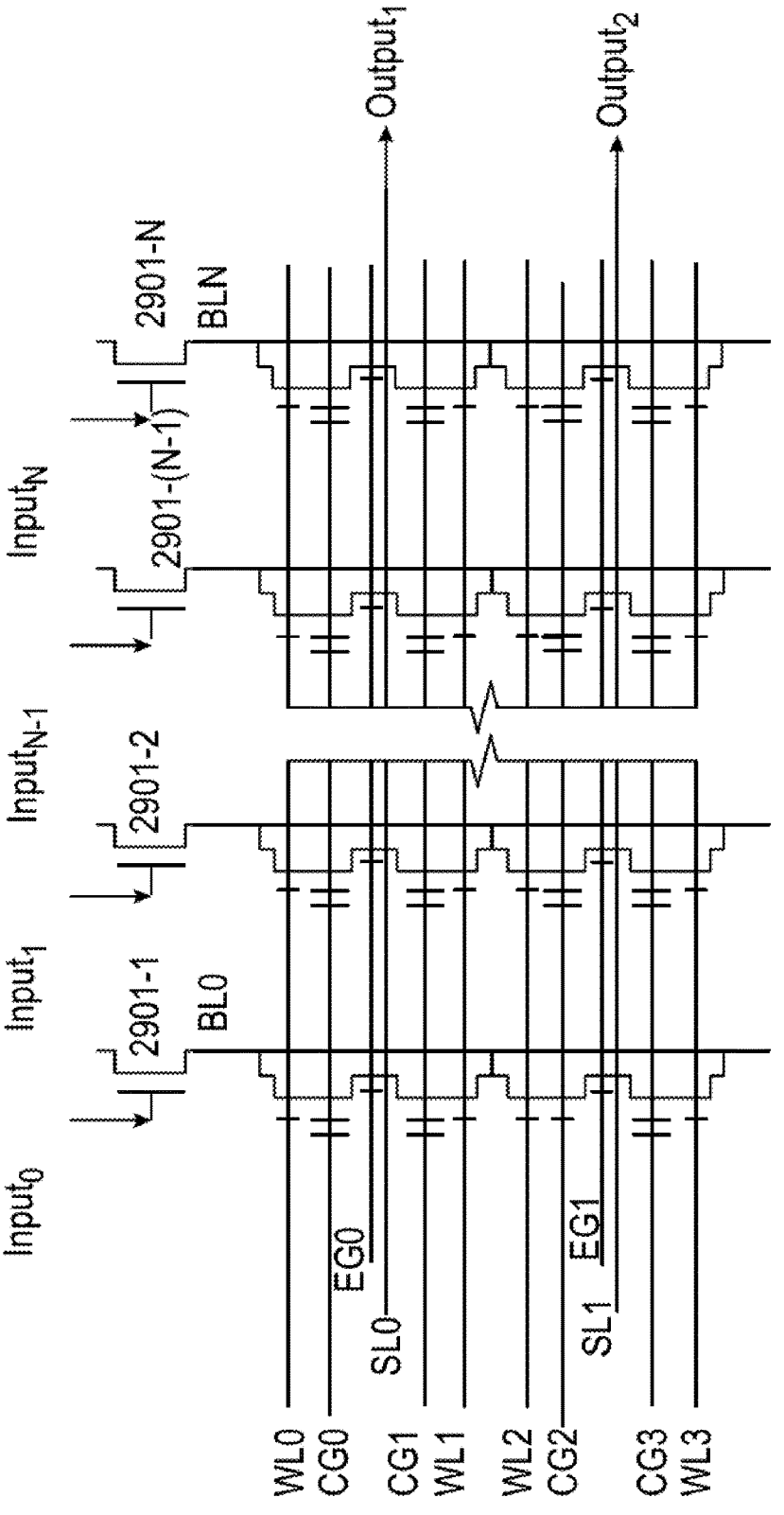
FIG. 27 depicts another example of a vector-by-matrix multiplication system.
Figure 28:
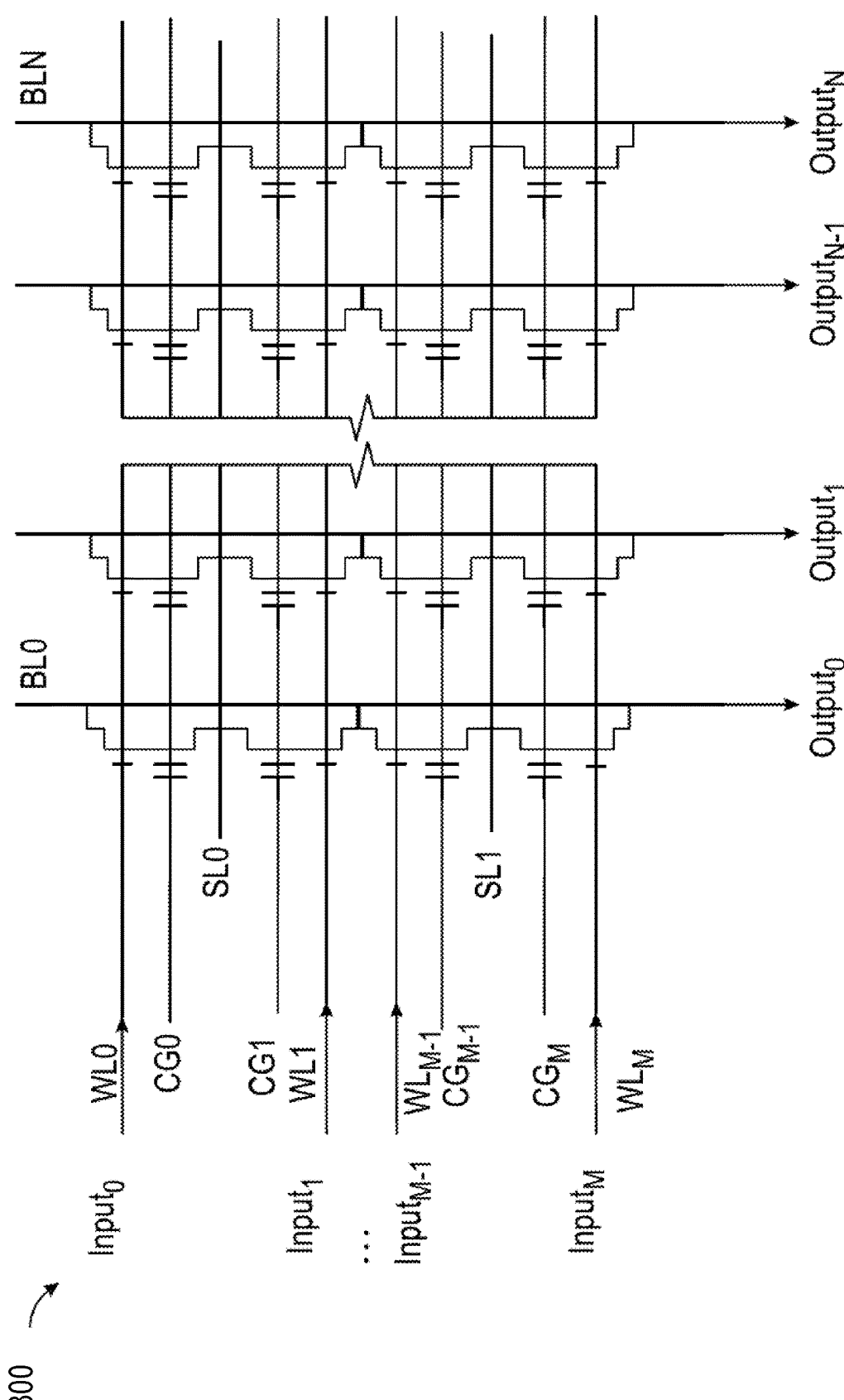
FIG. 28 depicts another example of a vector-by-matrix multiplication system.
Figure 29:
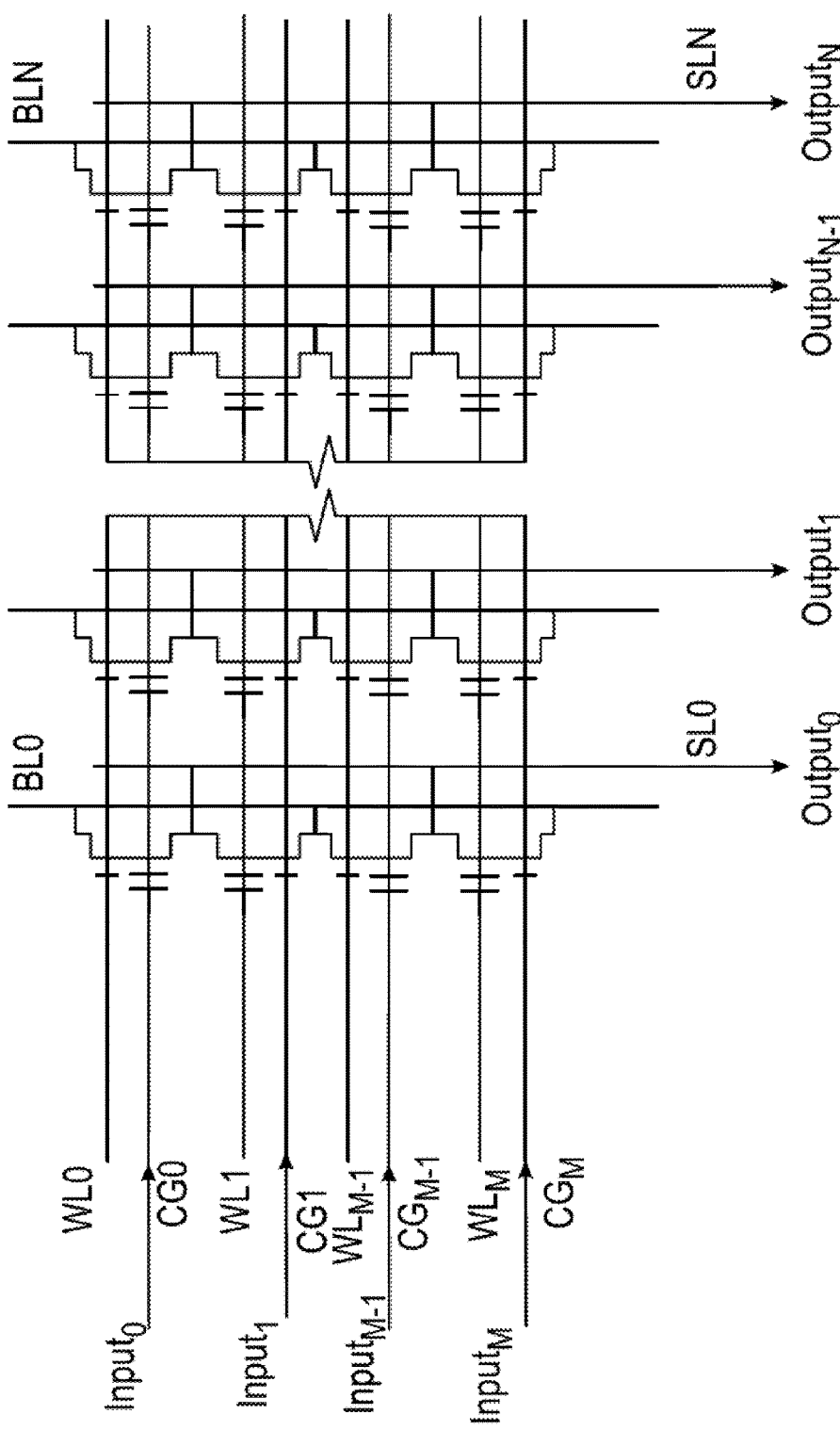
FIG. 29 depicts another example of a vector-by-matrix multiplication system.
Figure 30:
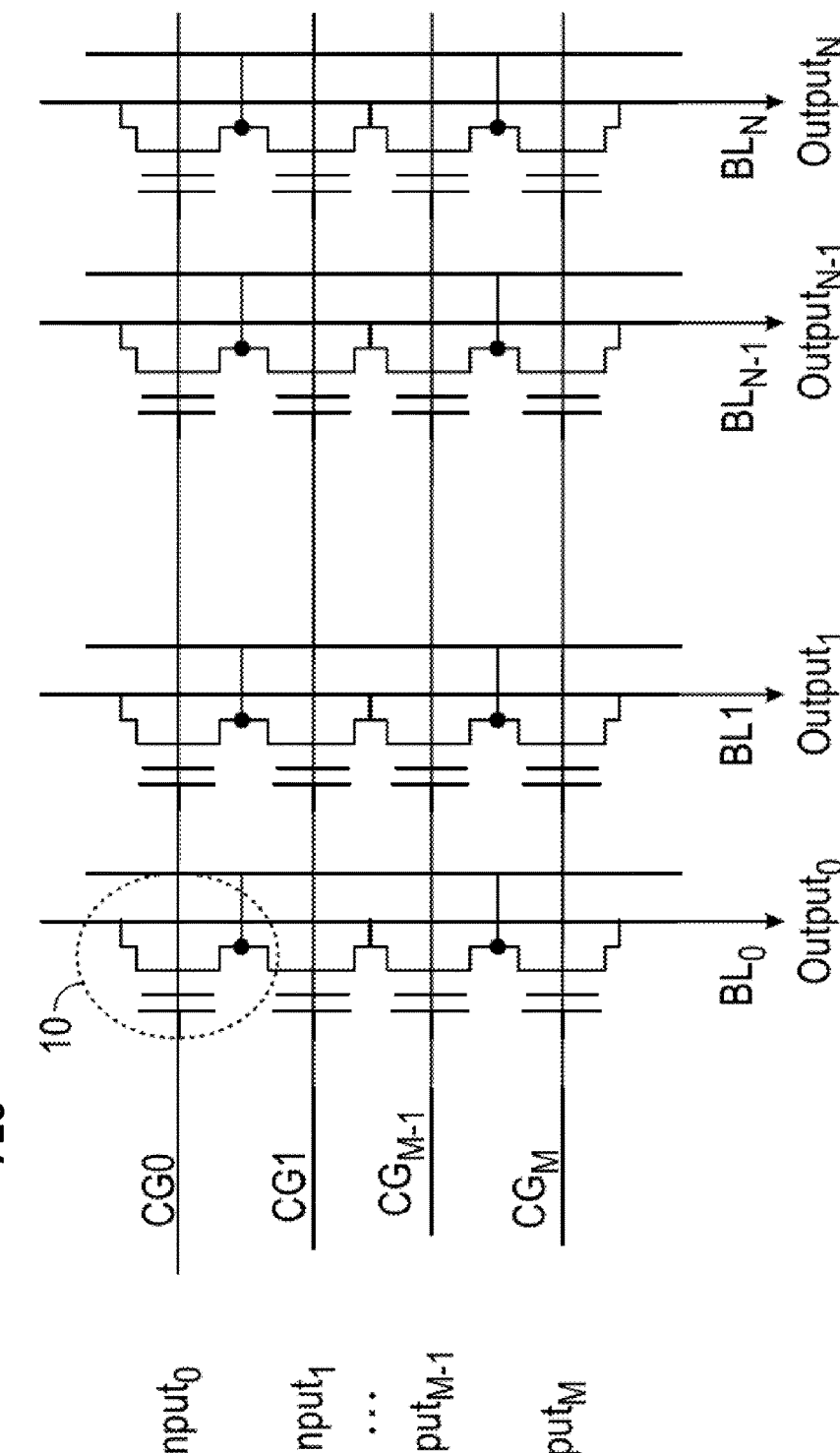
FIG. 30 depicts another example of a vector-by-matrix multiplication system.
Figure 31:
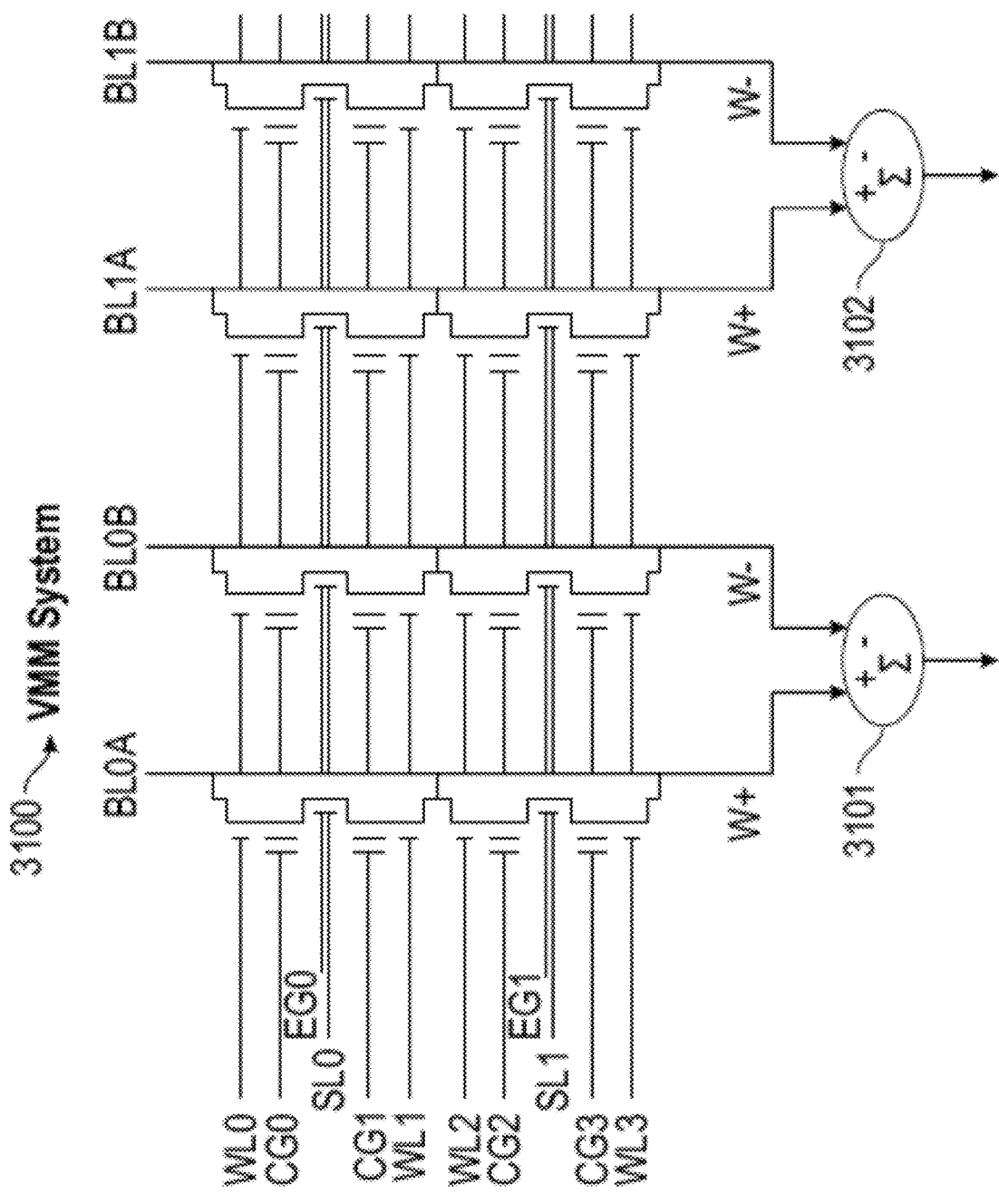
FIG. 31 depicts another example of a vector-by-matrix multiplication system.
Figure 32:
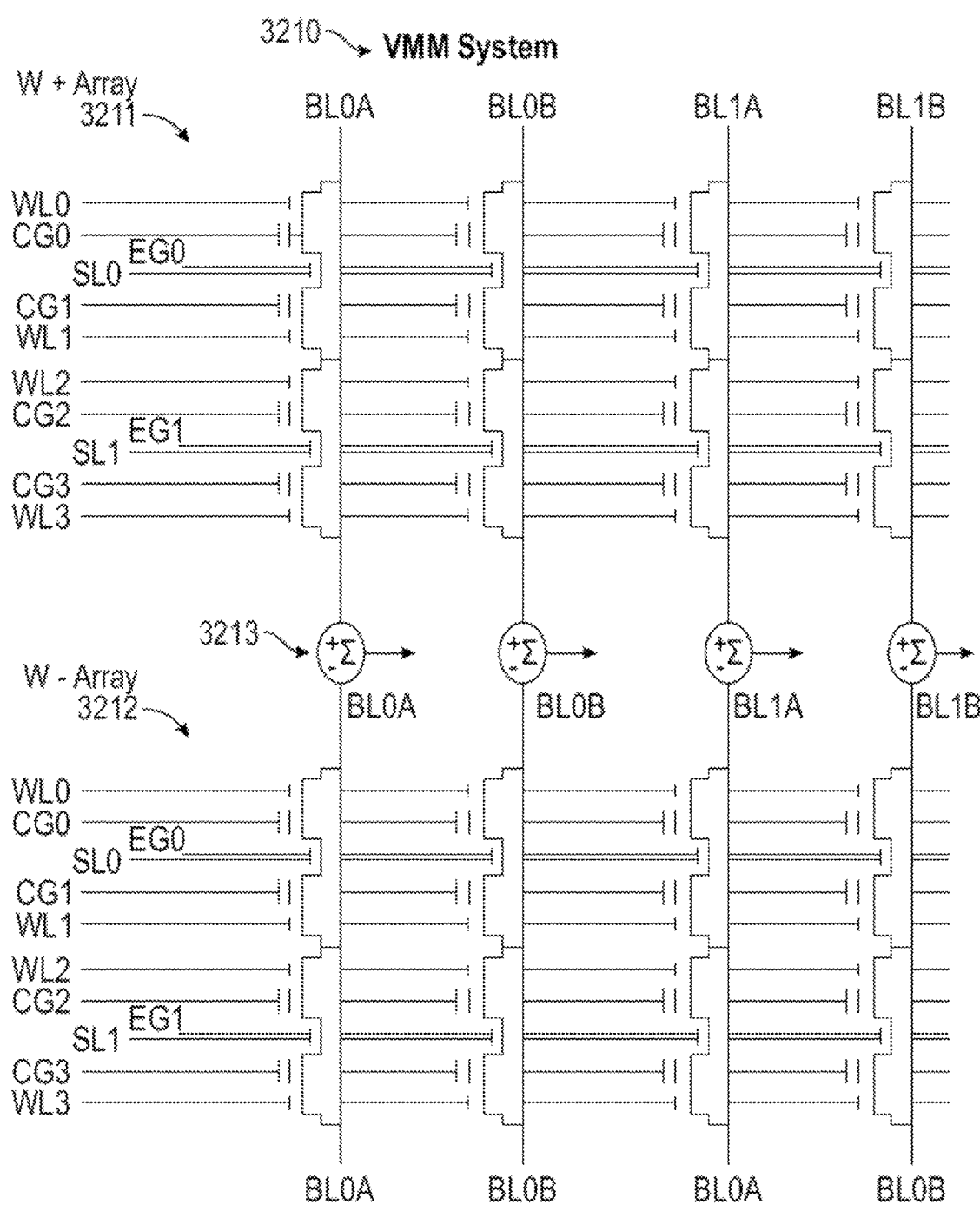
FIG. 32 depicts another example of a vector-by-matrix multiplication system.
Figure 33:
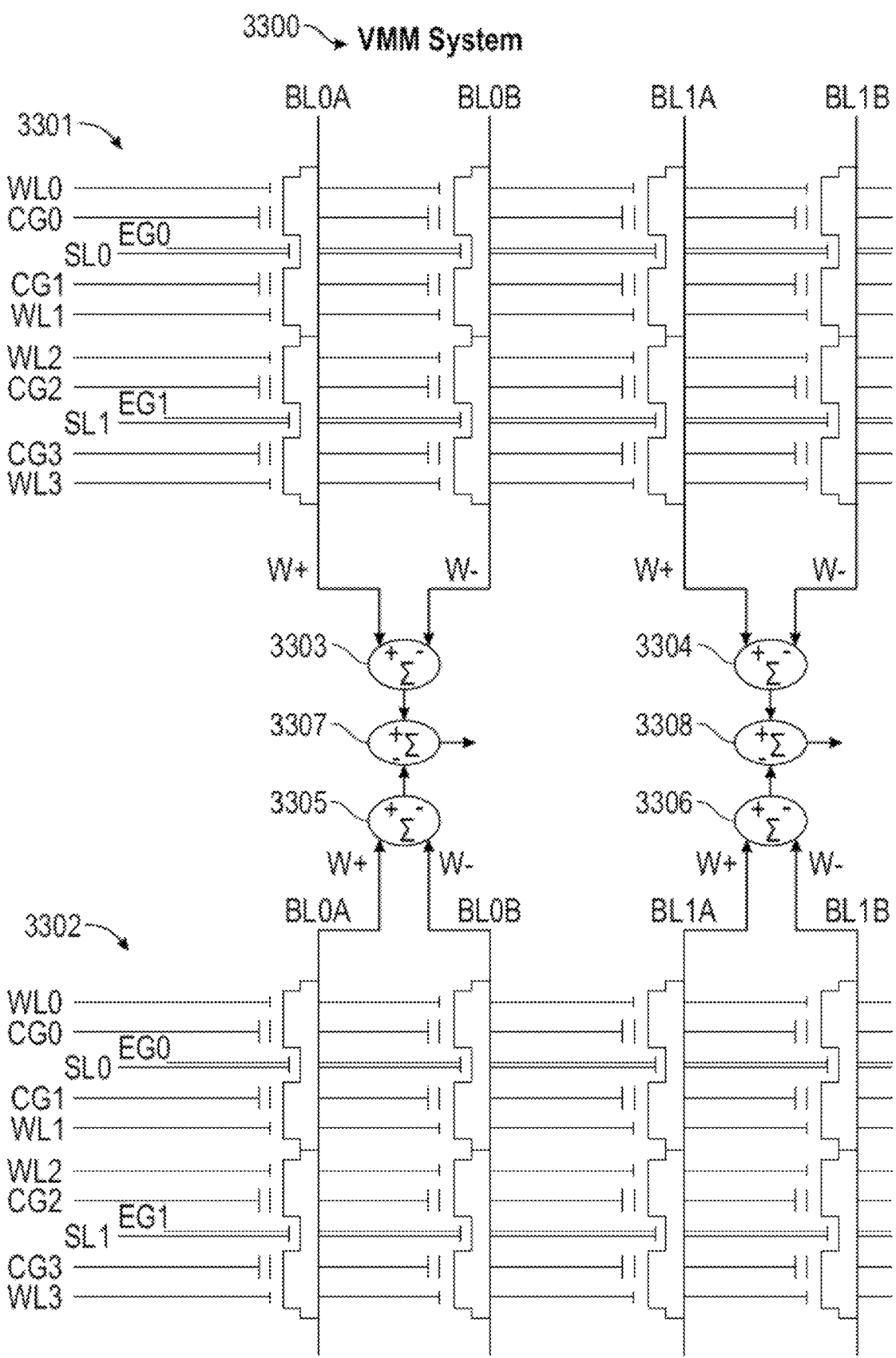
FIG. 33 depicts another example of a vector-by-matrix multiplication system.
Figure 34:
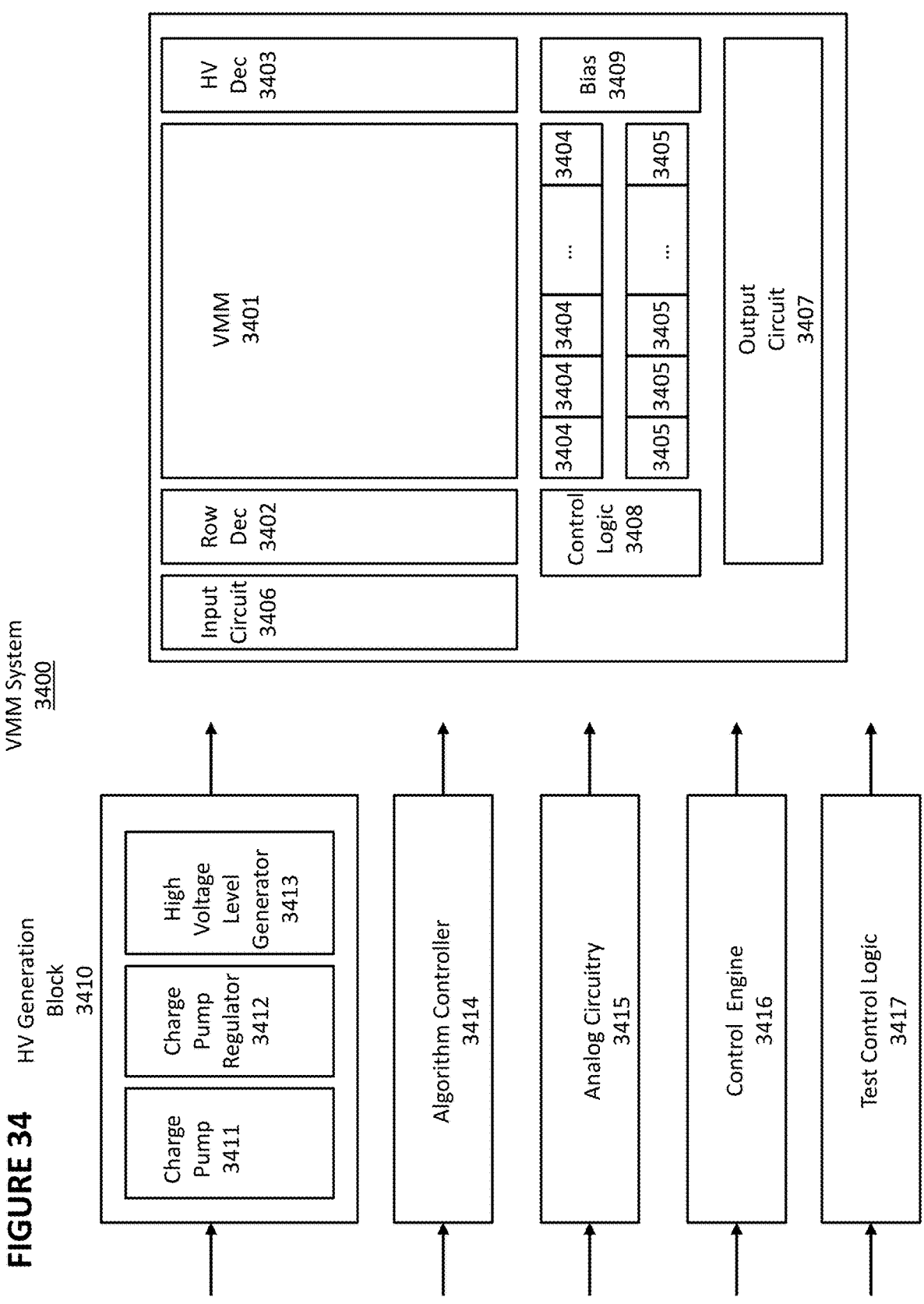
FIG. 34 depicts another example of a vector-by-matrix multiplication system.

FIG. 34 depicts a block diagram of an example VMM system 3400. VMM system 3400 comprises VMM array 3401, row decoder 3402, high voltage decoder 3403, column decoders 3404, bitline drivers 3405, input circuit 3406, output circuit 3407, control logic 3408, and bias generator 3409. VMM system 3400 further comprises high voltage generation block 3410, which comprises charge pump 3411, charge pump regulator 3412, and high voltage analog precision level generator 3413. VMM system 3400 further comprises (program/erase, or weight tuning) algorithm controller 3414, analog circuitry 3415, control engine 3416 (that may include functions such as arithmetic functions, activation functions, embedded microcontroller logic, without limitation), and test control logic 3417. The systems and methods described below can be implemented in VMM system 3400.

The input circuit 3406 may include circuits such as a DAC (digital to analog converter), DPC (digital to pulses converter, digital to time modulated pulse converter), AAC (analog to analog converter, such as a current to voltage converter, logarithmic converter), PAC (pulse to analog level converter), or any other type of converters. The input circuit 3406 may implement normalization, linear or non-linear up/down scaling functions, or arithmetic functions. The input circuit 3406 may implement a temperature compensation function for input levels. The input circuit 3406 may implement an activation function such as ReLU or sigmoid. The output circuit 3407 may include circuits such as an ADC (analog to digital converter, to convert neuron analog output to digital bits), AAC (analog to analog converter, such as a current to voltage converter, logarithmic converter), APC (analog to pulse(s) converter, analog to time modulated pulse converter), or any other type of converters. The output circuit 3407 may implement an activation function such as rectified linear activation function (ReLU) or sigmoid. The output circuit 3407 may implement statistic normalization, regularization, up/down scaling/gain functions, statistical rounding, or arithmetic functions (e.g., add, subtract, divide, multiply, shift, log) for neuron outputs. The output circuit 3407 may implement a temperature compensation function for neuron outputs or array outputs (such as bitline output) so as to keep power consumption of the array approximately constant or to improve precision of the array (neuron) outputs such as by keeping the IV slope approximately the same.

Two approaches for performing real-time calibration are described herein. First, an approach that uses approximation is disclosed (shown in FIGS. 35 and 36), where an average I-V dataset is assumed based on data accumulated from actual arrays or sampled arrays or reference arrays. Second, an approach that uses learning behavior (shown in FIG. 37) is disclosed, where parameters are adapted for network performance.

FIG. 35 depicts an example calibration method 3500 for calibrating VMM system 3400.

First, one or more electrical parameters are adjusted and applied to memory cells, memory arrays, or peripheral circuits (operation 3501). If this is the first instance of operation 3501 being performed, then initial values are used for the electrical parameters. If this is the second or later instance of operation 3501 being performed, then any adjusted electrical parameters that were determined in operation 3503 (discussed below) are applied.

Examples of electrical parameters that can be varied at the memory cell level include: the resolution of the weight stored in the cell (altering n, where n is the bit resolution of the cell) (e.g., using a smaller n leads to better accuracy control); the maximum cell current (Icell max) and/or the minimum cell current (Icell min) that can be drawn by the cell (e.g., a lower Icell max results in lower power, and a higher Icell min results in improved baseline noise tolerance); cell I-V slope (for example, slope to achieve a certain performance metric); and cell temperature behavior and an associated compensation scheme (such as adjusting a bias voltage when temperature changes); without limitation.

Examples of electrical parameters that can be varied at the memory array level include: number of allowed defects (stuck '1' or '0', bad rows or bad columns); allowed noise floor (such as from thermal noise or popcorn or flicker noise before replacing with redundant cells/array portions or disabling certain cells/array portions from usage); number of banks (with M rows and N columns); write I/O width (number of cells written in parallel; this is for example traded off versus IRdrop, i.e. voltage drop, from operating current); number of rows sharing a source line; sector size (number of rows and columns, this is for example a trade-off of area versus a disturb due to sharing of the same high voltage lines); array bias conditions (such as bias on bitline, wordline, control gate, erase gate); without limitation.

Examples of electrical parameters that can be varied at the peripheral circuit level include: resistance, capacitance, or another variable characteristic in an output neuron circuit; the degree of scaling performed on the output; the bit resolution of a digital output generated from the neuron output; offset calibration; trading off between power and speed; multiplexing for digital-to-analog converters, analog-to-digital converters, or activation circuits (how many are needed per VMM array, latency and throughput tradeoff vs. area); without limitation. Circuits such as normalization circuits or shaping circuits are further examples of peripheral circuits.

Second, a performance target check is performed (operation 3502). This can include, for example, checking whether a neuron current (bitline current from an array) or an averaged neuron current (where a neuron current and an averaged neuron current are examples of determined values) meets a target current (a predetermined threshold) at a certain temperature, or checking whether neuron current or averaged neuron current meets a predetermined threshold after activation. The performance target can relate to target neuron value, circuit accuracy, power, or latency. If the performance target (a predetermined threshold) is achieved, calibration method 3500 proceeds to operation 3506 and is complete. If not, the method proceeds to the next operation 3503.

In operation 3503, the applied electrical parameters are adjusted (operation 3503).

In operation 3504, the system determines if the applied electrical parameters are within a predetermined range, such within the range corresponding to the tolerance of a component or system. If yes, then operations 3501, 3502, 3503, and 3504 are repeated. If not, then the network circuit is deemed bad (as this would signify that the electrical parameter has now been adjusted beyond an acceptable amount) and is not used (operation 3505). For example, this may be the result of a bad die.

Optionally, method 3500 can be performed in real-time during operation of VMM system 3400, which will be useful, for example, to calibrate the parameters as the operating temperature of VMM system 3400 changes.

Figure 36:
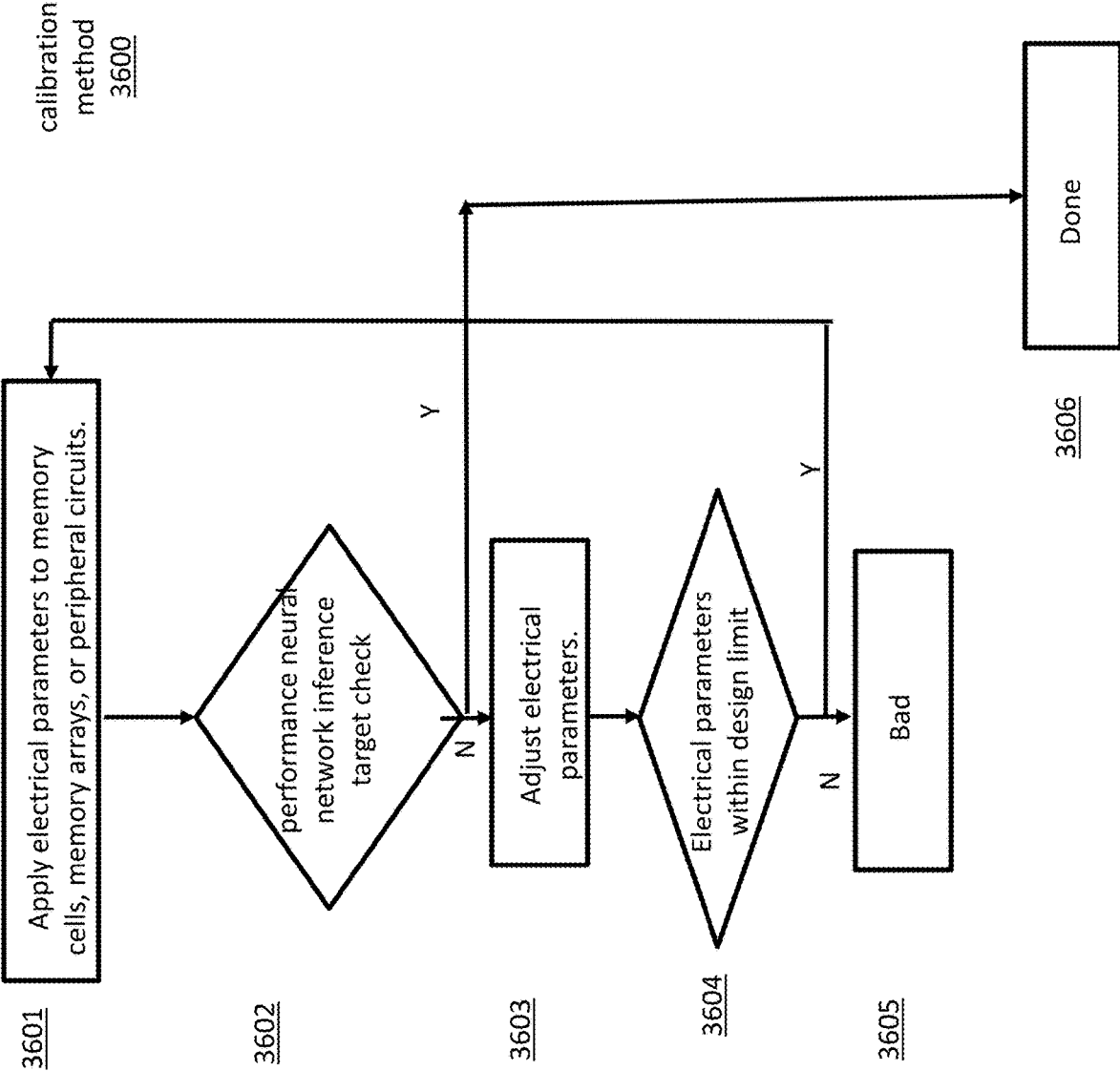
FIG. 36 depicts another example calibration method.

FIG. 36 depicts example calibration method 3600 for calibrating VMM system 3400. Calibration method 3600 utilizes neural network inferences. The neural network for generating such inferences can be any known type of neural network, such as a multilayer perceptron (MLP), Convolutional Neural Network (CNN) (e.g., Residual Networks, ResNet-x), recurrent neural network (RNN) (e.g., long short-term memory, LSTM), and others.

First, electrical parameters are applied (operation 3601). If this is the first instance of operation 3601 being performed, then initial values are used for the electrical parameters. If this is the second or later instance of operation 3601 being performed, then any adjusted electrical parameters that were determined in operation 3603 (discussed below) are applied. The parameters can be the same as the parameters described previously with respect to operation 3501 in calibration method 3500.

Second, a performance neural network inference target check is performed (operation 3602). This can comprise, for example, recognizing a digit for Modified National Institute of Standards and Technology (MNIST) or classifying an image for ImageNet. If the target is achieved, calibration method 3600 proceeds to operation 3606 and is complete. If not, the method proceeds to the next operation.

In operation 3603, the applied electrical parameters are adjusted.

Next, the system determines if the applied electrical parameters are within a predetermined range, such within the range corresponding to the tolerance of a component or system (operation 3604). If yes, then operations 3601, 3602, 3604, and 3604 are repeated. If not, then the network circuit is deemed bad (as this would signify that the electrical parameter has now been adjusted beyond an acceptable amount) and is not used (operation 3605). For example, this may be the result of a bad die.

Optionally, method 3600 can be performed in real-time during operation of VMM system 3400, which will be useful, for example, to calibrate the parameters as the operating temperature of VMM system 3400 changes.

FIG. 37 depicts an example calibration method 3700 for calibrating VMM system 3400. Calibration method 3700 utilizes machine learning.

First, a machine learning model set is generated by applying a range of electrical parameters, such as bias voltages, to a first non-volatile memory system (e.g., VMM system 3400), measuring resulting characteristics, such as neuron current or averaged neuron current, and comparing the measured resulting characteristics to a predetermined target range. (operation 3701). These parameters can be the same as the parameters described previously with respect to operation 3501 in calibration method 3500.

Second, during operation of the first non-volatile memory system or a second non-volatile memory system (e.g., another instance of VMM system 3400), determining electrical parameters to apply to memory cells, memory arrays, and peripheral circuits using the machine learning model (operation 3702).

Figure 38:
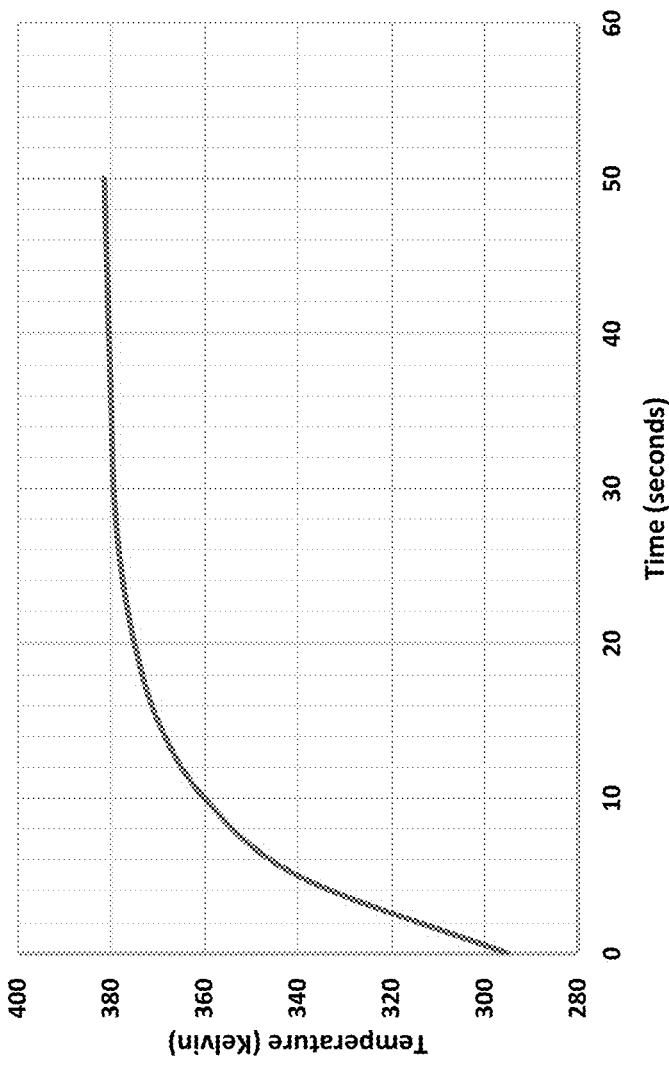
FIG. 38 depicts a graph showing typical changes in operation temperature of a vector-by-matrix multiplication system over time.

FIG. 38 provides an example that shows how quickly an electrical parameter can change during operation as a function of temperature. FIG. 38 depicts a silicon thermal conductivity rate for a uniform wafer, which is the amount of time it takes to change the temperature of a uniform silicon wafer to a particular temperature. This rate can be affected by a variety of factors including local power consumption within the silicon. Based on this graph, the rate is about 100 ms for each 1-degree change. This means that an electrical parameter which is affected by temperature may need adjustment every 100 ms during operation.

Figure 39:
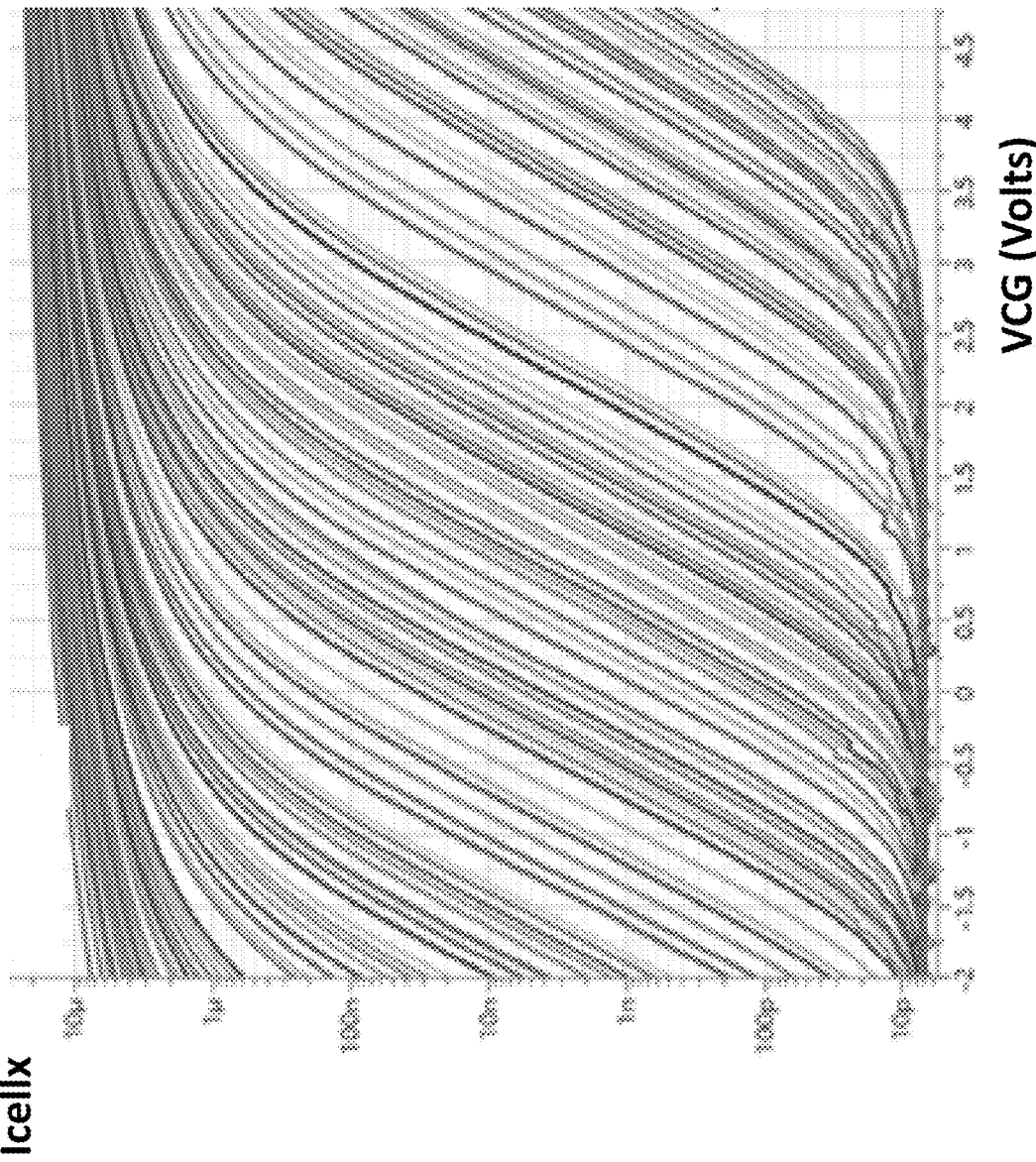
FIG. 39 depicts current-voltage characteristics for various non-volatile memory cells storing various values in various operating temperatures.

FIG. 39 provides an example of variation among different memory cells in VMM system 3400. FIG. 39 depicts current-voltage data (which shows I-V slope) for a plurality of memory cells when each cell is operating in the sub threshold region. The current is the current, Icell, drawn by a cell when a voltage, VCG, is applied to the control gate of the cell. As can be seen, I-V slope can vary for each value of VCG. The specific I-V slope for each cell is affected by the intrinsic characteristics of the cell and can vary based on the value, W, stored in the cell, as well as based on the operating temperature of the cell. It also varies based on the physical dimensions or electrical parameters of the cell, due to such variation in mask alignment or process steps (such as etching variation) or process implants.

Figure 40:
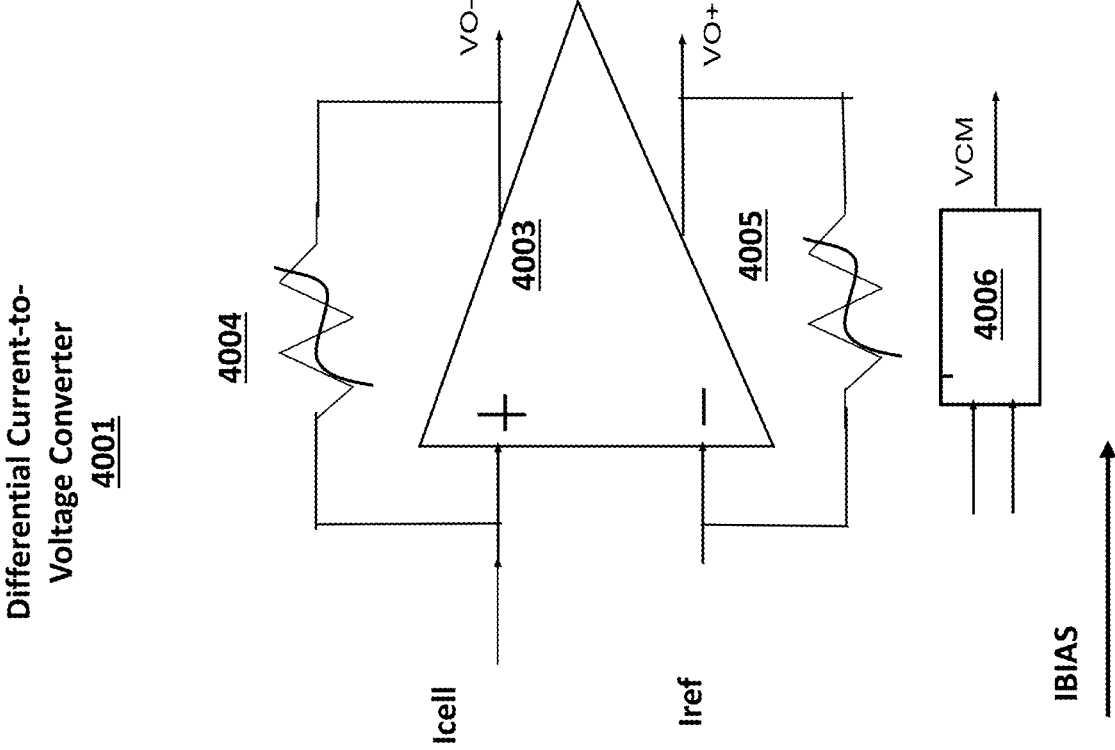
FIG. 40 depicts a differential current-to-voltage converter.

FIG. 40 depicts differential current-to-voltage converter 4001. Differential current-to-voltage converter 4001 comprises operational amplifier 4003; variable integrating resistors 4004 and 4005; and common mode circuit 4006 (which is used for a differential amplifier implementation of operational amplifier 4003). Differential current-to-voltage converter 4001 converts two current inputs, IBL+ and IBL−, into differential output voltages, VO+ and VO−, where the output voltages are proportional to the resistance of variable resistors 4004 and 4005.

Input currents IBL+ and IBL− optionally are currents representing a positive weight and a negative weight. For example, IBL+ can be a current, Iw+ from a single cell or a bitline current that is the sum of currents from a plurality of w+ cells coupled to the bit line, and IBL− can be a current, Iw−, from a single cell or a bit line current that is the sum of currents from a plurality of w− cells coupled to the bit line. Such positive weights and negative weights can be used in a neural network to present a weight (W=W+−W−). In another example, the two input currents, IBL+ and IBL−, can represent a cell current or bitline current from the array and a reference current.

Figure 41:
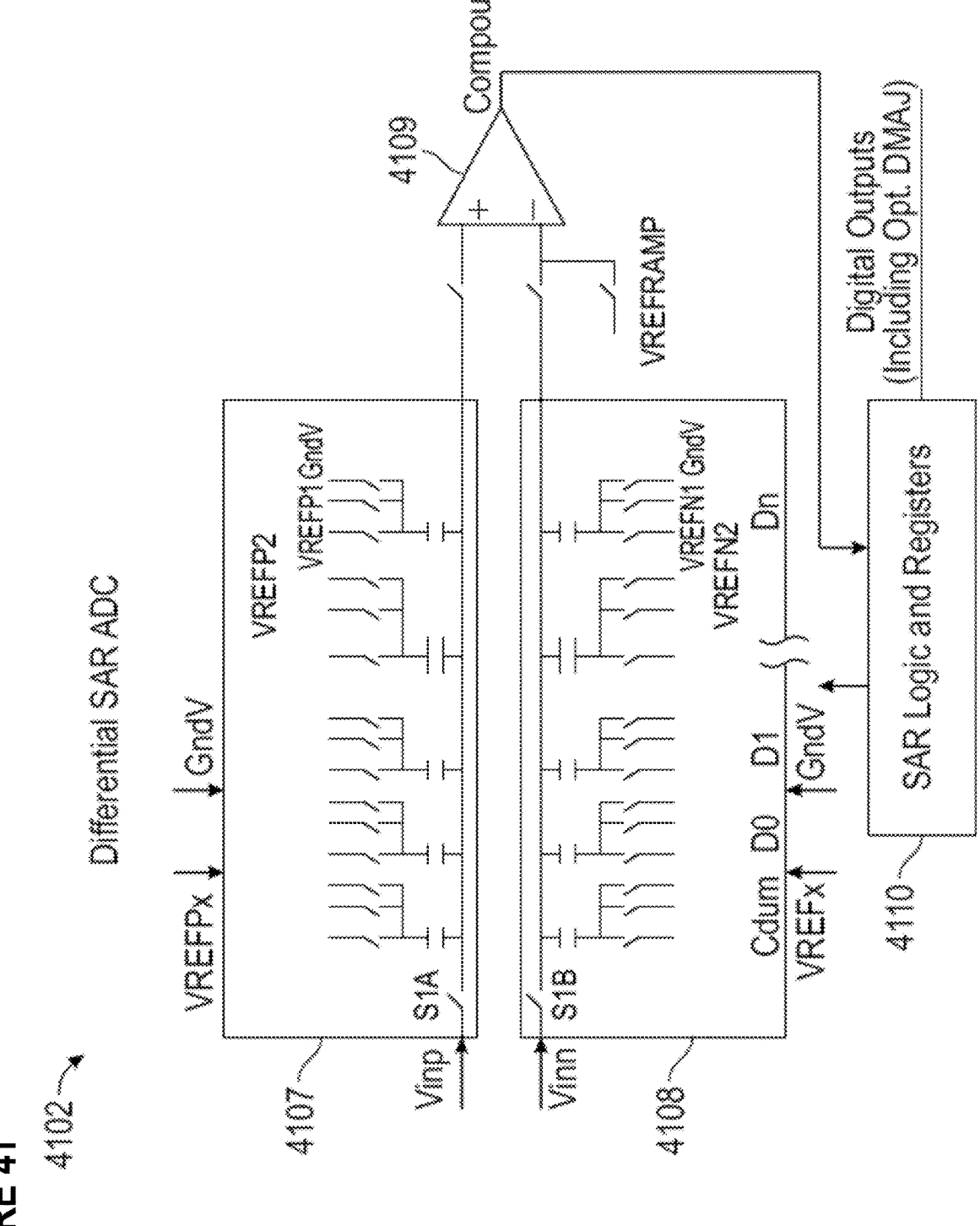
FIG. 41 depicts a differential successive address register analog-to-digital converter.

FIG. 41 depicts differential successive address register (SAR) analog-to-digital converter (ADC) 4102.

Differential successive address register analog-to-digital converter 4102 converts an analog input or differential analog input into a digital output using a binary search through all possible quantization levels to identify the appropriate digital output.

Differential successive address register analog-to-digital converter 4102 comprises binary capacitive digital-to-analog converter (CDAC) 4107, binary CDAC 4108 (complementary to CDAC 4107), comparator 4109, and SAR logic and registers 4110.

Differential successive address register analog-to-digital converter 4102 receives a differential current input, Vinp and Vinn. SAR logic and registers 4110 cycle through all possible digital bit combinations, which in turn control switches in CDAC 4107 and 4108 to couple voltage sources to capacitors. When the output of comparator 4109 flips, then the digital bit combination in SAR logic and registers 4110 is output as Digital Outputs. Optionally, SAR logic and registers 4110 generates an additional 1-bit digital output, DMAJ, in Digital Outputs which is a "1" if a majority of the bits in the digital value are a "1", and a "0" if a majority of the bits in the corresponding digital value are not "1."

FIG. 42 depicts example read circuit 4200 that implements offset calibration for performing a read operation on one or more bit lines in a VMM array, such as VMM array 3401 in FIG. 34. Read circuit 4200 comprises comparator 4201, offset calibration capacitor digital-to-analog converter 4202, offset calibration capacitor digital-to-analog converter 4203, and calibration controller 4204. Calibration controller 4204 enables various capacitors in offset calibration capacitor digital-to-analog converter 4202 and offset calibration capacitor digital-to-analog converter 4203 by closing or opening the various switches labeled en and enb to compensate for the offset generated due to temperature variation as illustrated in FIG. 39.

The electrical parameters for learning during the calibration or training processes of FIGS. 35 and 36 for the circuits of FIGS. 40 and 41 include the degree of bit resolution (such as 4-bit, 5-bit or 8-bit resolution), the degree of neuron scaling (such as magnitude of the scaling factor, e.g., 4× to 256×), the degree of power consumption due to bias current (such as higher bias current means more power and faster speed), and the amount of offset added for temperature compensation (higher offset value added meaning more accuracy at the expense of more circuit complexity).

Figure 43:
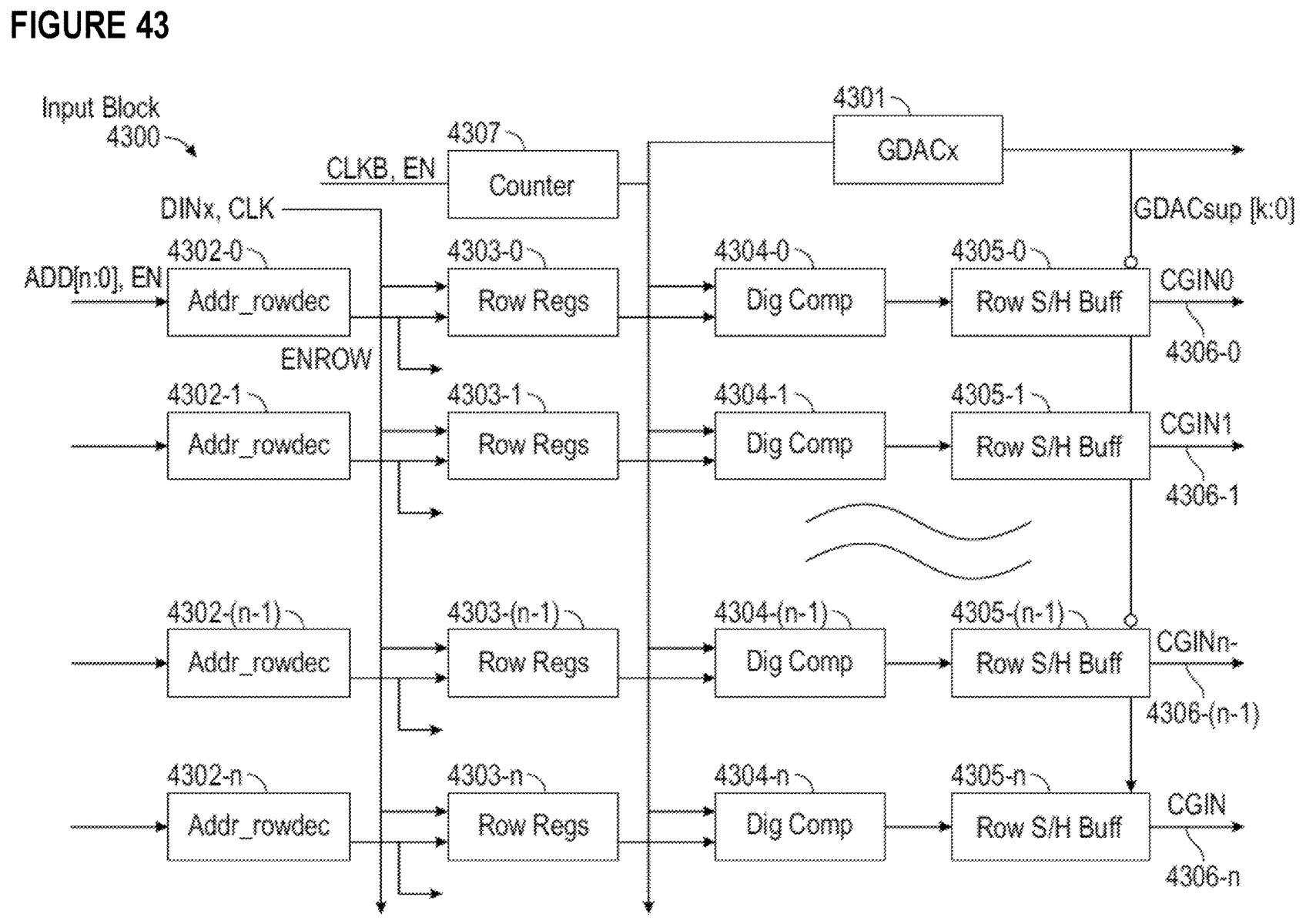

FIG. 43 depicts example input block 4300 to be used to provide inputs to a VMM array, such as VMM array 3401 in FIG. 34. Input block 4300 comprises global digital-to-analog converter (DAC) 4301; address row decoders 4302-0 to 4302-n, each corresponding to one of the rows numbered 0 through n in the VMM array; row registers 4303-0 through 4303-n, each corresponding to one of the rows numbered 0 through n in the VMM array; digital comparator blocks 4304-0 through 4304-n, each corresponding to one of the rows numbered 0 through n in the VMM array; row sample-and-hold (S/H) buffers 4305-0 through 4305-n, each corresponding to one of the rows numbered 0 through n in the VMM array; output signals 4306-0 through 4306-n, each corresponding to one of the rows numbered 0 through n in the VMM array, and counter 4307.

Address row decoders 4302-0 to 4302-n receive a row address, ADD[n:0], and an enable signal, EN. The output of each address row decoder, denoted ENROW, is high when ADD[n:0] is the address for that particular row and when EN is asserted. Row registers 4303-0 through 4303-n are loaded with respective digital input bits DINx (where x is the number of bits, such as 8 or 16 bits) for that particular row, where the loading operation is triggered by a clock signal, CLK, where DINx is the activation input for that particular row. To perform the vector-by-multiplication matrix operation. When the output of a particular address row decoder 4302 is high, the associated row register 4303 will be enabled and will output its digital bits, DINx. Counter 4307 counts the pulses in another clock signal, CLKB, when enabled by signal EN. The output of counter 4307 is a count value. Digital comparator blocks 4304-0 to 4304-n compare the activation value, DINx, stored in the each of the respective row registers 4303 against the count value. If the count value matches the value stored in a particular row register 4302, then the corresponding row S/H buffer 4305 is enabled to sample and hold the analog output value from global DAC 4301. Global DAC 4301 performs digital-to-analog conversion on the count value (which also matches the DINx for the row register 4303 for the row in question). Each row S/H buffer 4305 outputs the held analog value as output signal 4306. If, for example, x=8 and DINx is an 8-bit input (meaning that there are 256 different values for DINx), then counter 4307 will count up to 256 and then reset. In doing so, it will have covered all possible values of DINx, and each row S/H buffer 4305 will have been loaded with its associated value of DINx.

Output signal 4306 can be applied, for example, to a control gate line or a word line during a programming or read operation in that particular row or during a neural read operation where all rows are read. During a neural read, all S/H buffers 4305 are enabled to drive the array input terminals through respective output signals 4306, resulting in bitline currents being output by the VMM array, which are then processed by output circuits, such as ITV (current to voltage converter) circuits and ADC (analog-to-digital converter) circuits.

Output signal 4306 can be applied, for example, to a respective control gate line or a word line during a programming operation in that particular row In another example, a row sample-and-hold buffer 4304 can be shared by multiple rows in a time-multiplexed fashion.

Figure 44:
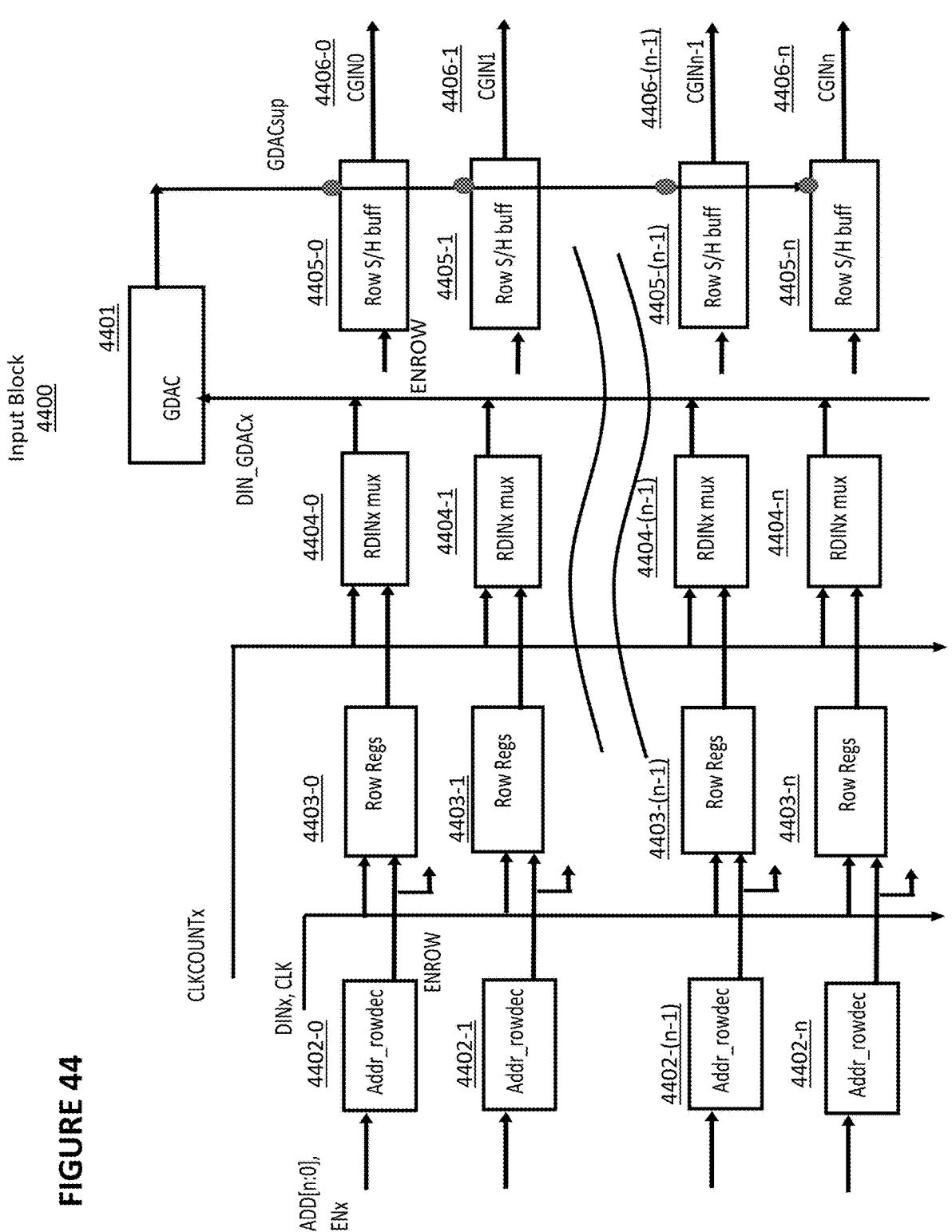
FIG. 44 depicts an example input block.

FIG. 44 depicts example row input block 4400 to be used to provide inputs to a VMM array, such as VMM array 3401 in FIG. 34. Input block 4400 comprises global digital-to-analog converter (DAC) 4401; address row decoders 4402-0 to 4402-n, each corresponding to one of the rows numbered 0 through n in the VMM array; row registers 4403-0 through 4403-n, each corresponding to one of the rows numbered 0 through n in the VMM array; digital multiplexer (mux) blocks 4404-0 through 4404-n, each corresponding to one of the rows numbered 0 through n in the VMM array; row sample-and-hold buffers 4405-0 through 4005-n, each corresponding to one of the rows numbered 0 through n in the VMM array; and output signals 4406-0 through 4406-n, each corresponding to one of the rows numbered 0 through n.

Address row decoders 4402-0 to 4402-n receive a row address, ADD[n:0], and an enable signal, EN. The output of each address row decoder, denoted ENROW, is high when ADD[n:0] is the address for that particular row. Row registers 4403-0 through 4303-n are loaded with respective digital input bits DINx (where x is the number of bits, such as 8 or 16 bits) for that particular row, where the loading operation is triggered by a clock signal, CLK, where DINx is the activation input for that particular row. When the output of a particular address row decoder 4402 is high and EN is asserted, the associated row register 4403 is enabled and outputs its respective digital bits, DINx. CLKCOUNTx is a count value provided by a counter, which can range between 1 and the total number of rows. Digital multiplexors 4404 multiplex out the data of the respective row registers 4403 onto the bus DIN_GDACx in response to CLK-COUNTx. CLKCOUNTx will enable each row in sequential order (row 0, row 1, . . . ) so that the DINx for each row is applied to the global DAC 4401 in turn. Each row S/H buffer 4405 receives the output of its associated address row decoder 4402 and is enabled by respective signal ENROW, when the row address matches the row address for that particular row, in which case that row S/H buffer 4405 samples the value from the global DAC 4401 and provide it as the respective analog output 4406. Output signal 4406 can be applied, for example, to a control gate line or a word line during a programming operation in that particular row.

In another example, the row sample-and-hold buffer 4405 can be shared for multiple rows for time multiplexing the row sample-and-hold buffers.

Figure 45:
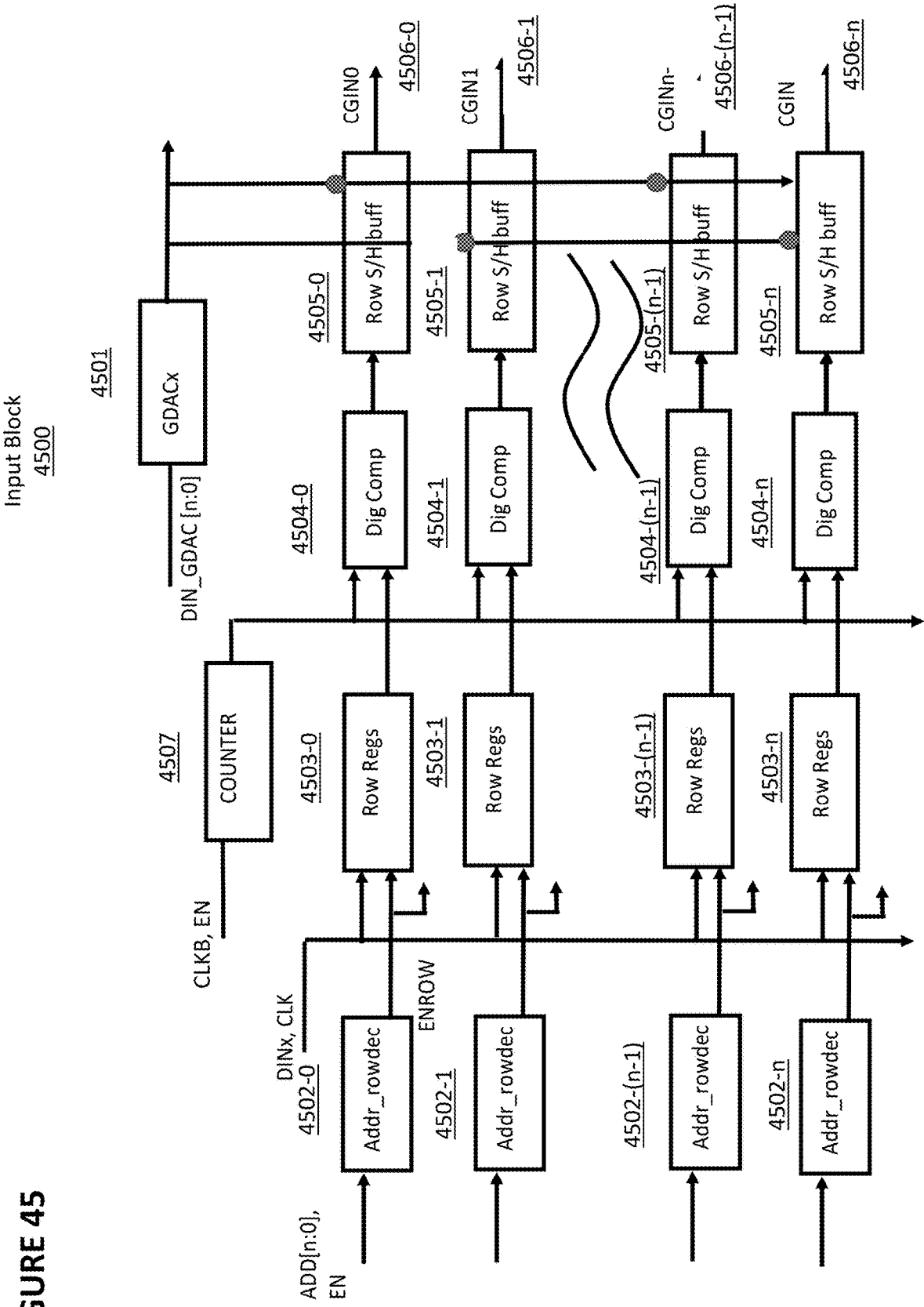
FIG. 45 depicts an example input block.

FIG. 45 depicts an example input block 4500 to be used to provide inputs to a VMM array, such as VMM array 3401 in FIG. 34. Input block 4500 is similar to input block 4400 in FIG. 44 but provides multiple outputs from global digital-to-analog converter for a neural read operation. Input block 4500 comprises global digital-to-analog converter and row decoder 4501; address row decoders 4502-0 to 4502-n, each corresponding to a respective one of the rows numbered 0 through n; row registers 4503-0 through 4503-n, each corresponding to a respective one of the rows numbered 0 through n; digital comparators 4504 through 4504-n, each corresponding to a respective one of the rows numbered 0 through n; row sample-and-hold buffers 4505-0 through 4505-n, each corresponding to a respective one of the rows numbered 0 through n; and output signals 4506-0 through 4506-n, each corresponding to a respective one of the rows numbered 0 through n.

Address row decoders 4502-0 to 4502-n receive a row address, ADD[n:0], and an enable signal, EN. The output of each address row decoder 4502, denoted ENROW, is high when ADD[n:0] is the address for that particular row and EN is asserted. Row registers 4503-0 through 4503-n are loaded with respective digital input bits DINx (where x is the number of bits, such as 8 or 16 bits), where the loading is triggered by clock signal, CLK, for that particular row, where DINx is the activation input for that particular row. When the output, ENROW, of a particular address row decoder 4502 is high, the associated row register 4503 is enabled and outputs its digital bits, DINx. Counter 4507, when enabled by signal EN, counts the pulses in another clock signal, CLKB. The output of counter 4507 is a count value. Digital comparator blocks 4504-0 to 4504-n compare the activation value, DINx, stored in the each of the respective row registers 4503 against the count value. If the count value matches the value stored in a particular row register 4502, then the corresponding row S/H buffer 4505 is enabled to sample and hold the analog output value from GDAC 4501. As shown, there are two vertical analog output lines from GDAC 4501. For example, for an 8-bit GDAC 4501, one line can deliver outputs for 0 to 127 analog levels (corresponding to 00000000 to 01111111) and the other line can deliver outputs for 128 to 255 analog levels (corresponding to 10000000 to 11111111). Both lines can operate at the same times to cut the row DAC sampling times from 256 (DAC) clocks to 128 (DAC) clocks. Output signal 4506 can be applied, for example, to a control gate line or a word line during a programming operation in that particular row.

Optionally, global digital-to-analog converter 4501 can comprise a first global DAC for odd rows and a second global DAC for even rows.

Figure 46:
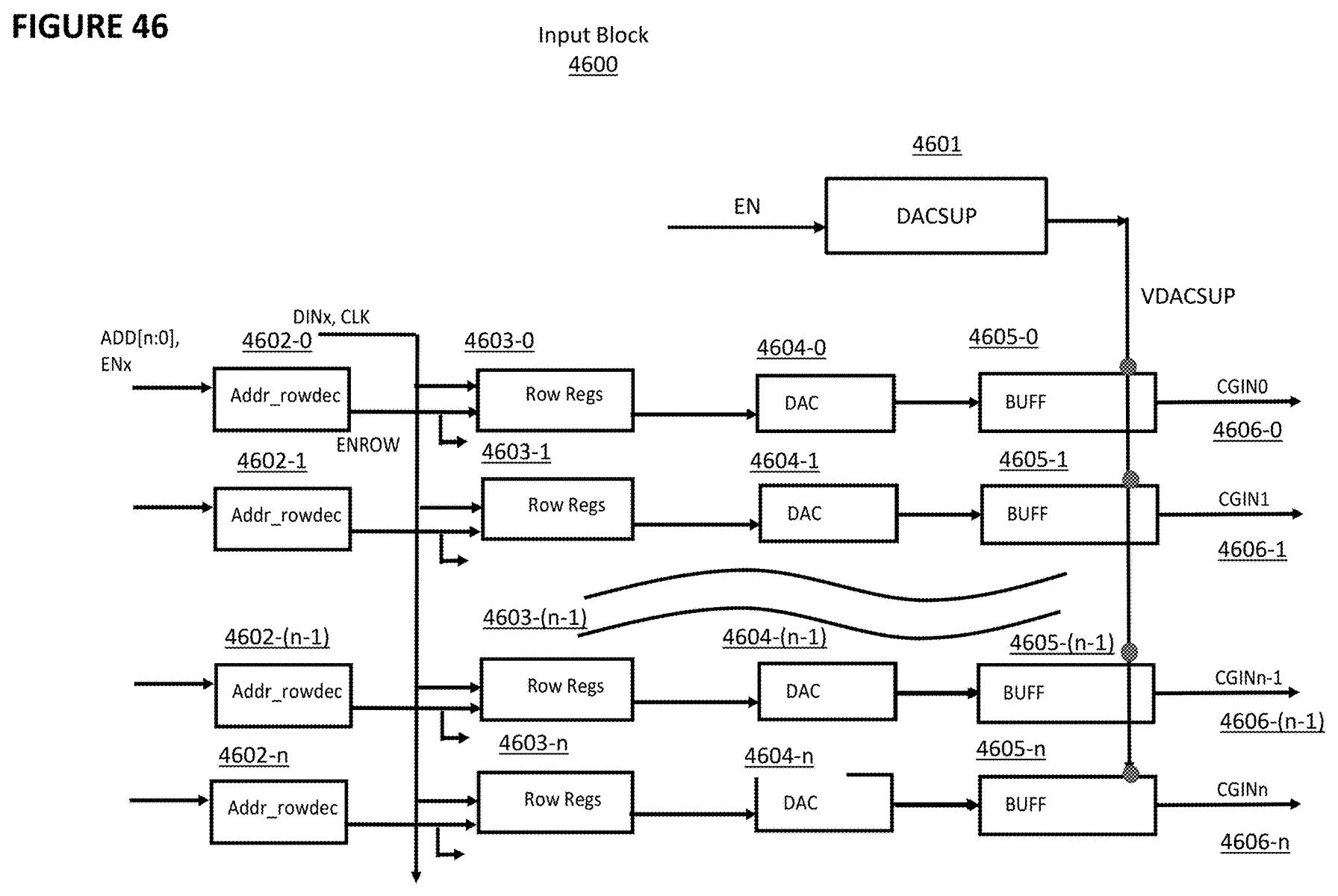

FIG. 46 depicts an example input block 4600 to be used to provide inputs to a VMM array, such as VMM array 3401 in FIG. 34. Input block 4600 comprises analog voltage supply 4601; address row decoders 4602-0 to 4602-n, each corresponding to a respective one of the rows numbered 0 through n in the VMM array; row registers 4603-0 through 4603-n, each corresponding to a respective one of the rows numbered 0 through n in the VMM array; local digital-to-analog converters 4604-0 through 4604-n (each row has its own DAC), each corresponding to a respective one of the rows numbered 0 through n; row buffers 4605-0 through 4605-n, each corresponding to a respective one of the rows numbered 0 through n; and output signals 4606-0 through 4606-n, each corresponding to a respective one of the rows numbered 0 through n.

Address row decoders 4602 receive a row address, ADD [n:0], and an enable signal, ENx. The output of each address row decoder, ENROW, is high when ADD[n:0] is the address for that particular row and ENx is asserted. Row registers 4603-0 through 4303-n are loaded with respective digital input bits DINx (where x is the number of bits, such as 8 or 16 bits) for that particular row, where the loading is triggered by a clock signal, CLK, where DINx is the activation input for that particular row. When the output, ENROW, of a particular address row decoder 4602 is high, the associated row register 4603 will be enabled and will output its digital bits, DINx.

Local digital-to-analog converters 4604-0 to 4604-n perform a digital-to-analog conversion on the digital bits DINx stored in the relevant row register(s) 4603. The corresponding row(s) sample-and-hold buffer 4605 for that row(s) samples the analog output from digital-to-analog converter 4604 and holds that value, which is then applied as output signal 4606 for that particular row. Output signal 4606 can be applied, for example, to a control gate line or a word line during a programming operation in that particular row or rows, in the manner described above with respect to other Figures.

Figure 47:
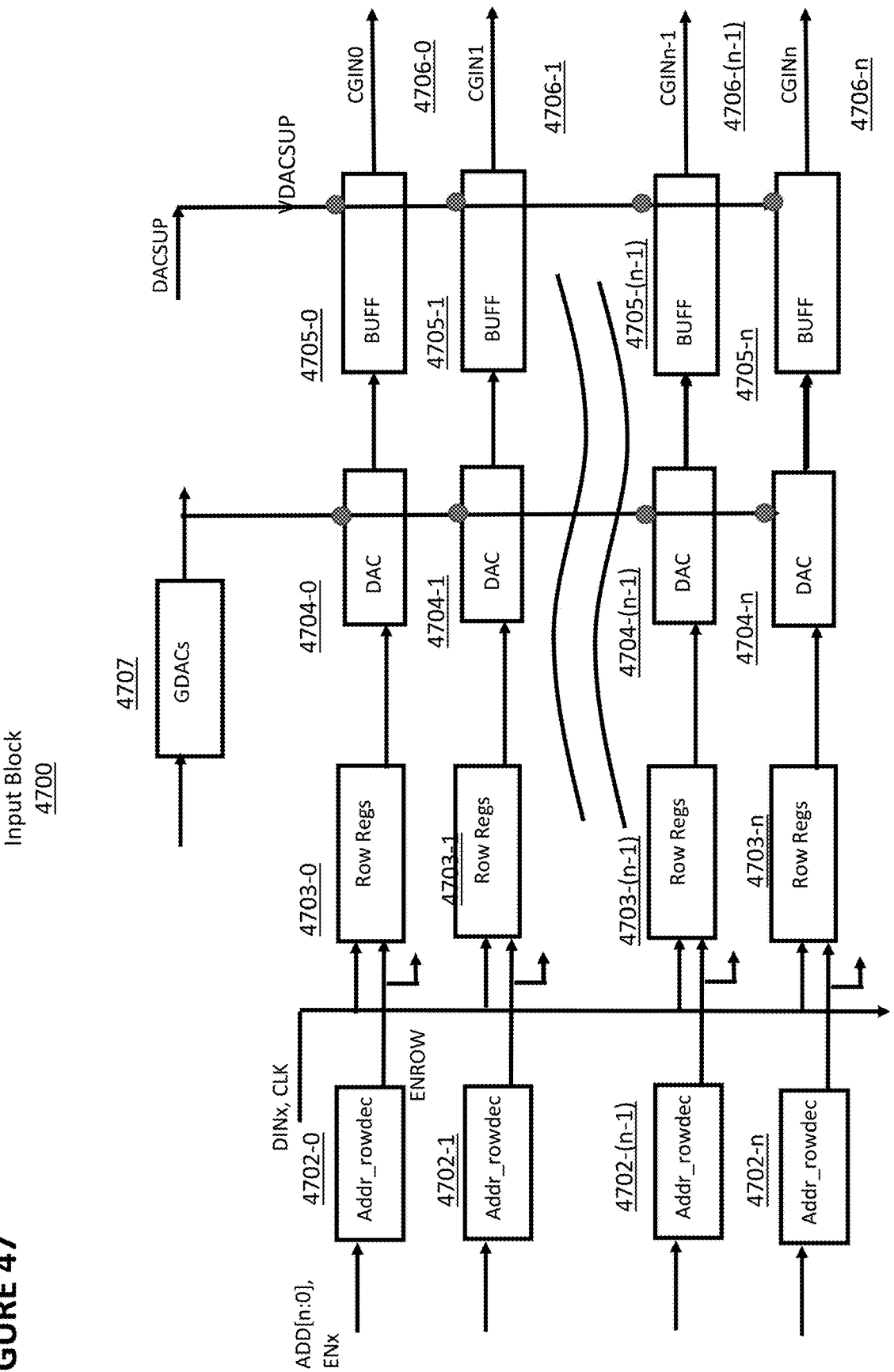
FIG. 47 depicts an example input block.

FIG. 47 depicts an example input block 4700 that is similar to that of the FIG. 46 with the addition of the global DAC block 4707. The global DAC block 4707 works in tandem with the local DAC 4704. For example, for a CDAC DAC (capacitive charge re-distribution DAC), the global DAC 4707 can provide additional reference voltages for the local CDAC DAC to extend the DAC resolution.

The electrical parameters for calibration relevant to the input blocks 4300, 4400, 4500, 4600, and 4700 can include the degree of bit resolution (by altering the number of bits in DINx), the degree of bias (by DACs 4604 and 4704 and GDACx 4301, 4401, 4501, 4601, and 4707) (which means adjusting the values of reference voltages or adjusting variable elements such as variable resistors), the degree of power consumption (by DACs 4604 and 4704 and GDACx 4301, 4401, 4501, 4601, and 4707), speed (by DACs 4604 and 4704 and GDACx 4301, 4401, 4501, 4601, and 4707), the degree of offset (by DACs 4604 and 4704 and GDACx 4301, 4401, 4501, 4601, and 4707), the degree of temperature compensation (by DACs 4604 and 4704 and GDACx 4301, 4401, 4501, 4601, and 4707), without limitation.

Figure 48:
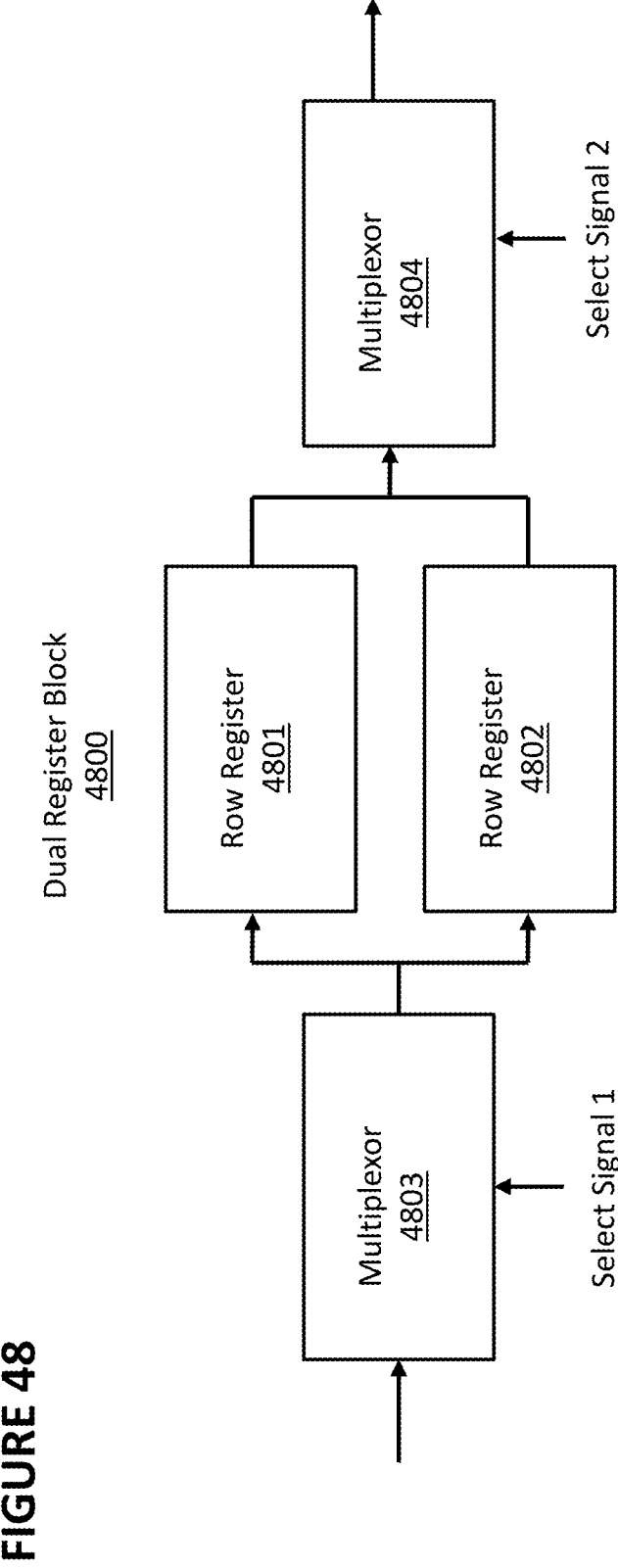
FIG. 48 depicts an example dual-register block.

FIG. 48 depicts example dual-register block 4800 that can be used in place of any individual register in FIGS. 43, 43, 44, 46, and 47, such as any of row registers 4303, 4403, 4503, 4603, and 4703. Dual-register block 4800 comprises multiplexors 4803 controlled by Select Signal 1, multiplexor 4804 controlled by Select Signal 2, and row registers 4801 and 4802. Row register 4801 can be loaded with data through multiplexor 4803 while row register 4802 outputs data through multiplexor 4804, and vice-versa. This reduces the amount of operation time required for loading and reading row registers because these operations can occur concurrently or partially concurrently. By contrast, in a single-register configuration, the register needs time to be loaded before the data could be read out.

Figures 49, 50:
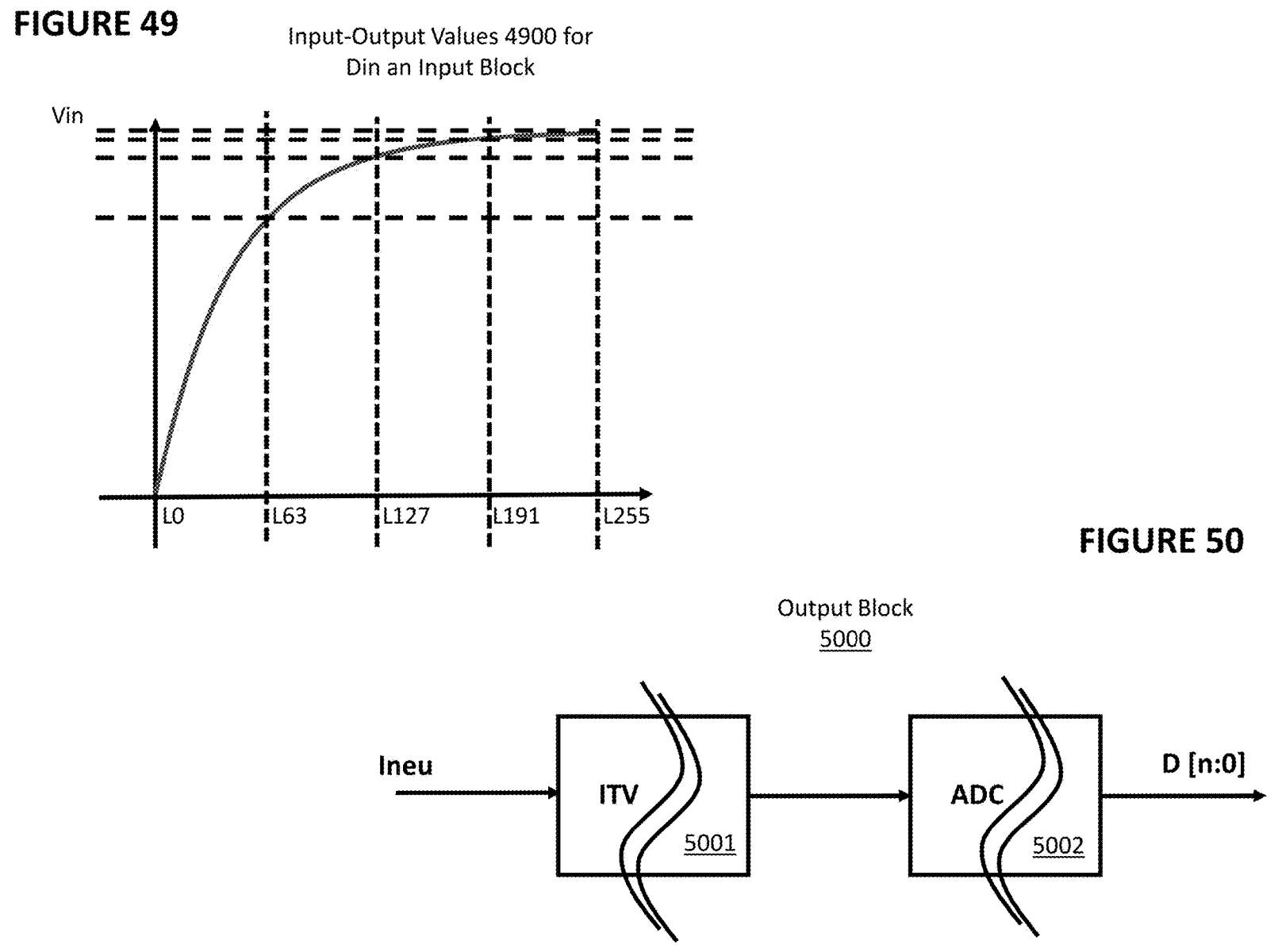

FIG. 49 depicts example input-output values 4900 for an input block, which can comprise a digital-to-analog converter. Here, the input block receives 8 digital bits corresponding to 256 different values, L0 through L255. The input block generates an analog voltage, Vin, in response to the 8 digital bits, according to a logarithmic function, as shown in the graph.

FIG. 50 depicts an example output block 5000. Output block comprises current-to-voltage converter 5001 (scalable neuron circuit) and analog-to-digital converter 5002. Current-to-voltage converter 5001 receives an output current, Ineu, as an output from a column in a VMM array and converts the current into a voltage. Analog-to-digital converter 5002 converts the voltage into a set of n+1 digital bits, D[n:0]. As shown the current-to-voltage converter 5001 and analog-to-digital converter 5002 are configurable (e.g., n bit resolution, power, latency, scaling).

Figure 51:
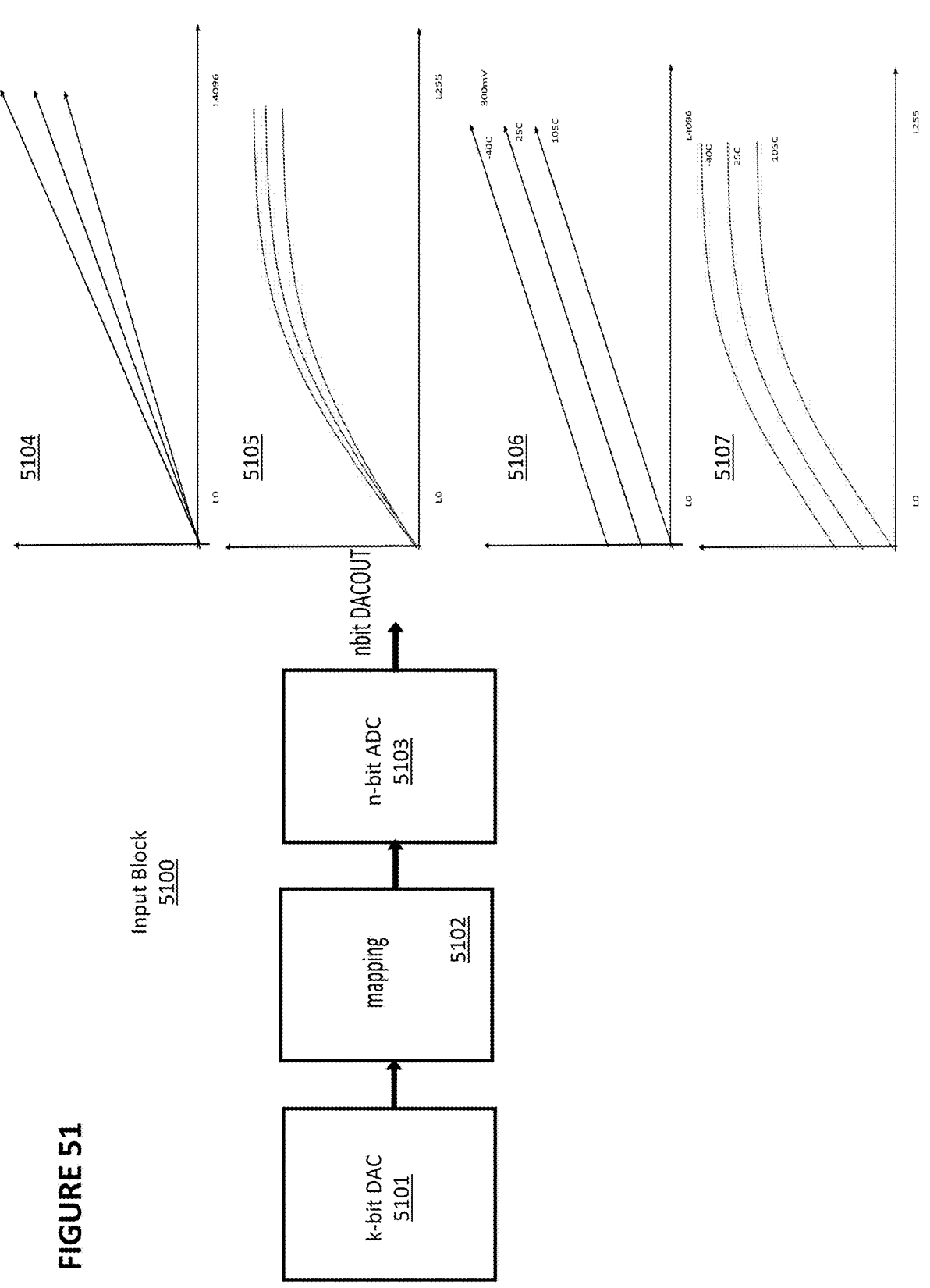
FIG. 51 depicts an example input block.

FIG. 51 depicts input block (row input bias generator) 5100. Input block 5100 comprises k-bit digital-to-analog converter 5101, mapping scalar 5102, and n-bit analog-to-digital converter 5103. K-bit digital-to-analog converter 5101 receives an input of k bits and generates an analog signal using a linear function or logarithmic function. Graphs 5105 and 5107 depict examples of analog signals generated according to a logarithmic function, and graphs 5104 and 5106 depict examples of analog signals generated according to a linear function. Mapping scalar 5102 performs a scaling function on the analog signal, while n-bit analog-to-digital converter 5103 converts the output of mapping scalar 5102 into a digital output of n bits. Thus, output block 5100 converts a k-bit value to an n-bit value through mapping scalar 5102. For example, k is 10-14 bits while n is 5-8 bits. The conversion (mapping) is, for example, assisted by calibration circuits in FIGS. 59-64.

Figure 52:
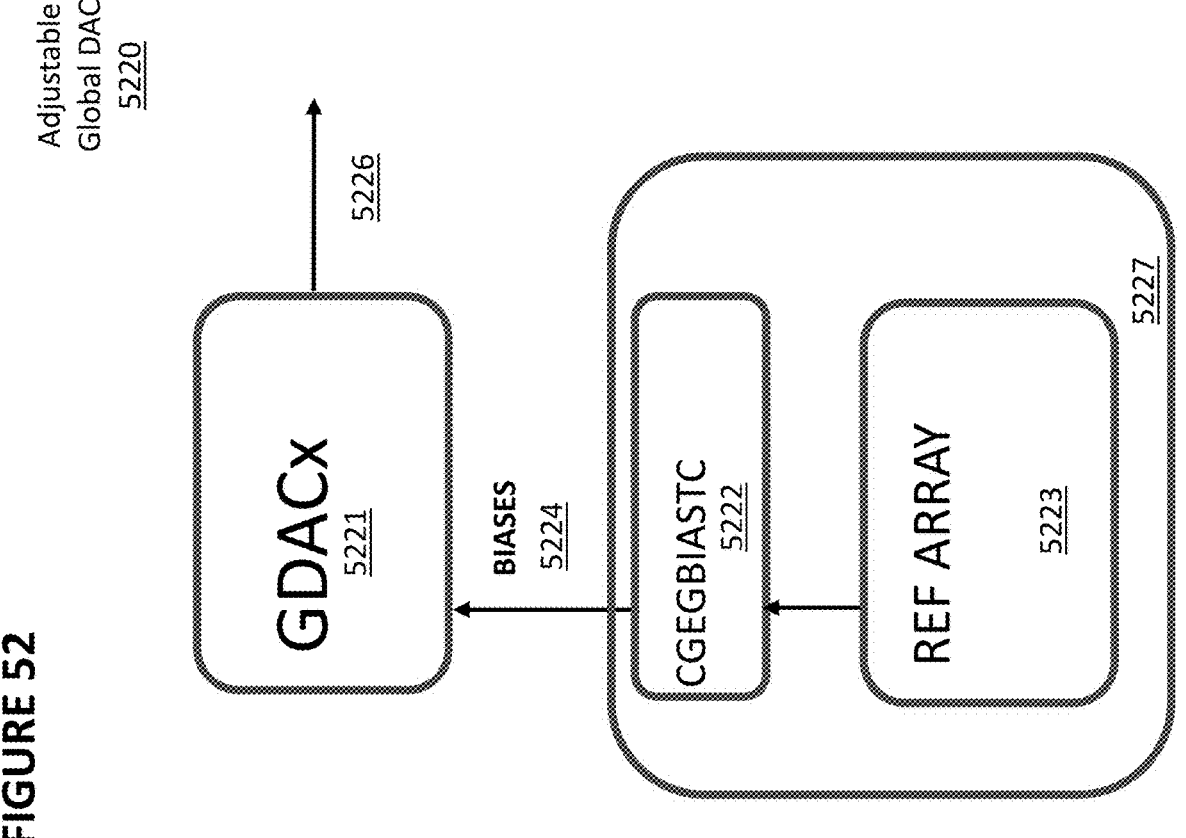
FIG. 52 depicts an example of a global digital-to-analog converter and row decoder.

FIG. 52 depicts adjustable GDAC 5220, which can be used for GDACs 4301, 4401, 4501, 4601, and 4707 in FIGS. 43-47, respectively, to generate analog signals to apply to a non-volatile memory array in response to digital inputs and one or more bias voltages. Adjustable GDAC 5220 includes global DACx 5221 and bias generator 5227. Bias generator 5227 includes reference array 5223 and bias generation circuit 5222 that generates biases 5224. The bias generation circuit 5222 uses the reference array 5223 to generate biases 5224 that are automatically compensated for temperature based on temperature changes experienced by reference array 5223. For example, biases 5224 can be based on current drawn by reference array 5223, which will be affected by the temperature of reference array 5223. This biases 5224 are fed to the global DAC 5221 so that the resulting output voltage 5226 that is supplied to the array is compensated over temperature.

Figure 53:
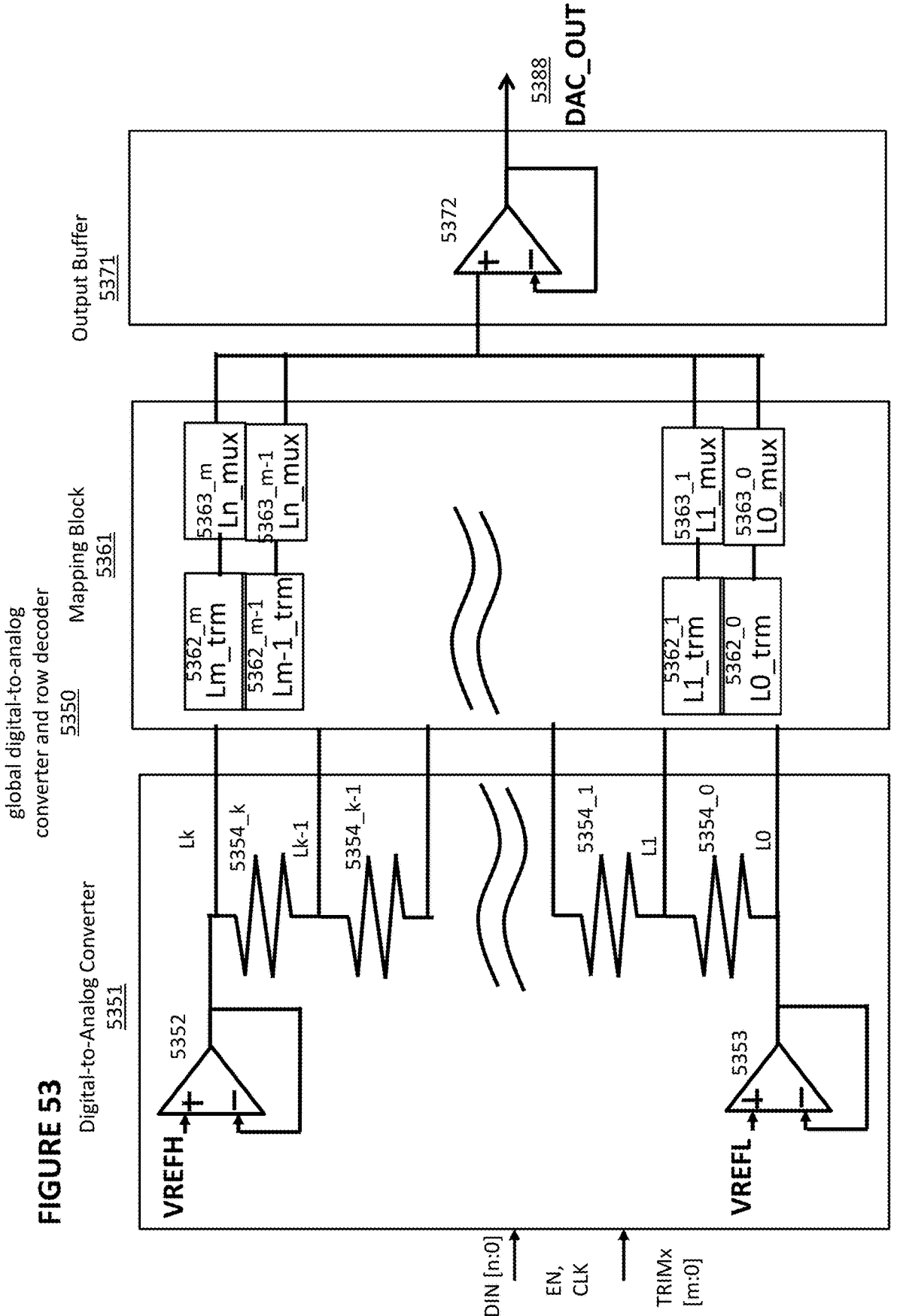
FIG. 53 depicts an example of a global digital-to-analog converter and row decoder.

FIG. 53 depicts an example of global digital-to-analog converter and row decoder 5350, which can be used for global digital-to-analog converter and row decoder 4301, 4401, 4501, 4601, and 4707 in FIGS. 43-47. Global digital-to-analog converter and row decoder 5350 includes DAC 5351, mapping block 5361, and output buffer 5371. Control logic (not shown) controls the operation of the GDAC (to perform functions such as enabling various blocks using enable signals, such as EN, providing control signals to multiplexors, and other control functions).

DAC 5351 receives a high reference voltage, VREFH, and a low reference voltage, VREFL. DAC 5351 includes a voltage ladder of a plurality of resistors that is used to generate a range of voltages between VREFL and VREFH, optionally according to a linear function or a logarithmic function. For example, the top node of the top resistor in the voltage ladder will have a voltage VREFH, and the bottom of the resistor will have a lower voltage due to a voltage drop across the top resistor. The bottom node of the bottom resistor will have a voltage VREFL. The voltage ladder thereby generates a plurality of voltage levels (L0, . . . , Lk) (for example, k might be 4095), which are needed when it is desired to provide a voltage to a VMM array to cause the non-volatile memory cells of the VMM array to operate in linear mode or sub-threshold mode.

Digital-to-analog converter 5351 receives digital input, DIN [n:0], which is used to select one of the m+1 voltages though sub blocks 5363 inside mapping block 5361, where (m+1)=2^(n+1). For example, if (n+1)=8, then (m+1)=256. Mapping block 5361 comprises (m+1) trim blocks 5362 and (m+1) multiplexors 5363. Mapping block 5361 translates the k+1 voltage levels from the DAC 5351 into a respective analog output corresponding to DIN[n:0]. This is achieved with local trimming for each level (represented by trim blocks L0_trm, . . . Lm_trm), which may be useful, for example, when the non-volatile memory cells in the array are operating in the sub-threshold region. This is desirable to achieve a best matching I-V slope for the non-volatile memory cells in the VMM array over temperature in sub threshold region or linear region.

By adjusting reference voltages VREFL and VREFH, the k+1 levels are adjusted as well. This is, for example, to match the output range of this input block with an input range of the memory cells. This is also for temperature compensation by adjusting (such as shifting lower at high temperature and higher at lower temperature) the reference levels VREFL and VREFH to match that of the gate bias of the memory cells over temperature. Further individual level adjustment and temperature compensation is done by level trimming circuits of mapping block 5361. The conversion (mapping) and temperature compensation is for example assisted by calibration circuits in FIGS. 59-64.

Figure 54:
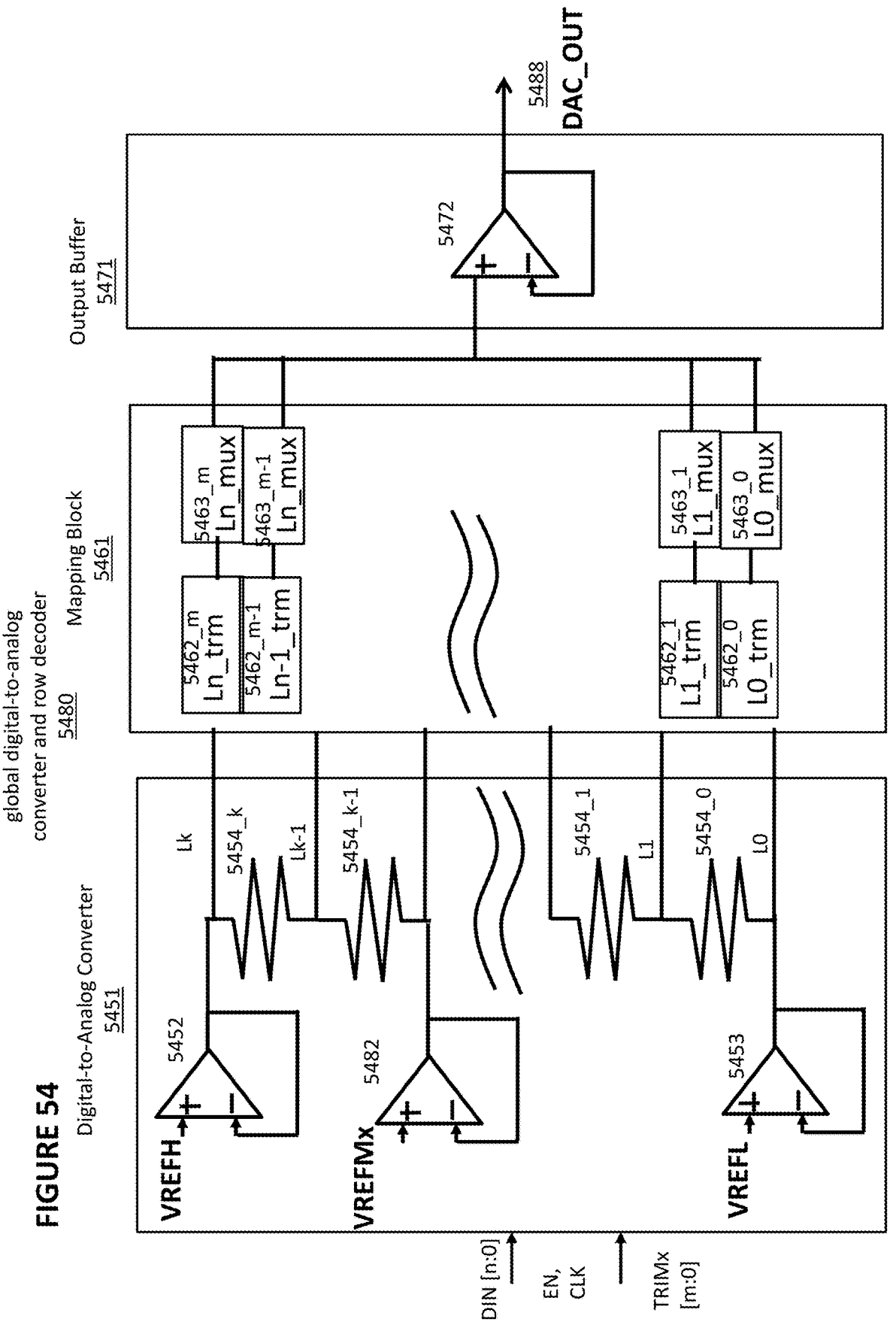
FIG. 54 depicts an example of a global digital-to-analog converter and row decoder.

FIG. 54 depicts an example of global digital-to-analog converter and row decoder 5480 that is similar to that of FIG. 53 with the addition of intermediate middle reference level VREFMx. The adjustment and temperature behavior of VREFMx reference levels are controlled similar like that of the VREFH and VREFL reference levels. It includes additional buffer 5482 to impose middle reference levels into the resistor ladder to adjust further the I-V slope matching of the GDAC 5480 and the input of the memory array.

Figure 79:
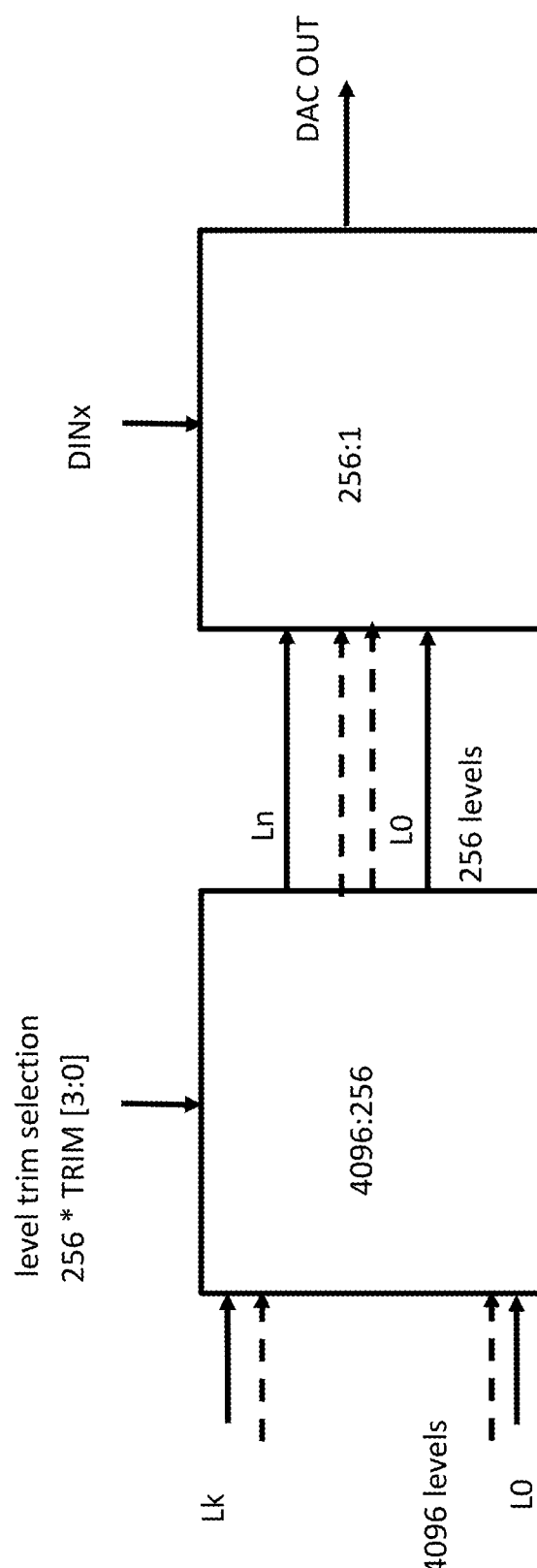
FIG. 79 depicts an example of GDAC input level to output level selection.
Figures 80, 81:
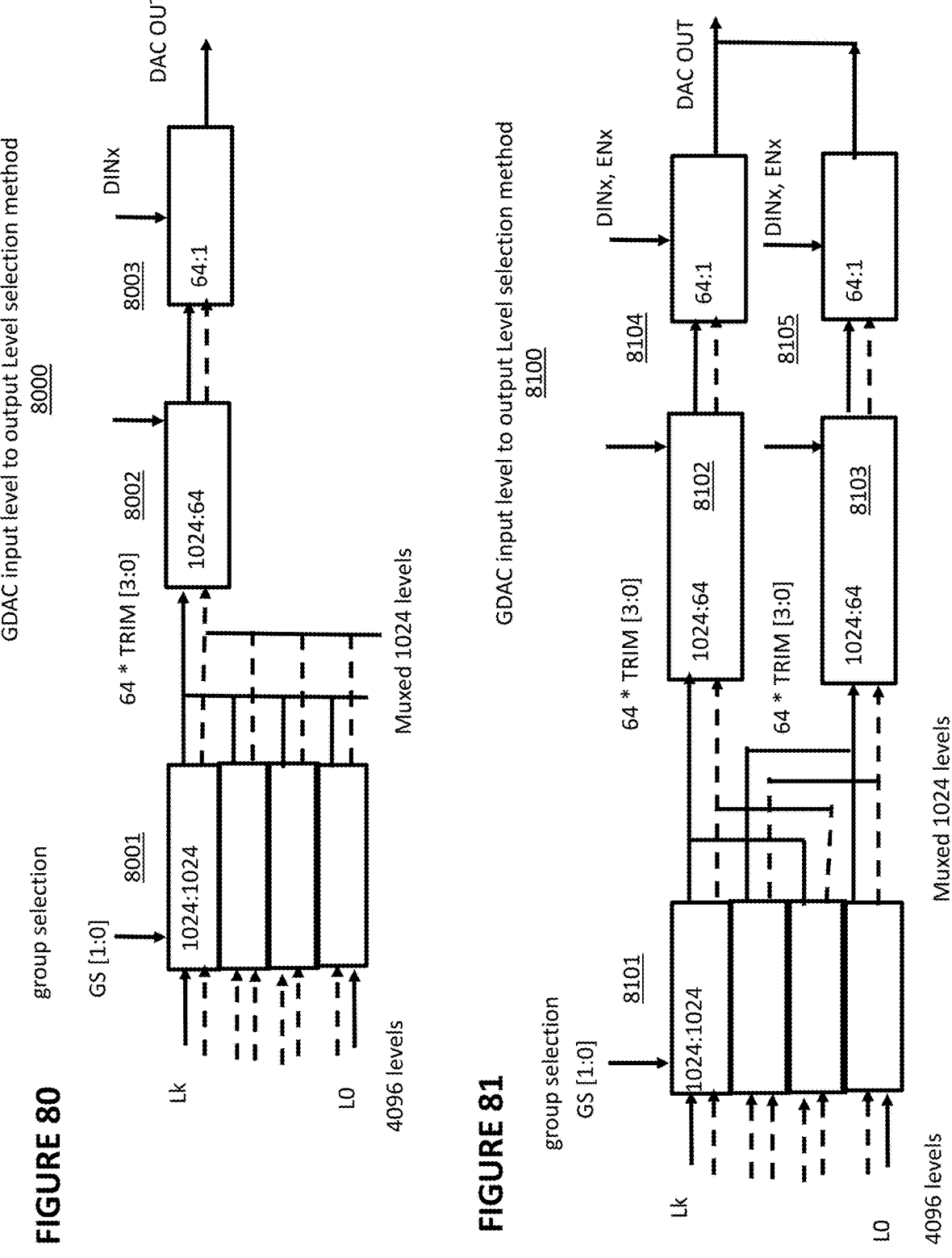
FIG. 80 depicts an example of GDAC input level to output level selection.
FIG. 81 depicts an example of GDAC input level to output level selection.

FIGS. 79-81 depict additional detail regarding optional implementations of global digital-to-analog converter and row decoder 5350 and 5480 in FIGS. 53 and 54.

FIG. 79 depicts GDAC input level to output level selection method 7900. In this example, there are 4096 different level inputs (k=4095), and there are 4 trimbits per output level (m=3) TRIM [3:0], and there are 256 possible output levels (L0 . . . Ln).

FIG. 80 depicts GDAC input level to output level selection method 8000. In this example, there are 4096 level inputs (k=4095) and there are 4 trimbits per output level (m=3) TRIM [3:0], and there are 256 possible output levels (L0 . . . Ln). Block 8001 is group selection. As shown, there are 4 groups. Block 8002 is a trim selection block that adjusts the 1024 possible outputs from group selection block 8001. Block 8003 is an output selection block with 64:1 muxing. As shown, fewer numbers of trim block circuits are needed compared to FIG. 79.

FIG. 81 depicts GDAC input level to output level selection method 8100. In this example, there are 4096 level inputs (k=4095) and there are 4 trimbits per output level (m=3) TRIM [3:0], and there are 256 output levels (L0 . . . Ln). Block 8101 is group selection. As shown there, are 4 groups. Blocks 8102 and 8103 are trim selection blocks that adjust the 1024 possible outputs from group selection block 8101. Blocks 8104 and 8105 are output selection blocks with 64:1 muxing. As shown, fewer numbers of trim block circuits are needed compared to FIG. 79. A ping-pong method can be performed between block 8102 and 8104 and the one hand and blocks 8103 and 8105 on the other hand to reduce latency. For example, while block 8102 performs a trim operation on a first set of input levels, a second group of input levels are used to set the trimbits in block 8103, and vice-versa.

Figure 55:
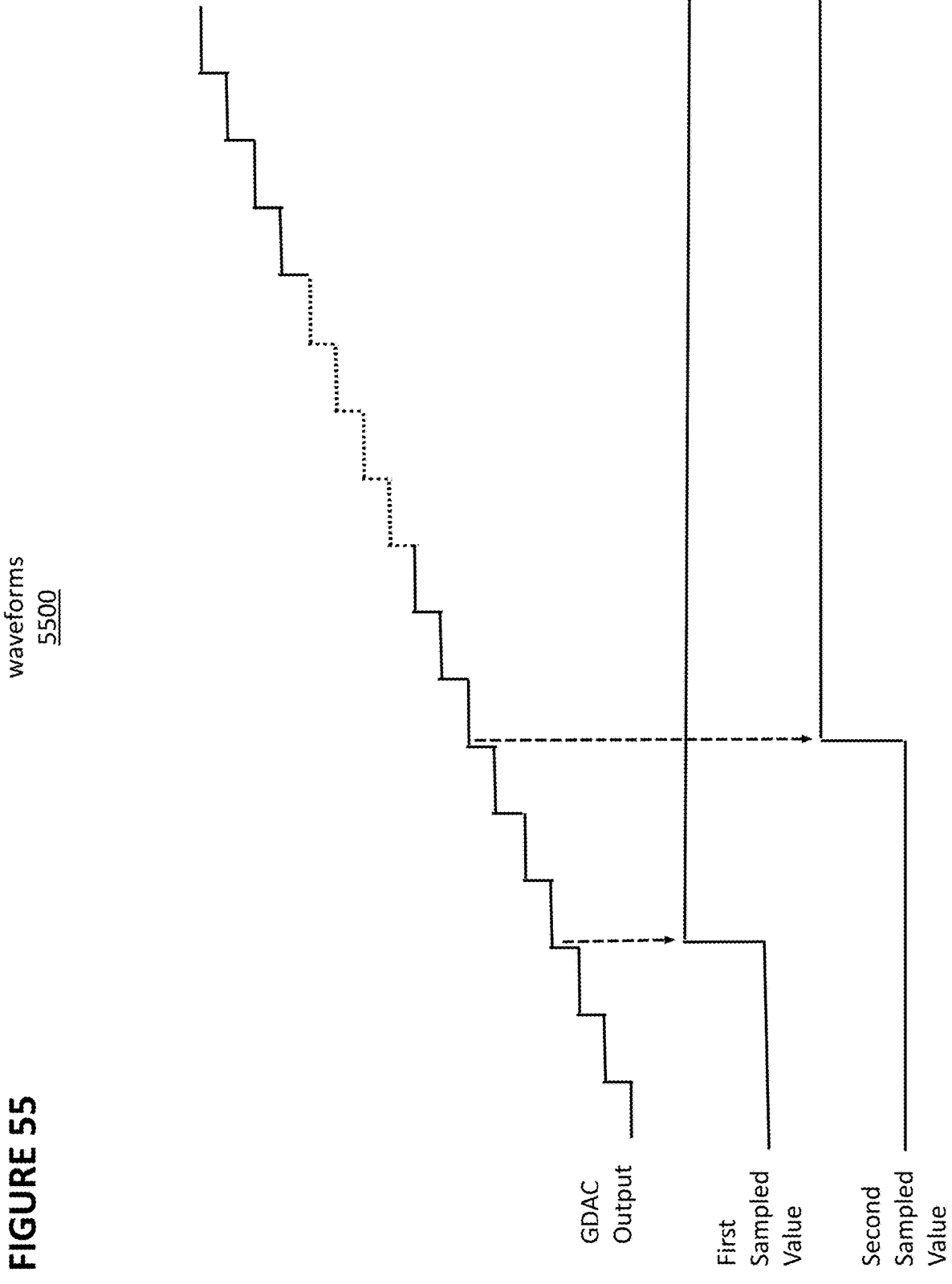
FIG. 55 depicts example waveforms for a digital-to-analog converter.

FIG. 55 depicts example waveforms 5500 that illustrate linear voltage levels for sample-and-hold actions by row sample-and-hold buffers 4305, 4405, 4505, 4605, and 4705 in FIGS. 43-47, respectively. The GDAC Output can take a number of different values. Two examples of sampled values—First Sampled Value and Second Sampled Value—that can be output by row sample and hold buffers 4305, 4405, 4505, 4605, and 4705 are shown. Such values are appropriate for memory cells in the VMM array operating in the linear region, where a digital value is converted into an analog value according to a linear function.

FIG. 56 depicts example waveforms 5600 that illustrate logarithmic voltage levels for example sample-and-hold actions by row sample-and-hold buffers 4305, 4405, 4505, 4605, and 4705 in FIGS. 43-47, respectively. The GDAC Output can take a number of different values. Two examples of sampled values-First Sampled Value and Second Sampled Value that can be output by row sample and hold buffers 4305, 4405, 4505, 4605, and 4705 are shown. Such values are appropriate for memory cells operating in sub threshold region, where a digital value is converted into an analog value according to a logarithmic function.

Alternatively, the global DAC voltage waveform can be utilized for memory cells operating in saturation region.

Figures 57, 58:
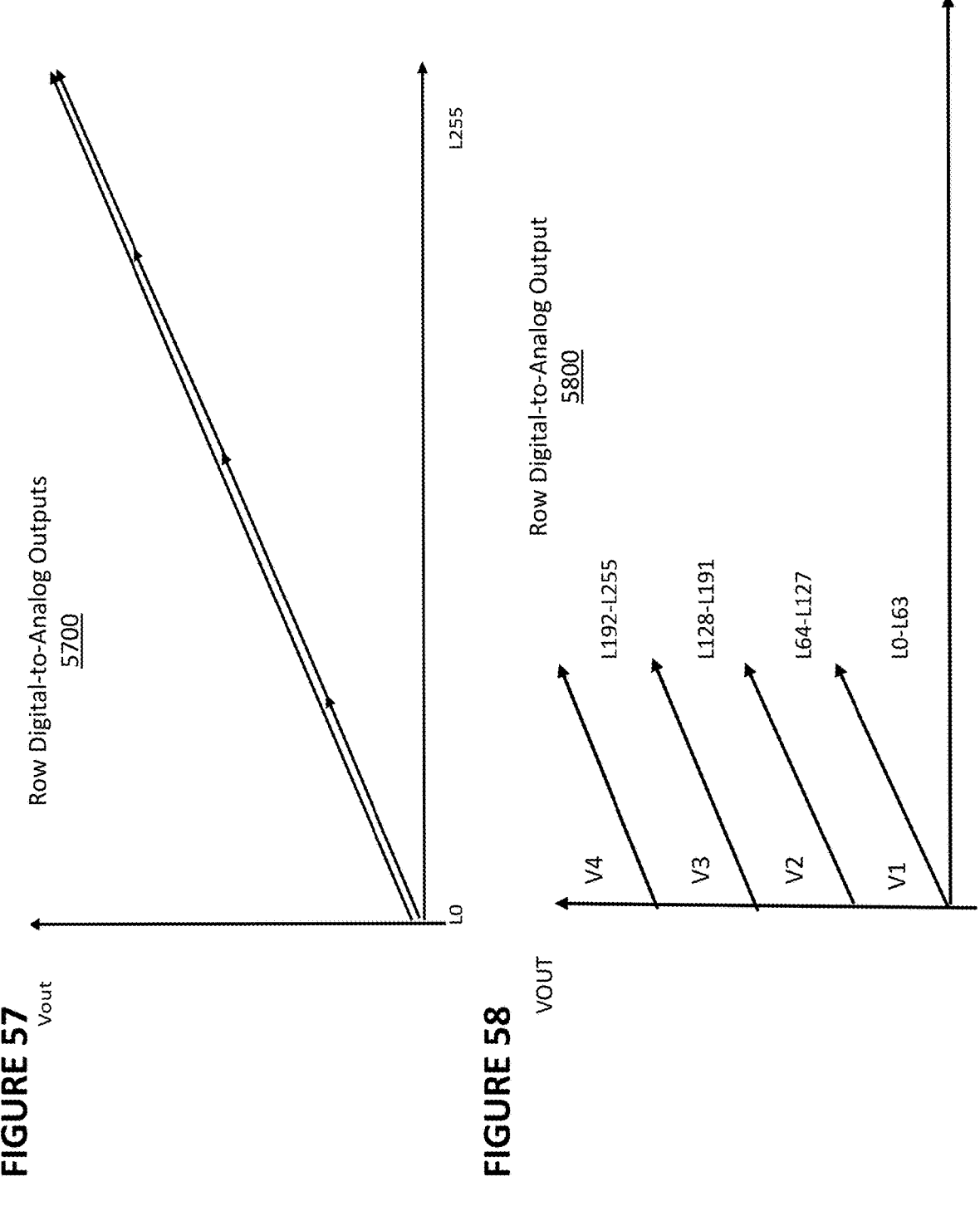
FIG. 57 depicts an example output for a digital-to-analog converter.
FIG. 58 depicts an example output for a digital-to-analog converter.

FIG. 57 depicts an example two linear digital-to-analog outputs 5700 for 8-bit resolution (256 levels), where the two outputs are generated at different operating temperatures.

FIG. 58 depicts an example digital-to-analog output 5800 with a segmented output. Each digital input corresponds to the same analog voltage output as in FIG. 57, but the inputs are grouped in sub-groups each corresponding with a different voltage curve. For example, inputs L0-L63 correspond to voltage curve V1, inputs L64-L127 correspond to voltage curve V2, inputs L128-L191 correspond to voltage curve V3, and inputs L192-L255 correspond to voltage curve V4. This can be achieved, for example, by using the two most significant bits to determine the voltage curve V1, V2, V3, or V4 to apply, and then converting the six remaining bits to the appropriate voltage in the selected voltage curve. In this example, the global DAC sampling time is reduced by a factor of four because 14 the number of digital inputs need to be converted by global DAC. Other numbers of segment, such as 2, 8, or 16, can be used instead of 4 segments.

Figure 59:
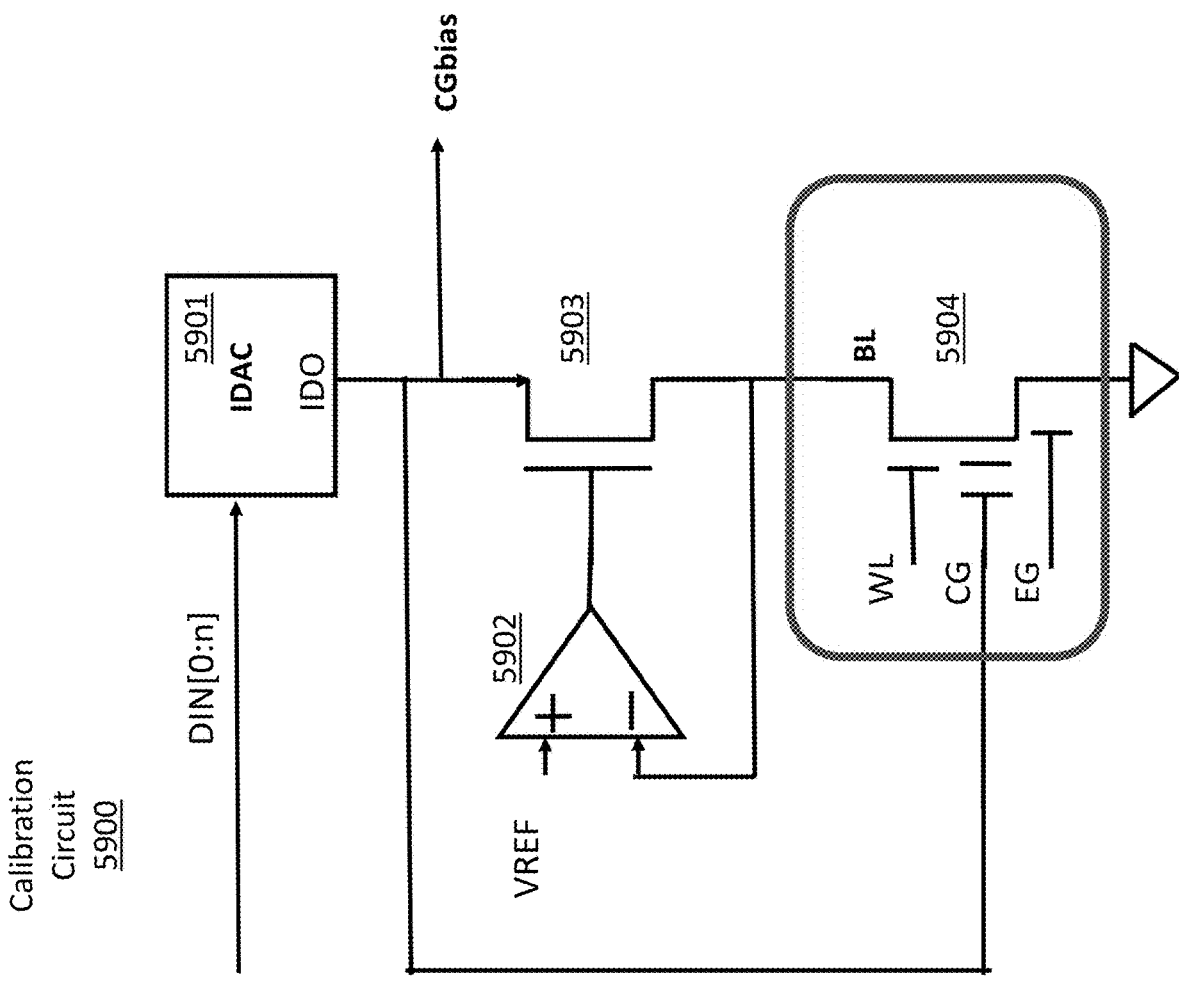
FIG. 59 depicts an example calibration circuit.

FIG. 59 depicts an example row bias (I-V cell/array) calibration circuit 5900, which comprises current digital-to-analog converter 5901, op-amp (operational amplifier) 5902, transistor 5903, illustrated as a FET, and memory cell 5904. Current digital-to-analog converter 5901 receives digital input DIN[0:n] and outputs an analog current, where DIN [0n] provides a range of digital values corresponding to the possible currents to be drawn by memory cell 5904. The op-amp 5902 with cascoding transistor 5903 imposes a bias reference voltage VREF on a bitline of memory cell(s) 5904. The voltage from the control gate terminal of memory cell 5904 is output as CGbias. As the current from the IDAC 5901 changes, the voltage from the control gate terminal changes accordingly.

Calibration circuit 5900 can be used to generate voltage CGbias for a current range of 1-128 nA with 0.5 nA step for 256 levels in sub threshold operation. Hence there are 256 levels for voltage CGbias each reflective of one of the 256 current levels with 0.5 nA per current step. These CGbias values can be applied to a row of memory cells in a VMM array to compensate for variation within the DAC and GDAC circuits of FIGS. 43-47 so that a given digital input will have the same effect on the memory cell in the VMM array regardless of which DAC circuit the row containing the memory cell is attached to it.

Calibration circuit 5900 can also be used to generate an equivalent voltage for a pre-determined current such as for a neuron current (bitline current). For example, for a 10 uA neuron current, there is a corresponding CG voltage. In this case the memory cell(s) 5904 would include multiple cells (operating in sub threshold mode) with some mixed current patterns to represent the data pattern in the neural memory array. The resulting CG bias voltage when the multiple cells are used would then be applied to the array during a read operation so that the neuron current and array current are not changed due to changes in temperature.

The memory cells 5904, 6004, 6134, and 6254 in FIGS. 59 and 60-62 (discussed below) can be a part of a main VMM array, such as VMM array 3401 in FIG. 34, or a separate reference sector(s) or an external mini-array.

Figure 60:
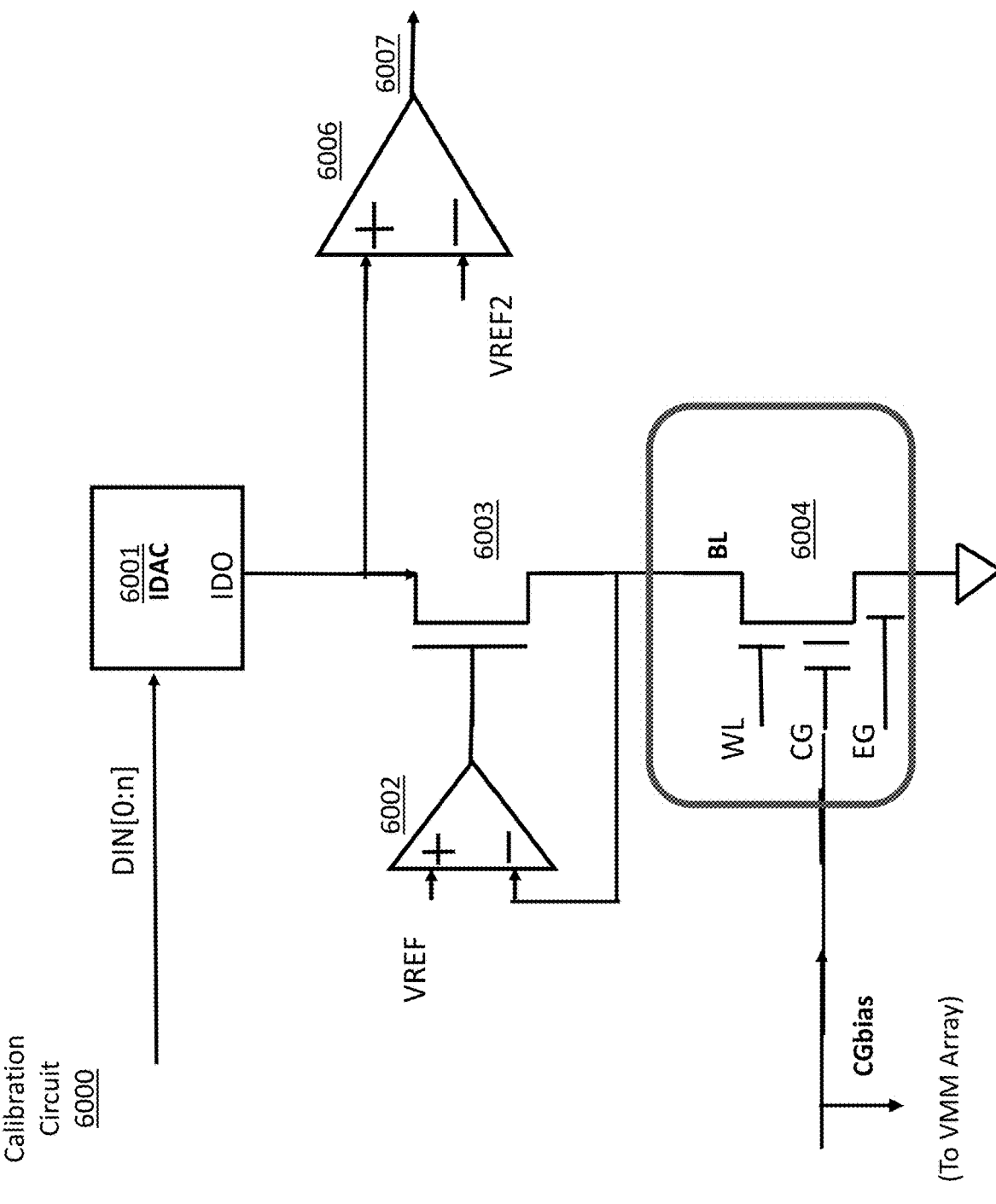
FIG. 60 depicts an example of a calibration circuit.

FIG. 60 depicts row bias calibration circuit 6000, which comprises current digital-to-analog converter (IDAC) 6001, op-amp 6002, comparator 6006, FET 6003, and memory cell 6004. FET 6003 performs a cascading function. Current digital-to-analog converter 6001 receives digital input DIN [0:n] and outputs an analog current, where DIN[0:n] provides a range of digital values corresponding to the possible currents to be drawn by memory cell 6004. The op-amp 6002 with cascoding FET 6003 imposes a bias reference voltage VREF on bitline BL (a first terminal) of memory cell 6004. Comparator 6006 receives a second reference voltage VREF2 on its inverting input and generates control signal 6007 on its output. The voltage on the control gate (a second terminal) of memory cell 6004, i.e. CGbias, is swept until the comparator 6006 switches polarity, meaning that control signal 6007 changes value, which occurs when the first terminal of cascoding FET 6003 exceeds VREF2. The change in control signal 6007 is used to sample and hold the control gate bias, CGbias, which is then used as a bias voltage applied to the control gate terminals of a row of cells in a VMM array. The source line (a third terminal) of memory cell 6004 may be coupled to ground.

The application of calibration circuit 6000 is similar to that of calibration circuit 5900 of FIG. 59.

Figure 61:
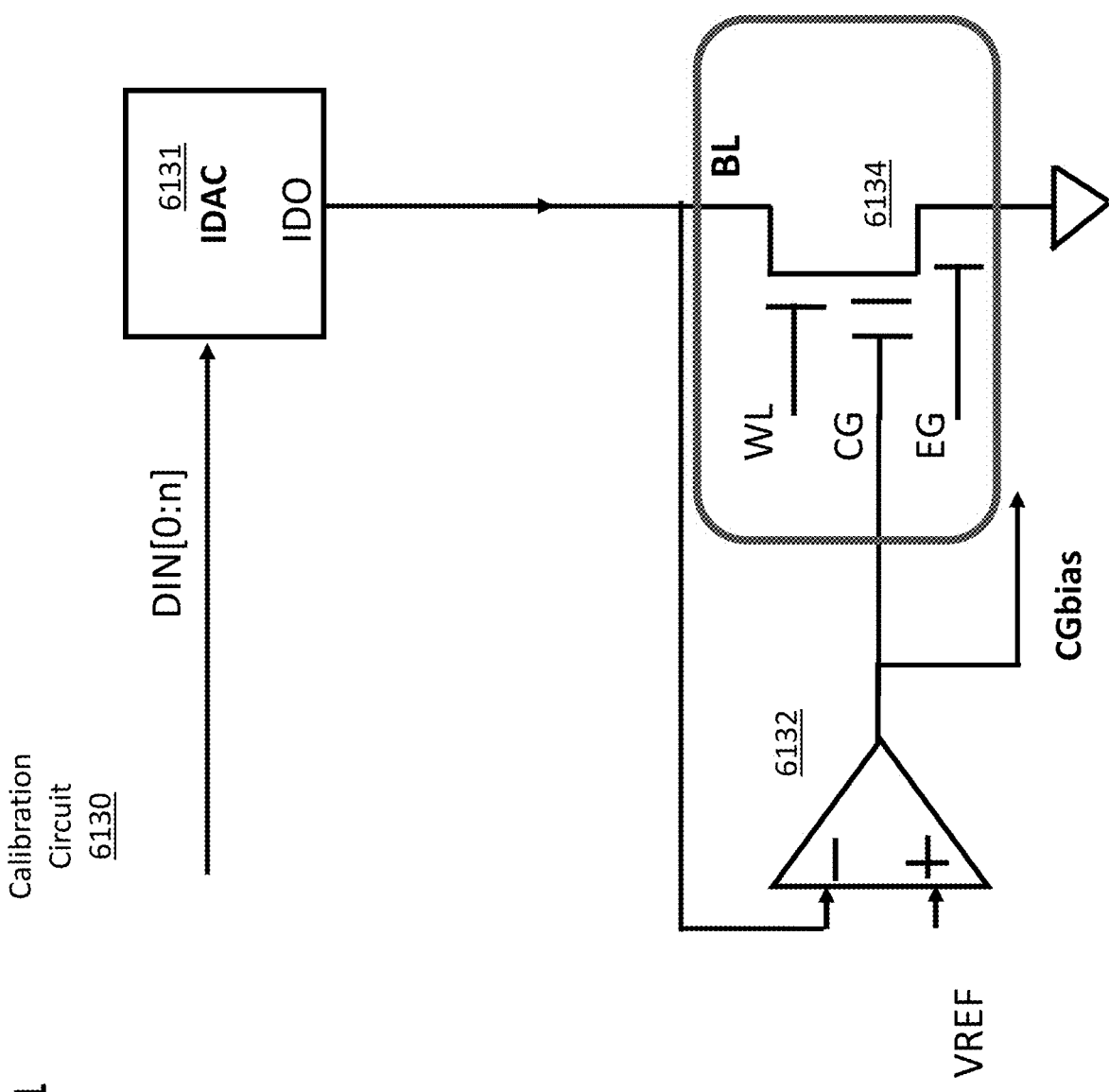
FIG. 61 depicts an example of a calibration circuit.

FIG. 61 depicts an example row bias calibration circuit 6130, which comprises current DAC 6131, op-amp 6132 and memory cell 6134. Op-amp 6132 outputs a voltage on terminal CG (a second terminal) of memory cell 6134 such that the current in memory cell 6134 is the same as that of the IDAC 6131. The application of the calibration circuit 6100 is similar to that of the FIG. 59. VREF is the voltage used to regulate the precise voltage on the bitline BL (a first terminal of memory cell 6134) to reduce inaccuracy due to bitline voltage variation. For example, VREF might be 0.6V, meaning the voltage bitline during this operation will be 0.6V. The source line (a third terminal) of memory cell 6134 may be coupled to ground.

Figures 62, 63:
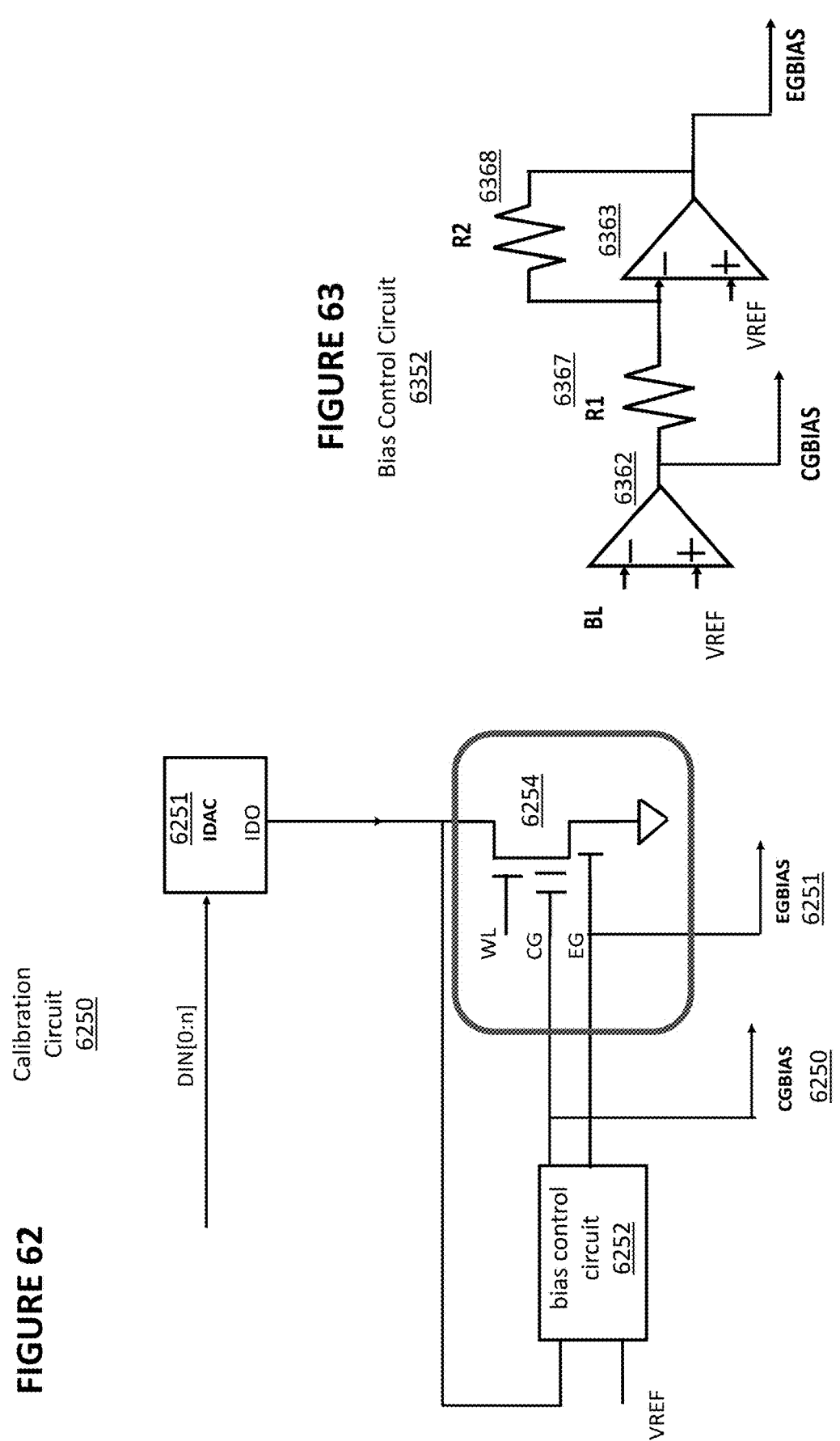
FIG. 62 depicts an example of a calibration circuit.
FIG. 63 depicts an example of a calibration circuit.

FIG. 62 depicts an example row bias calibration circuit 6250, which comprises current DAC 6251, bias control circuit 6252 and memory cell 6254. Current DAC 6251 connects to the bit line (a first terminal) of memory cell 6254. Bias control circuit 6252 circuit outputs a voltage to each of the CG and EG terminals (either can be referred to as a second terminal or a fourth terminal) of memory cell 54 such that the current in memory cell 6254 is same as that of the IDAC 6251. VREF is the voltage used to regulate the voltage on the bitline BL (a first terminal of memory cell 6254). The application of the circuit 6250 is similar to that of the FIG. 59. The source line (a third terminal) of memory cell 6254 may be coupled to ground. The voltage of both the CG and EG terminals can be until the bitline voltage exceeds VREF, at which point the CG and EG voltages can be applied as bias voltages to a VMM array.

FIG. 63 shows an example bias control circuit 6352. It comprises op-amp 6362 (a first operational amplifier) comprising an inverting terminal to receive a voltage from a first terminal (BL) of a non-volatile memory cell, a non-inverting terminal to receive a reference voltage, and a first output, and a gain circuit consisting of op-amp 6363 (a second operational amplifier) and input resistor R1 6367 and feedback resistor R2 6368. The gain is set by the ration of R2/R1, for example it may be a ratio of ~1.9. Hence EGBIAS, the output of op-amp 6363, is ~1.9 time CGbias. Other ratios are possible. CGbias can, in other examples, be provided as a function of EGbias.

Figure 64:
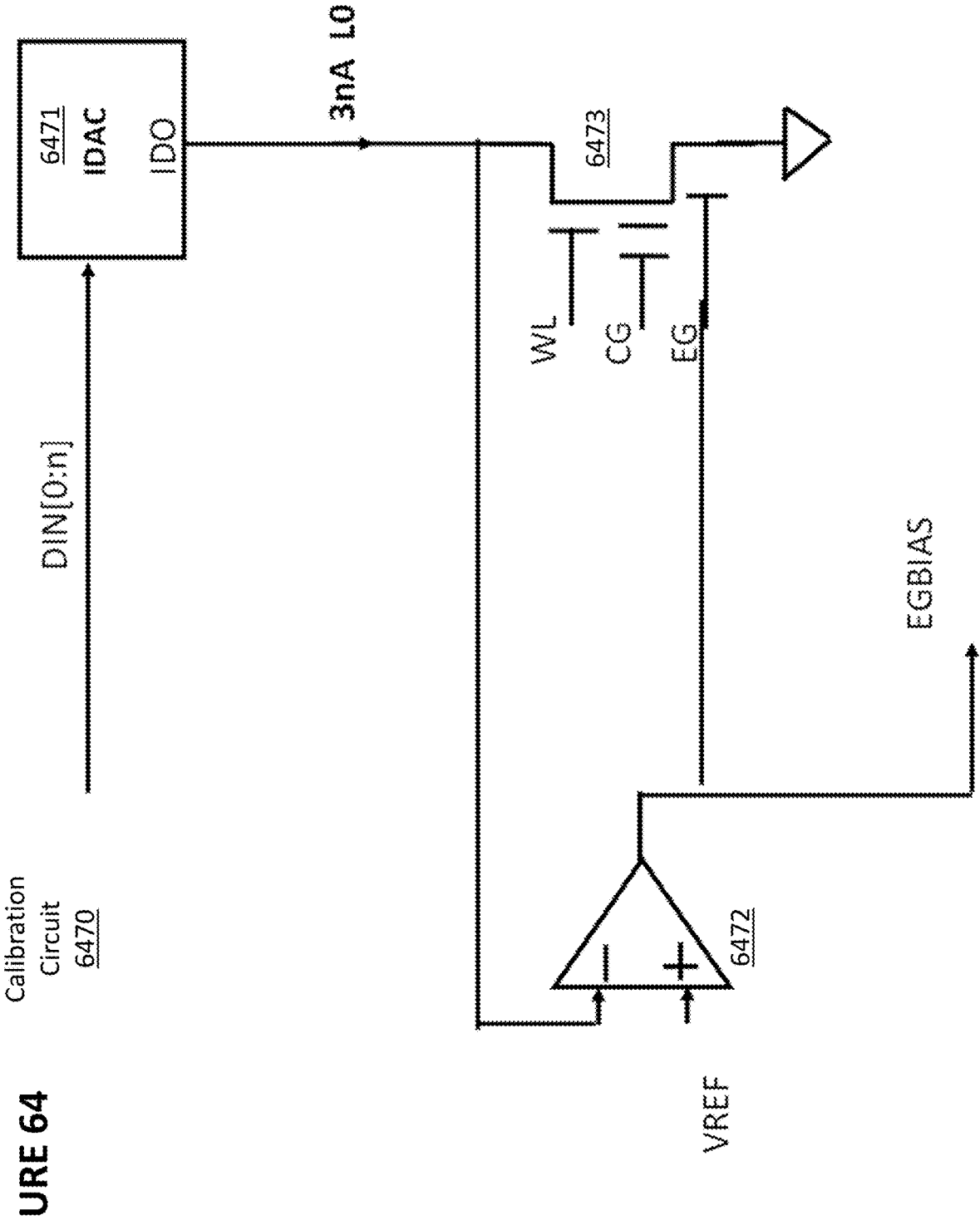
FIG. 64 depicts an example of a calibration circuit.

FIG. 64 depicts an example calibration circuit 6470, which comprises current DAC 6471, op-amp 6472, and memory cell 6473. The output of current DAC 6471 connects to the bit line (a first terminal) of memory cell 6473. Op-amp 6472 outputs a voltage on the EG terminal (a second terminal) of memory cell 6473 such that the current in memory cell 6473 is the same as that of the IDAC 6471. VREF is the voltage used to regulate the voltage on the bitline BL (a first terminal of memory cell 6473). Optionally, op-amp 6472 can be replaced with bias control EGCG_CTL circuit 6452 as in FIG. 63, where bias control circuit 6452 outputs a voltage onto terminals CG and EG such that the current in memory cell 6473 is the same as that of the IDAC 6471. The source line (a third terminal) of memory cell 6473 is coupled to ground.

Figure 65:
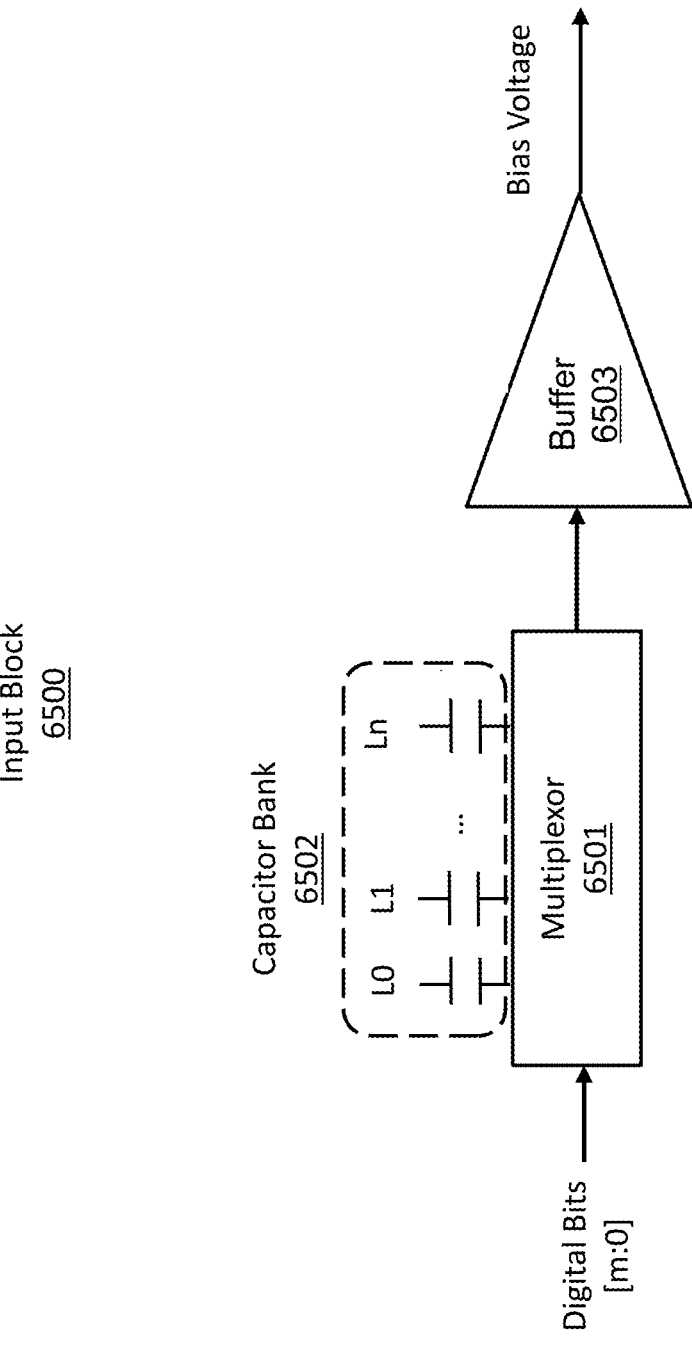
FIG. 65 depicts an example input block.

FIG. 65 depicts input block 6500, which comprises multiplexor 6501, capacitor bank 6502, and buffer 6503. Multiplexor 6501 receives m+1 digital bits [m:0] as a selection signal and also receives voltages from n+1 capacitors (L0, . . . Ln) and provides the selected voltage, responsive to the received digital bits, to buffer 6503, which outputs the selected voltage as a bias voltage. This is another scheme to generate the DAC output (instead of the scheme illustrated in FIGS. 43-47). In one example, an 8-bit DAC (m=7) thus comprise 256 capacitors (n=255) to hold 256 voltage levels. These voltage levels are for example generated by the row bias calibration circuits in FIGS. 59-64 according to a linear function or a logarithmic function based on the digital bit inputs.

Figure 66:
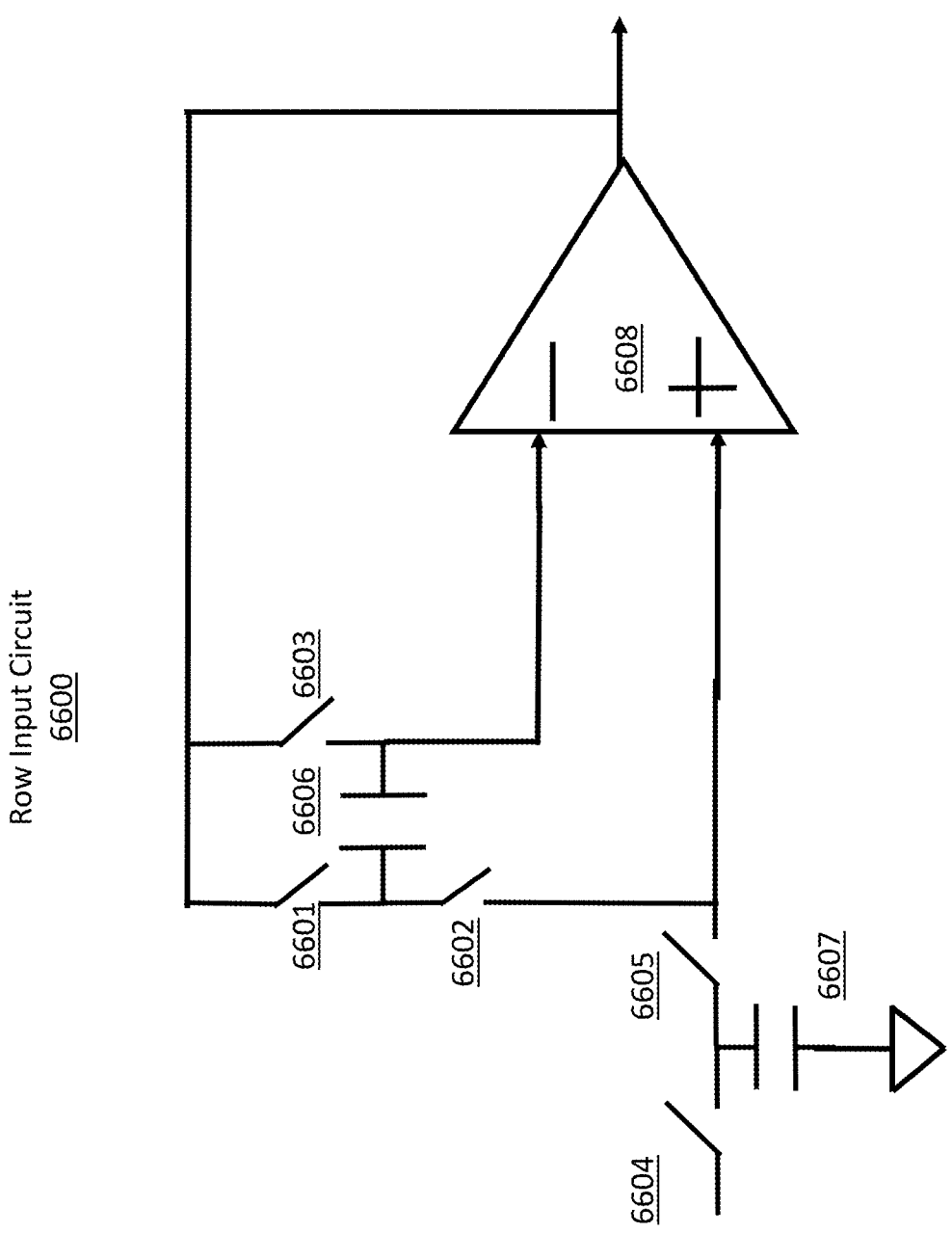
FIG. 66 depicts an example row input circuit.

FIG. 66 depicts an example row input circuit 6600. Row input circuit 6600 comprises switches 6601, 6602, 6603, 6604, and 6605; capacitors 6606 and 6607; and comparator 6608. Row input circuit 6600 provides a buffer function and an offset calibration function. The offset capacitor 6606 samples the offset voltage of the op-amp 6608 when the switches 6603 (a second switch) and 6602 (a third switch) are closed and switches 6601 (a first switch), 6605 is opened. Then the capacitor 6606 is reconnected in reverse fashion with switch 6601 (first switch) closed and switches 6603 (second switch) and 6602 (third switch) opened, hence the offset voltage on the capacitor 6606 cancels the offset of the op-amp 56098

Figure 67:
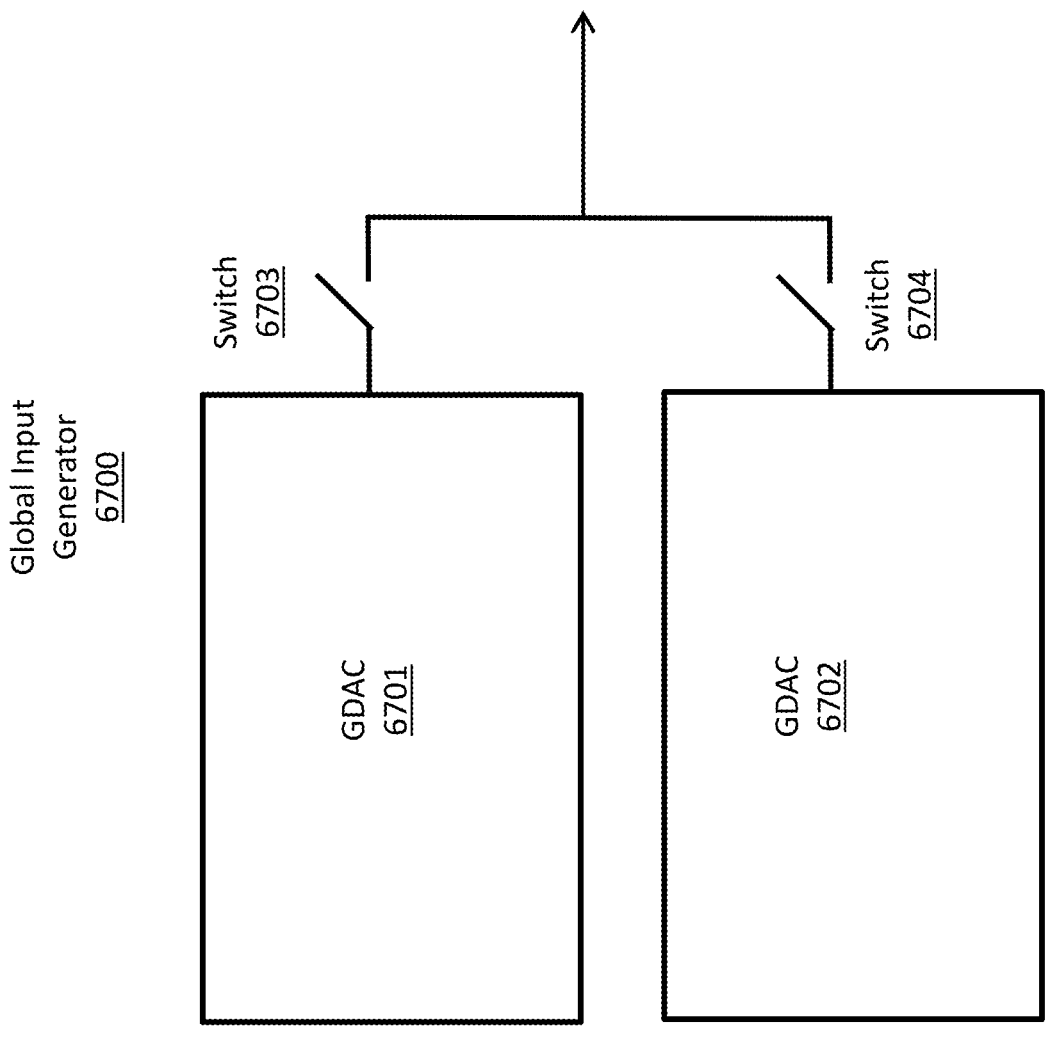
FIG. 67 depicts an example global input generator.

FIG. 67 depicts an example global input generator 6700, which comprises global digital-to-analog converter 6701, global digital-to-analog converter 6702, and switches 6703 and 6704. Global input generator 6700 enables real-time calibration without delaying normal operation. For example, global digital-to-analog converter 6701 can be used to calibrate an array and global digital-to-analog converter 6702 can be used for read neural operations, and vice versa.

Calibration also can be performed during the manufacturing process using calibration systems such as those shown below in FIGS. 68-70.

Figure 68:
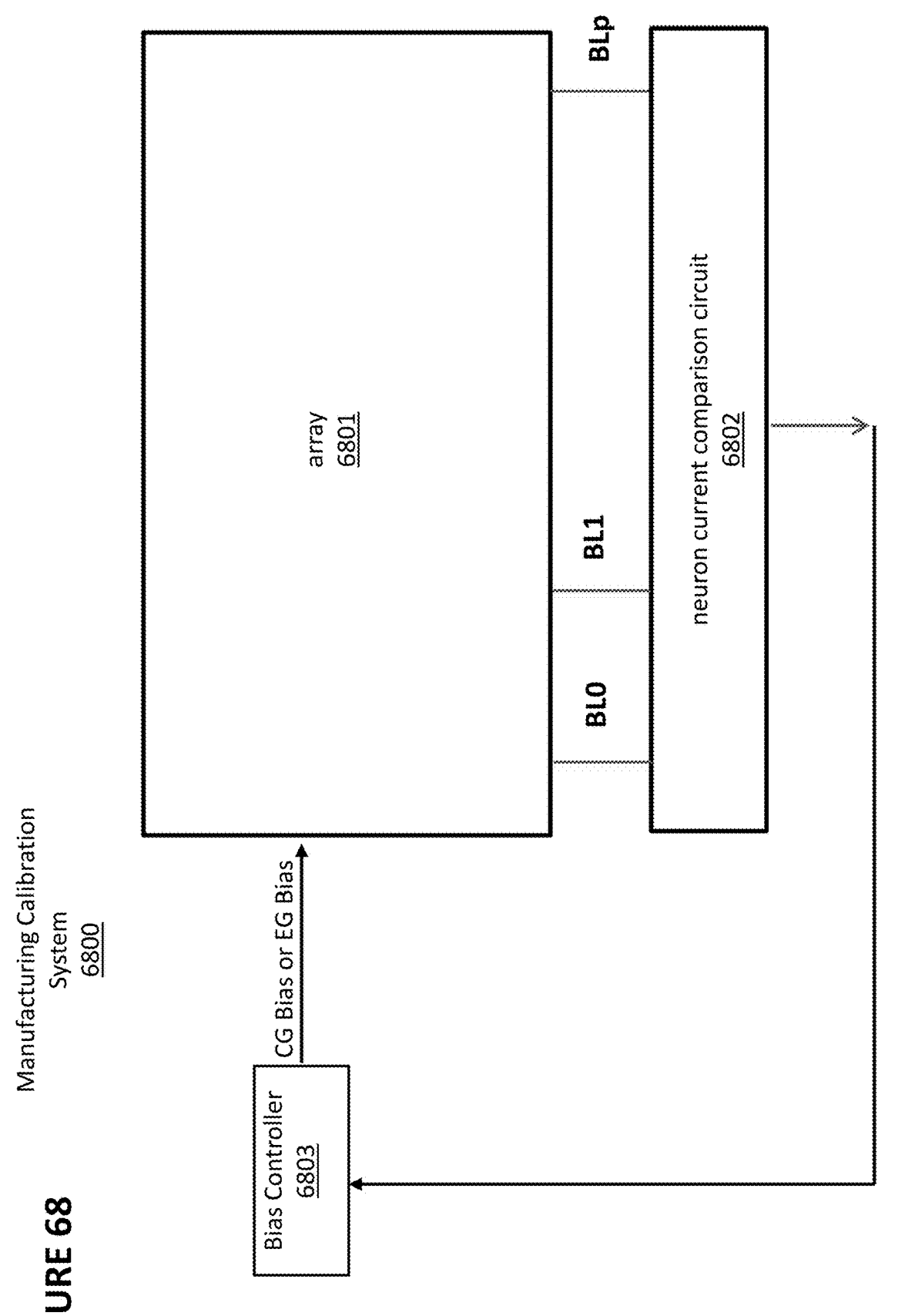
FIG. 68 depicts an example array and sampled neuron circuit.

FIG. 68 depicts manufacturing calibration system 6800, which comprises array 6801, neuron current comparison circuit 6802, and bias controller 6803. Array 6801 is part of a VMM system being calibrated and that ultimately will be sent into the field for use. Neuron current comparison circuit 6802 and bias controller 6803 can be within the same VMM system for use during the manufacturing process, or they can be part of external testing equipment used solely during manufacturing. Array 6801 is programmed to store a predetermined set of weights. A neuron output current is then generated, sampled, and compared by neuron current comparison circuit 6802 to a target neuron current for that predetermined set of weights. Based on the comparison, bias controller 6803 modifies a bias voltage applied to CG or EG terminals of the selected cells until the neuron current comparison circuit 6802 indicates that the neuron output is equal to, or within an acceptable threshold of, the target neuron current. This can be performed for an entire neural network (which may include multiple layers), a single layer, or a portion of a single layer, without limitation. Thus, neuron current comparison circuit 6802 is a sampled neuron circuit to receive current from the plurality of bitlines and to generate an analog output from a sampling of the current from the plurality of bitlines.

Figure 69:
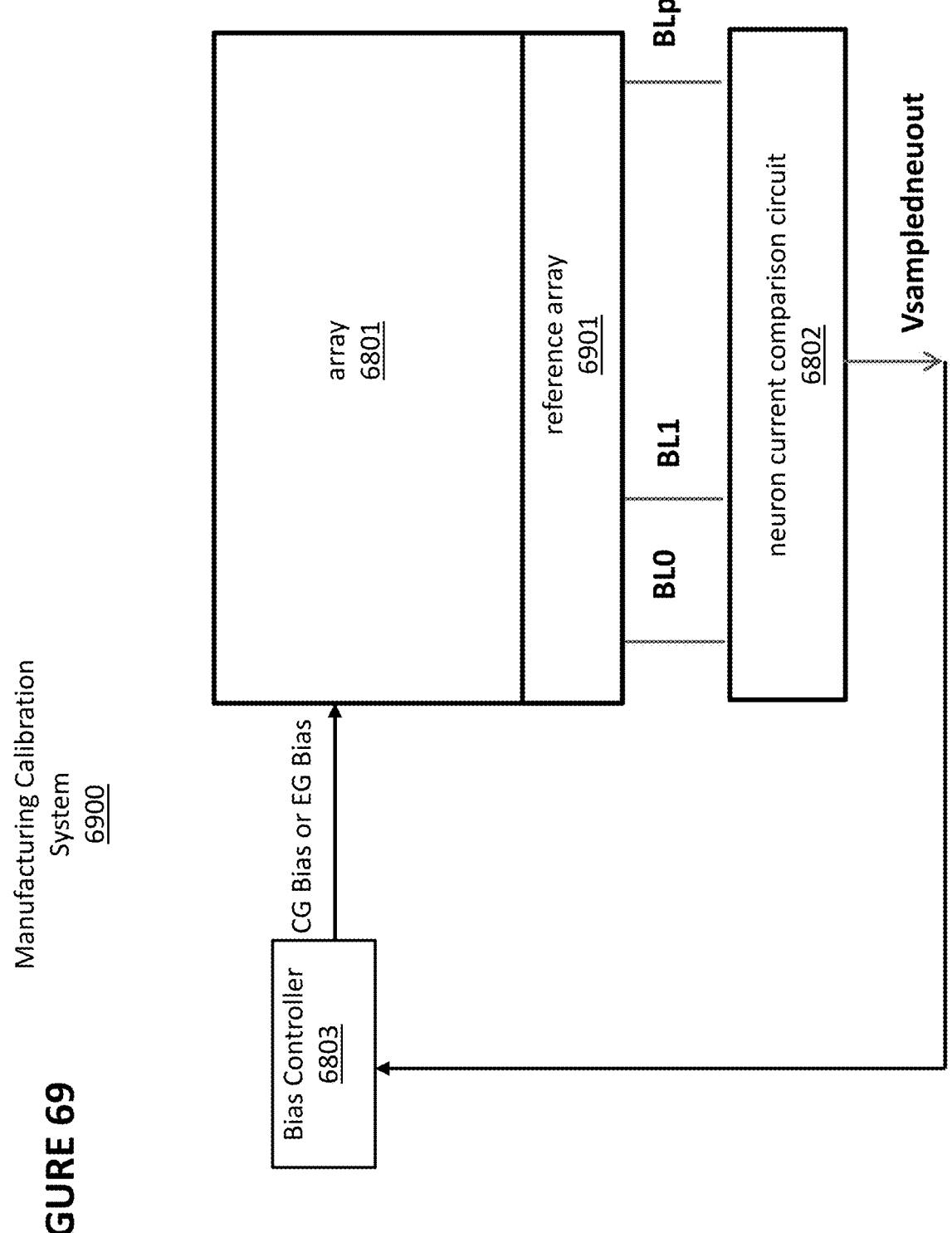
FIG. 69 depicts an example array, a reference array, and a sampled neuron circuit.

FIG. 69 depicts manufacturing calibration system 6900, which comprises array 6801 (a first array), reference array 6901 (a second array), neuron current comparison circuit 6802, and bias controller 6803. Each bitline is coupled to a column in array 6801 and a column in reference array 6901. Manufacturing calibration system 6900 is similar to manufacturing calibration system 6800 except that the operations are performed on embedded reference array 6901 instead of on array 6801. Array 6801 is used for normal vector-by-matrix multiplication operations.

Figure 70:
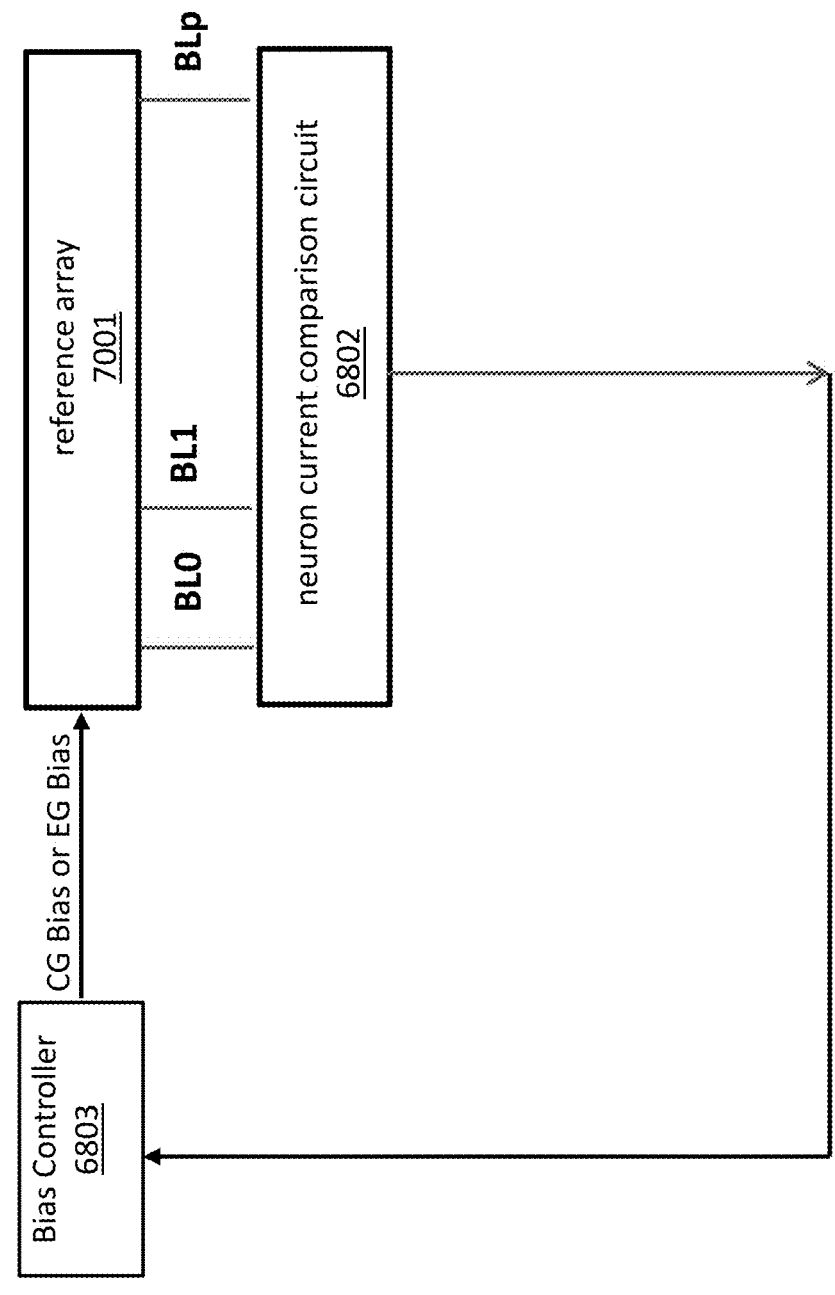
FIG. 70 depicts an example reference array and a sampled neuron circuit.

FIG. 70 depicts manufacturing calibration system 7000, which comprises reference array 7001, neuron current comparison circuit 6802, and bias controller 6803. Manufacturing calibration system 7000 is similar to manufacturing calibration system 6900 except that reference array 7001 is separate and not embedded in the same device as the main VMM array.

The sampling of the neuron currents in FIGS. 68-70 may represent an averaged value of the weight distribution of a neural layer or network.

Optionally, whenever a circuit utilizes a reference current, Iref, the reference current can be generated using reference arrays 6901 or 7001 in FIGS. 69 and 70. This is helpful because any changes to reference arrays 6901 or 7001 (such as due to changes in temperature, or due to corrections made through calibration) will propagate to the creation of the reference current as well.

Figures 71, 72:
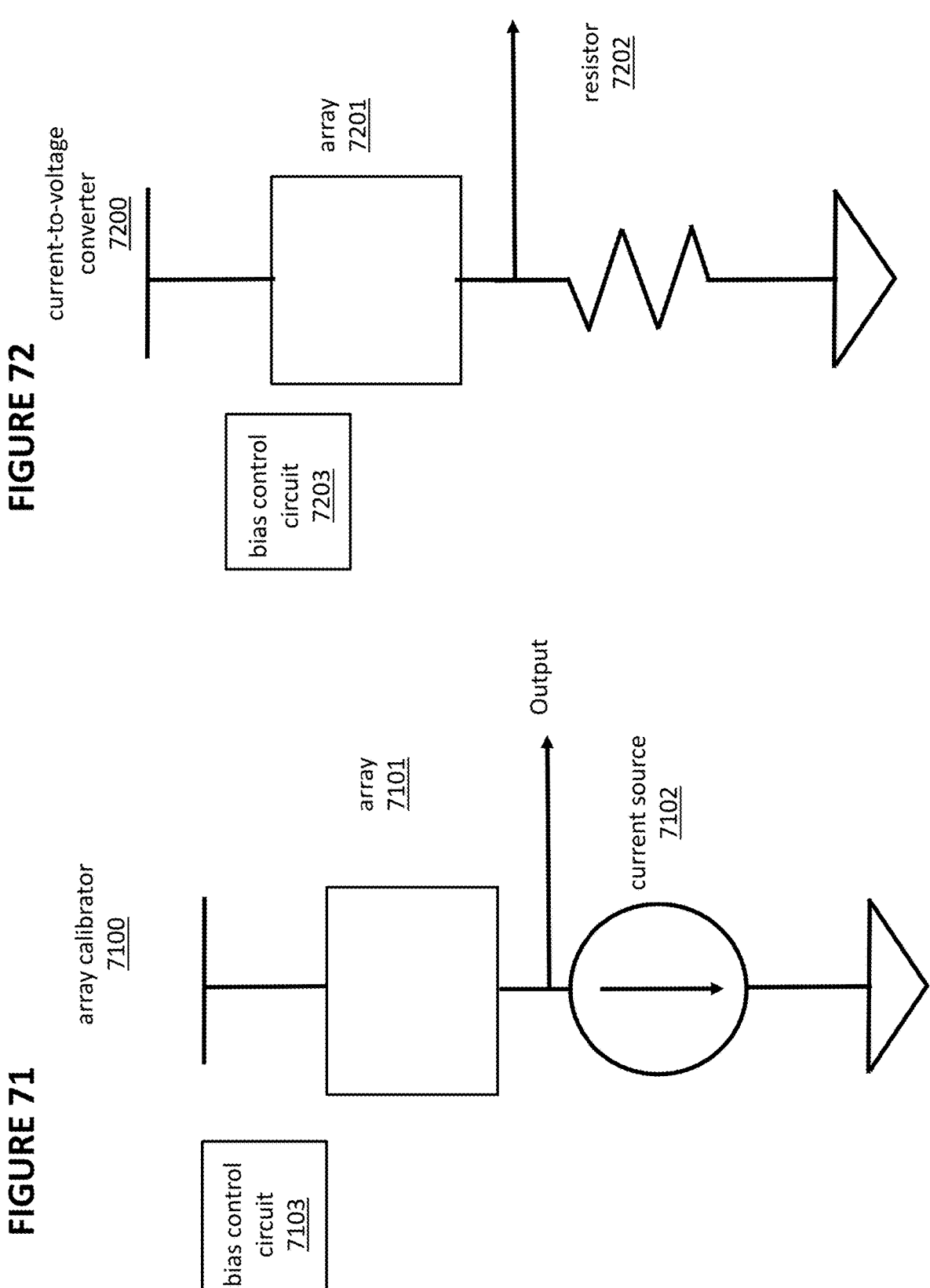
FIG. 71 depicts an example array calibrator.
FIG. 72 depicts an example current-to-voltage converter.

FIG. 71 depicts array calibrator 7100, which comprises array 7101, current source 7102, and bias control circuit 7103. Current source 7102 provides a target current. Array 7101 provides a sampled neuron current output. Array 7101 can be calibrated by varying the control gate bias or erase gate bias signal (which are calibration parameters) applied to parts or all of the array by bias control circuit 7103 during a read operation. When the current provided by array 7101 equals current source 7102, the Output will switch polarity, which will indicate that the control gate bias or erase gate bias that had been applied are appropriate. Optionally, the calibration parameters can be stored in a lookup table along with operating temperature and values stored in the array.

FIG. 72 depicts an example current-to-voltage converter 7200, which comprises array 7201, resistor 7202, and bias control circuit 7203. Resistor 7202 provides an output voltage. Array 7201 provides a sampled neuron current output. The sampled neuron current output from the array 7201 can be varied by varying a control gate bias or erase gate bias signal applied to the array by bias control circuit 7203 during a read operation. When the output voltage equals a desired target voltage, the desired configuration has been achieved for the control gate bias or erase gate bias. This is for example used in conjunction with FIGS. 68-70.

Figures 73, 74:
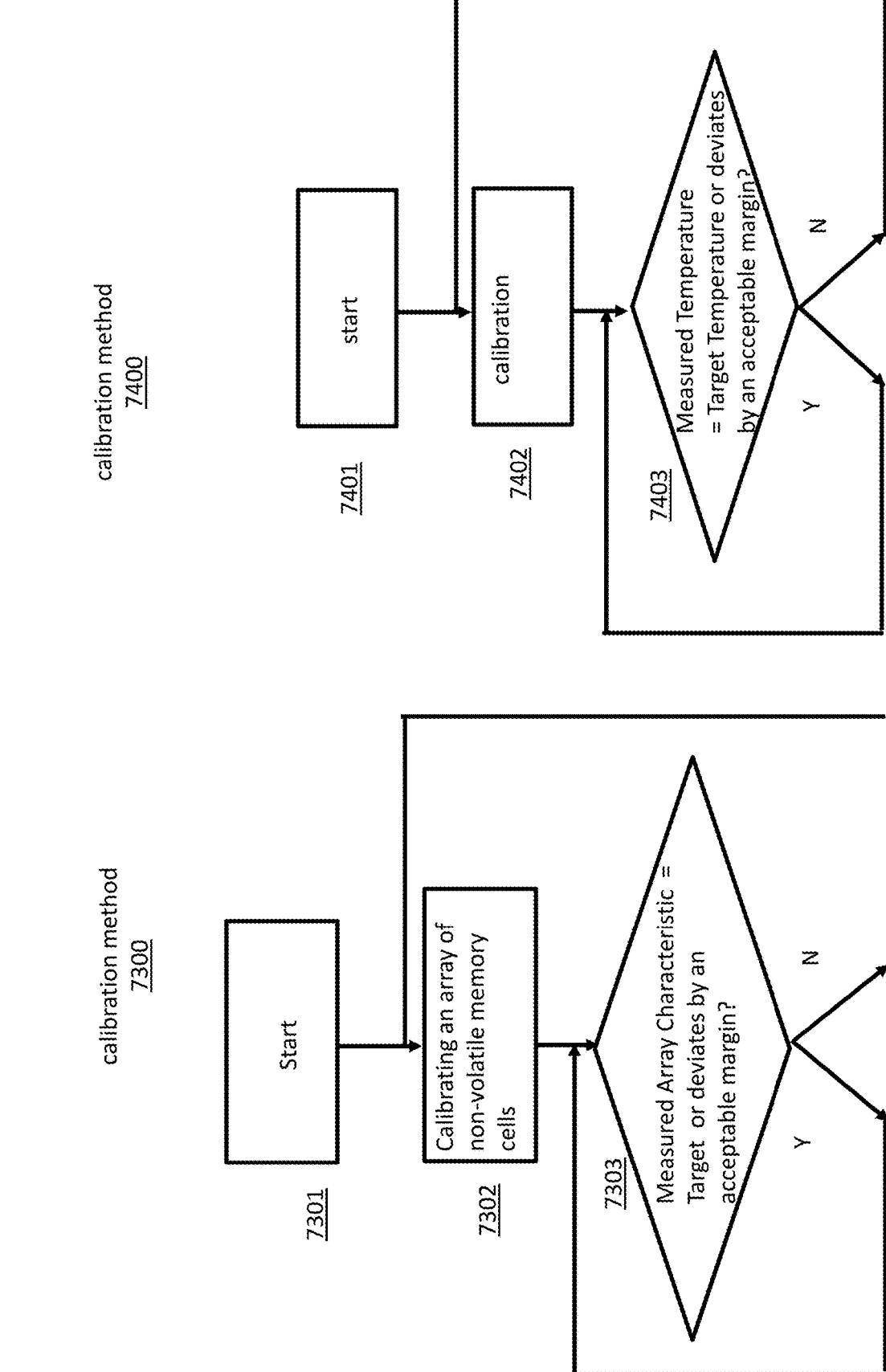
FIG. 73 depicts an example calibration method.
FIG. 74 depicts an example calibration method.

FIG. 73 depicts an example calibration method 7300. The method starts (operation 7301). The next operation is calibrating an array of non-volatile memory cells (operation 7302). A characteristic of the array (here, the voltage of a control gate terminal or an erase gate terminal), is measured and compared against a target, such as a target voltage (or current) (operation 7303). If the measured voltage equals the target voltage or deviates by an acceptable margin (which is a predetermined range), operation 7303 is repeated periodically to determine if calibration is needed, which may occur, for example, when operating temperature changes. If the measured voltage does not equal the target voltage or deviate by an acceptable margin (which is a predetermined range) not, then calibration operation 7302 is repeated.

FIG. 74 depicts an example calibration method 7400. The method starts (operation 7401). The next operation is calibrating an array of non-volatile memory cells (operation 7402). A temperature sensor measures a characteristic (here, temperature) and compares it against a target temperature (operation 7403). If the measured temperature equals the target temperature or deviates by an acceptable margin (which is a predetermined range), operation 7403 is repeated periodically to determine if calibration is needed, which may occur when operating temperature changes. If the measured temperature does not equal the target temperature or deviates by an acceptable margin (which is a predetermined range), then calibration operation 7402 is repeated.

Figures 75, 76:
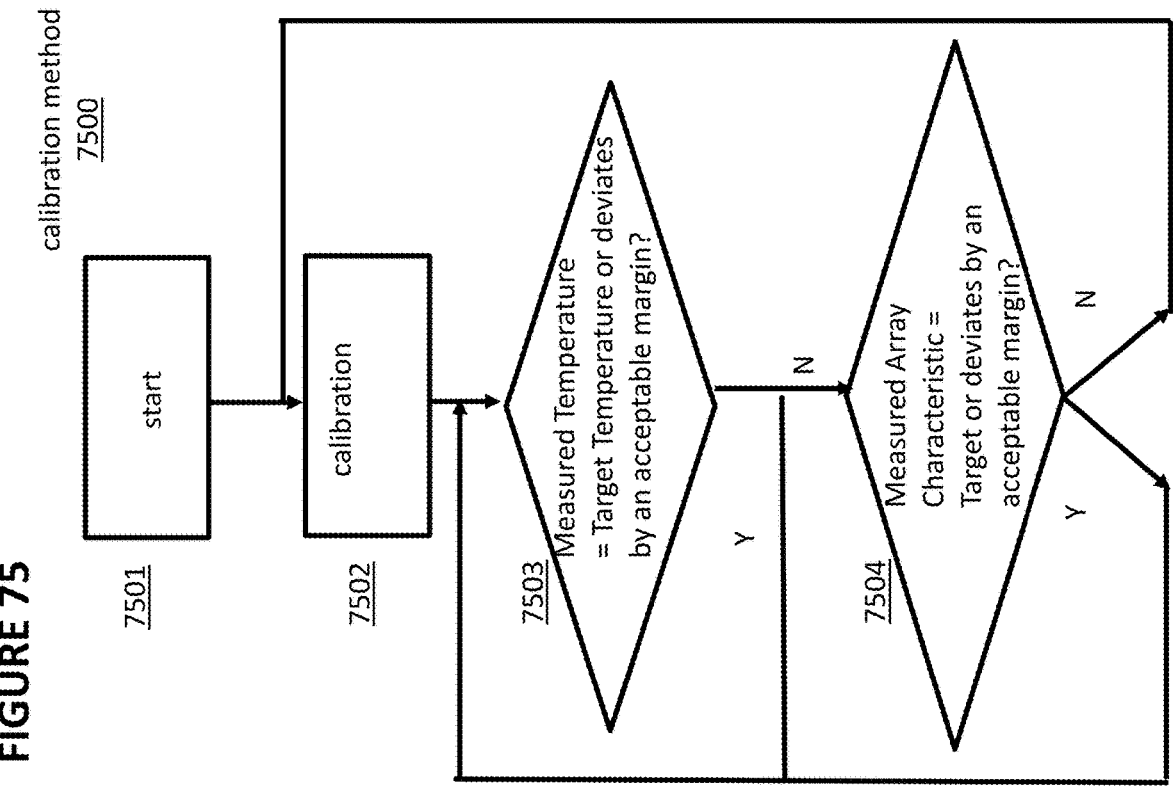
FIG. 75 depicts an example calibration method.
FIG. 76 depicts an example calibration method.

FIG. 75 depicts an example calibration method 7500. The method starts (operation 7501). The next operation is calibrating an array of non-volatile memory cells (operation 7502). A temperature sensor measures a characteristic (here, temperature) and compares it against a target temperature (operation 7503). If the measured temperature equals the target temperature or differs by an acceptable margin (which is a predetermined range), operation 7503 is repeated periodically. If the measured temperature does not equal the target temperature or deviates by an acceptable margin (which is a predetermined range), the method proceeds to operation 7504, where the array characteristic (voltage or current, here voltage of a control gate terminal or an erase gate terminal) are compared against a target voltage. If the measured array characteristic (e.g., voltage) equals the target or differs by an acceptable margin (which is a predetermined range), then the method returns to operation 7303. If the measured characteristic does not equal the target characteristic or deviate by an acceptable margin (which is a predetermined range), then the method returns to operation 7502 to repeat calibration. The benefit of calibration method 7500 is that it will repeat the calibration procedure only when the measured array characteristic actually is different than the target. It is possible, for example, that the measured temperature might differ from the target temperature but that the measured array characteristic is still within an acceptable margin (which is a predetermined range) compared to the target, in which case calibration will not be repeated.

FIG. 76 depicts an example calibration method 7600. The method starts (operation 7601). The next operation is calibrating an array of non-volatile memory cells (operation 7602). A time sensor measures the time of an event and compares it against a target time, where the times might relate to thermal conductivity rate such as the time it takes for an increase in 1 degree to be sensed at X distance away (thermal conductivity rate) (operation 7603). If they are equal or differ by an acceptable margin (which is a predetermined range), operation 7603 is repeated periodically to determine if calibration is needed. If they are not equal or differ by an unacceptable margin (which is a predetermined range), the method 7400 triggers the calibration operation 7402.

Figure 77:
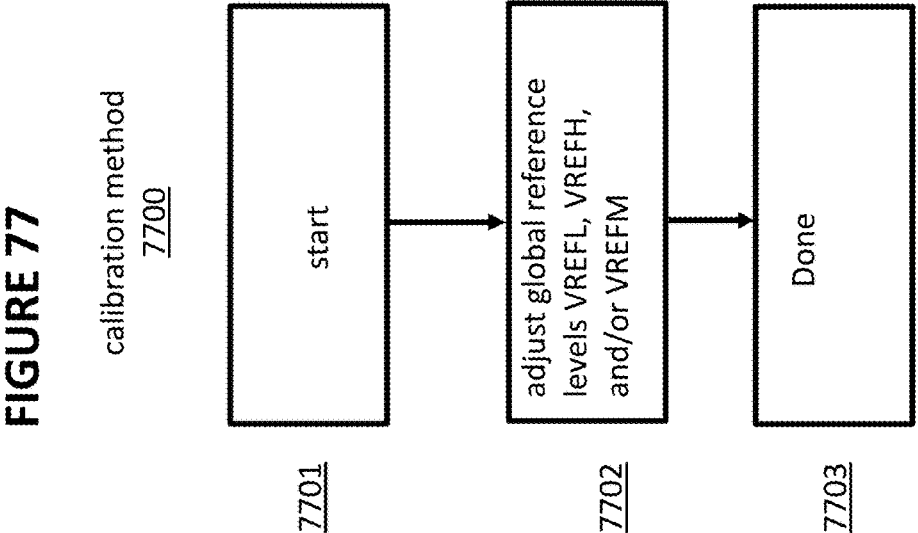
FIG. 77 depicts an example calibration method.

FIG. 77 depicts example calibration method 7700 of global digital-to-analog converter and row decoder 5350 or 5480 in FIGS. 53-54. The method starts (operation 7801). Calibration is performed by adjusting the global reference levels VREFL, VREFH, and/or VREFM in FIG. 53 or 54 (operation 7802), which will adjust the output DAC_OUT, which in turn will be used to generate bias voltages for a plurality of rows in input blocks 4300, 4400, 4500, 4600, and 4700 in FIGS. 43-47. The method ends (operation 7803).

Figure 78:
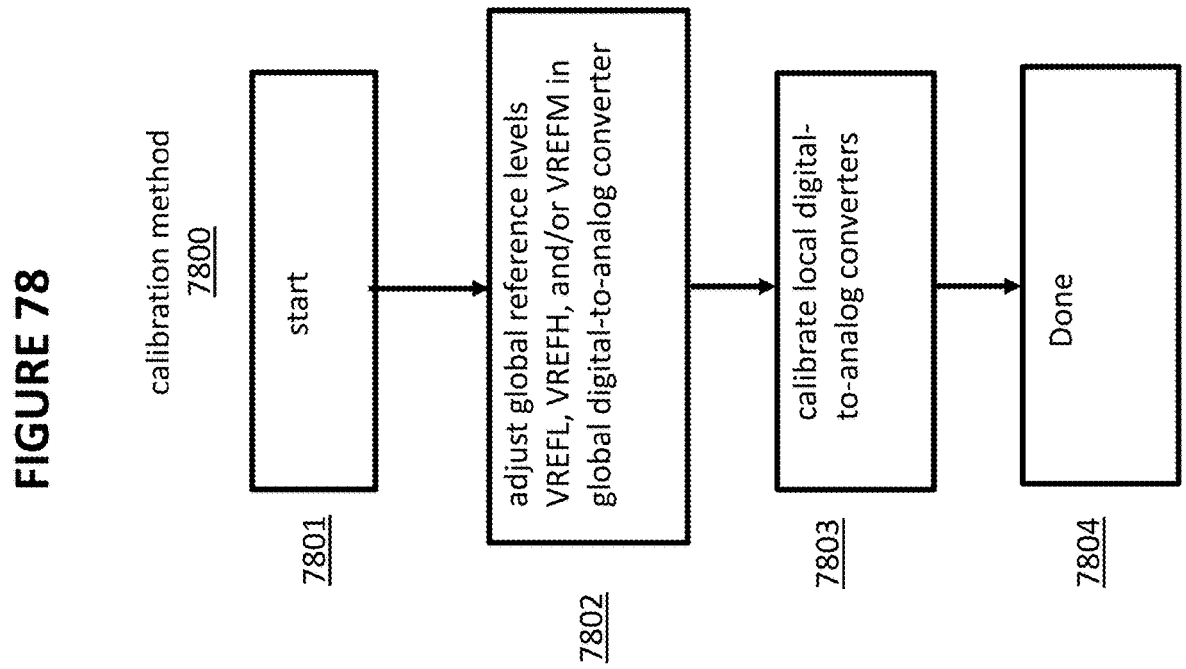
FIG. 78 depicts an example calibration method.

FIG. 78 depicts example calibration method 7800 as used for global DACs 4707 and local DACs 4704 in FIG. 47. The method starts (operation 7801). Calibration is performed on global DAC and row decoder 5350 or 5480 (in FIGS. 53-54), which is used for GDACs 4707 in FIG. 47, by adjusting the global reference level VREFL, VREFH, and/or VREFM in FIG. 53-54 (operation 7802), which will adjust the output DAC_OUT. Local digital-to-analog converters 4704 in FIG. 47 are then calibrated in FIG. 47 (operation 7803). The method ends (operation 7804).

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A method comprising:
   adjusting a bias voltage applied to one or more non-volatile memory cells in an artificial neural network;
   performing a performance target check on the one or more non-volatile memory cells in the artificial neural network; and
   repeating the adjusting and performing until the performance target check indicates an electrical parameter is within a predetermined range, wherein the electrical parameter is a neuron current or an averaged neuron current.

2. The method of claim 1, wherein the electrical parameter is a neuron current.

3. The method of claim 1, wherein the electrical parameter is an averaged neuron current.

4. A system comprising:
   a bias control circuit;
   an array providing a sampled neuron current; and
   a current source coupled to the array;
   wherein a control gate bias or erase gate bias applied to the array is adjusted by the bias control circuit until the sampled neuron current is equal to current of the current source.

5. A system comprising:
   a bias control circuit;
   an array providing a sampled neuron current; and
   a resistor comprising a first terminal coupled to the array at a node and a second terminal coupled to ground;
   wherein a control gate bias or erase gate bias applied to the array is adjusted by the bias control circuit until a voltage at the node equals a reference voltage.

* * * * *